(12) United States Patent
Khlat et al.

(10) Patent No.: US 9,899,986 B2
(45) Date of Patent: Feb. 20, 2018

(54) RF DIPLEXER

(71) Applicant: RF Micro Devices, Inc., Greensboro, NC (US)

(72) Inventors: Nadim Khlat, Cugnaux (FR); Marcus Granger-Jones, Scotts Valley, CA (US)

(73) Assignee: Qoro US, Inc., Greensboro, NC (US)

( * ) Notice: Subject to any disclaimer, the term of this patent is extended or adjusted under 35 U.S.C. 154(b) by 142 days.

(21) Appl. No.: 14/547,502

(22) Filed: Nov. 19, 2014

(65) Prior Publication Data

US 2015/0117281 A1    Apr. 30, 2015

Related U.S. Application Data

(63) Continuation-in-part of application No. 14/523,065, filed on Oct. 24, 2014.
(Continued)

(51) Int. Cl.
*H03H 7/46* (2006.01)
*H03H 7/48* (2006.01)
(Continued)

(52) U.S. Cl.
CPC .............. *H03H 7/463* (2013.01); *H03H 7/48* (2013.01); *H04B 1/0057* (2013.01); *H04B 1/40* (2013.01);
(Continued)

(58) Field of Classification Search
CPC .......... H04B 1/0057; H04B 1/40; H04B 1/50; H04B 10/556; H04L 5/08; H04L 27/2085; H03H 7/463; H03H 7/48
See application file for complete search history.

(56) References Cited

U.S. PATENT DOCUMENTS 3,656,162 A    4/1972 Mee
3,946,328 A    3/1976 Boctor
(Continued)

OTHER PUBLICATIONS

Non-Final Office Action for U.S. Appl. No. 14/498,991, dated Aug. 17, 2015, 13 pages.
(Continued)

*Primary Examiner* — Parth Patel
*Assistant Examiner* — Kai Chang
(74) *Attorney, Agent, or Firm* — Withrow & Terranova, P.L.L.C.

(57) ABSTRACT

Embodiments of a tunable radio frequency (RF) diplexer and methods of operating the same are disclosed. In one embodiment, the RF diplexer includes a first hybrid coupler, a second hybrid coupler, an RF filter circuit, and a phase inversion component. Both the RF filter circuit and the phase inversion component are connected between the first hybrid coupler and the second hybrid coupler. The phase inversion component is configured to provide approximately a differential phase. The RF filter circuit is configured to provide a passband and a notch. The RF filter circuit is tunable to provide the notch on both a high-frequency side of the passband and a low frequency side of the passband. Accordingly, the tunable RF diplexer provides lower insertion losses and higher isolation regardless of whether the one of the diplexed frequency bands is set at higher frequencies or lower frequencies than the other diplexed frequency band.

18 Claims, 24 Drawing Sheets

Related U.S. Application Data

(60) Provisional application No. 61/906,622, filed on Nov. 20, 2013, provisional application No. 61/895,386, filed on Oct. 24, 2013.

(51) Int. Cl.

| | | |
|---|---|---|
| *H04B 1/00* | (2006.01) | |
| *H04B 1/40* | (2015.01) | |
| *H04B 1/50* | (2006.01) | |
| *H04B 10/556* | (2013.01) | |
| *H04L 5/08* | (2006.01) | |
| *H04L 27/20* | (2006.01) | |

(52) U.S. Cl.
CPC .............. *H04B 1/50* (2013.01); *H04B 10/556* (2013.01); *H04L 5/08* (2013.01); *H04L 27/2085* (2013.01)

(56) References Cited

U.S. PATENT DOCUMENTS

| | | | | |
|---|---|---|---|---|
| 5,644,274 | A * | 7/1997 | Kaida | H03H 9/02157 |
| | | | | 310/320 |
| 5,774,193 | A | 6/1998 | Vaughan | |
| 6,333,591 | B1 | 12/2001 | Yoshio et al. | |
| 6,586,786 | B2 | 7/2003 | Kitazawa et al. | |
| 7,078,987 | B1 | 7/2006 | Petrovic | |
| 7,330,500 | B2 | 2/2008 | Kouki | |
| 8,149,742 | B1 * | 4/2012 | Sorsby | H04B 1/0057 |
| | | | | 370/219 |
| 8,314,653 | B1 * | 11/2012 | Granger-Jones | H03F 1/223 |
| | | | | 327/552 |
| 8,385,871 | B2 | 2/2013 | Wyville | |
| 8,634,029 | B2 * | 1/2014 | Pugel | H03H 7/463 |
| | | | | 348/553 |
| 8,933,764 | B2 | 1/2015 | Khlat et al. | |
| 2002/0053954 | A1 | 5/2002 | Shamsaifar et al. | |
| 2002/0130734 | A1 | 9/2002 | Liang et al. | |
| 2002/0137471 | A1 | 9/2002 | Satoh et al. | |
| 2005/0239421 | A1 | 10/2005 | Kim et al. | |
| 2006/0035615 | A1 | 2/2006 | Hoover | |
| 2006/0087385 | A1 | 4/2006 | Fitzpatrick et al. | |
| 2008/0240000 | A1 | 10/2008 | Kidd | |
| 2009/0219908 | A1 | 9/2009 | Rofougaran | |
| 2009/0289744 | A1 * | 11/2009 | Miyashiro | H03H 7/0115 |
| | | | | 333/175 |
| 2010/0102899 | A1 * | 4/2010 | Engel | H01P 1/211 |
| | | | | 333/117 |
| 2010/0295630 | A1 | 11/2010 | Itoh et al. | |
| 2011/0032854 | A1 | 2/2011 | Carney et al. | |
| 2011/0069644 | A1 * | 3/2011 | Kim | H04B 1/0057 |
| | | | | 370/278 |
| 2011/0140803 | A1 * | 6/2011 | Kim | H01P 1/20 |
| | | | | 333/110 |
| 2012/0161904 | A1 * | 6/2012 | Do | H01P 1/183 |
| | | | | 333/202 |
| 2013/0077540 | A1 | 3/2013 | Black et al. | |
| 2013/0083703 | A1 * | 4/2013 | Granger-Jones | H04B 1/525 |
| | | | | 370/277 |
| 2013/0090080 | A1 | 4/2013 | Schmidt | |
| 2013/0135052 | A1 | 5/2013 | Arkiszewski | |
| 2013/0176913 | A1 | 7/2013 | Niskanen et al. | |
| 2013/0176914 | A1 * | 7/2013 | Khlat | H04B 1/44 |
| | | | | 370/278 |
| 2013/0187825 | A1 | 7/2013 | Linares et al. | |
| 2013/0201880 | A1 | 8/2013 | Bauder et al. | |
| 2013/0201881 | A1 * | 8/2013 | Bauder | H03H 7/48 |
| | | | | 370/277 |
| 2013/0201882 | A1 * | 8/2013 | Bauder | H03H 7/48 |
| | | | | 370/277 |
| 2013/0244591 | A1 | 9/2013 | Weissman et al. | |
| 2014/0185498 | A1 * | 7/2014 | Schwent | H04B 1/0057 |
| | | | | 370/297 |
| 2014/0269853 | A1 | 9/2014 | Gudem et al. | |
| 2014/0321353 | A1 | 10/2014 | Zhan | |
| 2014/0323076 | A1 * | 10/2014 | Kintis | H04B 1/1036 |
| | | | | 455/307 |
| 2015/0016313 | A1 * | 1/2015 | Khlat | H04B 1/525 |
| | | | | 370/280 |
| 2015/0017993 | A1 | 1/2015 | Ishii | |
| 2015/0087246 | A1 * | 3/2015 | Khlat | H04L 5/14 |
| | | | | 455/77 |
| 2016/0126987 | A1 | 5/2016 | Wloczysiak | |
| 2016/0127029 | A1 | 5/2016 | Wloczysiak | |
| 2017/0310381 | A1 | 10/2017 | Lim et al. | |

OTHER PUBLICATIONS

Vizmuller, Peter, "Chapter 2: Circuit Examples," RF Design Guide: Systems, Circuits, and Equations, Norwood: Artech House, 1995, pp. 95-98.

Young, Leo, et al., "A High Power Diplexing Filter," IRE Transactions on Microwave Theory and Techniques, vol. 7, No. 3, Jul. 1959, pp. 384-387.

Notice of Allowance for U.S. Appl. No. 14/525,092, dated Apr. 11, 2016, 7 pages.

Non-Final Office Action for U.S. Appl. No. 14/498,991, dated May 2, 2016, 14 pages.

Final Office Action for U.S. Appl. No. 14/498,746, dated Aug. 5, 2016, 12 pages.

Non-Final Office Action for U.S. Appl. No. 14/523,065, dated Aug. 2, 2016, 38 pages.

Non-Final Office Action for U.S. Appl. No. 14/498,746, dated Feb. 24, 2016, 11 pages.

Final Office Action for U.S. Appl. No. 14/498,991, dated Feb. 3, 2016, 14 pages.

Non-Final Office Action for U.S. Appl. No. 14/497,919, dated Mar. 10, 2016, 21 pages.

Notice of Allowance for U.S. Appl. No. 14/498,746, dated Nov. 15, 2016, 8 pages.

Final Office Action for U.S. Appl. No. 14/498,991, dated Sep. 30, 2016, 15 pages.

Final Office Action for U.S. Appl. No. 14/497,919, dated Sep. 22, 2016, 26 pages.

Advisory Action for U.S. Appl. No. 14/498,991, dated Jan. 3, 2017, 3 pages.

Advisory Action for U.S. Appl. No. 14/497,919, dated Feb. 21, 2017, 3 pages.

Final Office Action for U.S. Appl. No. 14/523,065, dated Mar. 9, 2017, 34 pages.

Non-Final Office Action for U.S. Appl. No. 14/498,991, dated Mar. 9, 2017, 14 pages.

Non-Final Office Action for U.S. Appl. No. 14/497,919, dated May 12, 2017, 26 pages.

Non-Final Office Action for U.S. Appl. No. 141523,065, dated Jul. 24, 2017, 20 pages.

Notice of Allowance for U.S. Appl. No. 14/498,991, dated Aug. 23, 2017, 9 pages.

Notice of Allowance and Examiner-Initiated Interview Summary for U.S. Appl. No. 14/497,919, dated November 6, 2017, 19 pages.

\* cited by examiner

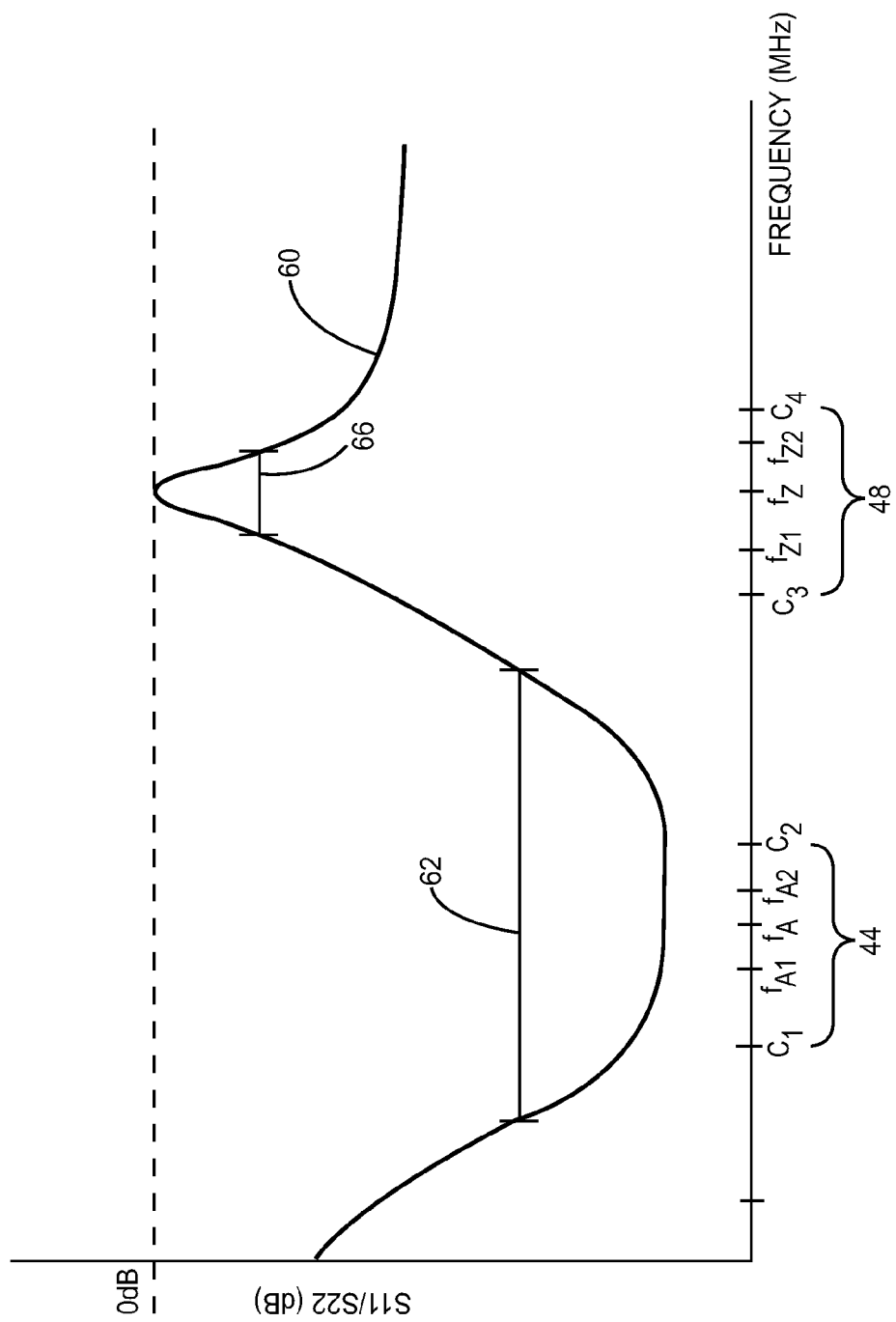

RF DIPLEXER

RELATED APPLICATIONS

This application claims the benefit of provisional patent application Ser. No. 61/906,622, filed Nov. 20, 2013, the disclosure of which is hereby incorporated herein by reference in its entirety.

This application is a continuation-in-part of U.S. patent application Ser. No. 14/523,065, filed Oct. 24, 2014; which claims the benefit of provisional patent application 61/895,386, filed Oct. 24, 2013; the disclosures of which are hereby incorporated herein by reference in their entirety.

FIELD OF THE DISCLOSURE

This disclosure relates generally to radio frequency (RF) diplexers and diplexing methods for RF front-end modules.

BACKGROUND

A radio frequency (RF) diplexer is a device that facilitates communication of two different RF signals within two different RF communication bands by a common antenna. For example, with respect to RF receive diplexing, an RF diplexer is configured to receive two different RF receive signals on a common antenna and then route each of the respective RF receive signals to their appropriate ports. With respect to RF transmission diplexing, an RF diplexer is configured to transmit two different RF transmission signals from different ports and route both to the common antenna. In order to facilitate simultaneous diplexing over the antenna, the RF diplexer needs to be designed for operation at both RF communication bands while providing adequate isolation between the different RF communication bands and the different RF signals. Many previously known RF diplexer topologies struggle to provide this isolation, particularly at the high RF communication bands required by modern RF front-ends. Furthermore, while there are tunable RF diplexers that provide diplexing with respect to various combinations of different RF communication bands, these tunable RF diplexers struggle to provide adequate broadband isolation across large portions of the RF frequency spectrum.

Accordingly, RF diplexers are needed that not only provide high isolation but also maintain this high isolation along greater portions of the RF frequency spectrum.

SUMMARY

Embodiments of a tunable radio frequency (RF) diplexer and methods of diplexing transmission and receive signals are disclosed. In one embodiment, the RF diplexer includes a first hybrid coupler, a second hybrid coupler, an RF filter circuit, and a phase inversion component. Both the RF filter circuit and the phase inversion component are connected between the first hybrid coupler and the second hybrid coupler. In some embodiments, the phase inversion component is provided by the RF filter circuit, while in other embodiments, the phase inversion component is provided separately. In one embodiment, the RF filter circuit is configured to provide a passband and a notch. The RF filter circuit is tunable to provide the notch on both a high-frequency side of the passband and a low frequency side of the passband. The benefit of allowing the notch to be placed on both the high-frequency side and the low-frequency side of the passband is that the tunable RF diplexer provides lower insertion losses and higher isolation regardless of whether the one of the diplexed frequency bands is provided at higher frequencies or lower frequencies than the other diplexed frequency band.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2F is another representation of the frequency response shown in FIG. 2E.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Note that relational terminology such as "substantially," "approximately," and/or the like, should be interpreted objectively in accordance with the communication device and technological environment in which the radio frequency (RF) diplexer is employed and, in addition, the performance parameters relevant to the operation of the RF diplexer for at least one the particular application of the RF diplexer within the communication device [or at least one prospective communication device] and the technological environment [or at least one prospective technological environment].

This disclosure describes different embodiments of a tunable RF diplexer and methods of operating the same. Embodiments of the tunable RF diplexer can be used to provide receive diplexing and/or transmission diplexing. To provide diplexing, the tunable RF diplexer includes a first hybrid coupler, a second hybrid coupler, an RF filter circuit, and a phase inversion component. In some embodiments, the phase inversion component may be provided by the first hybrid coupler, the second hybrid coupler, or the RF filter circuit. In other embodiments, the phase inversion component is provided as a separate component. As explained in further detail below, the first hybrid coupler, the second hybrid coupler, or the RF filter circuit is provided to split and route RF signals to and from the appropriate ports in order to provide diplexing. The phase inversion component, however, is configured to provide a differential phase shift of approximately 180 degrees in one of the paths of the tunable RF diplexer. The benefit of introducing the differential phase shift is that it provides increased broadband isolation between the different frequency bands being diplexed by the tunable RF diplexer.

Figure 1:
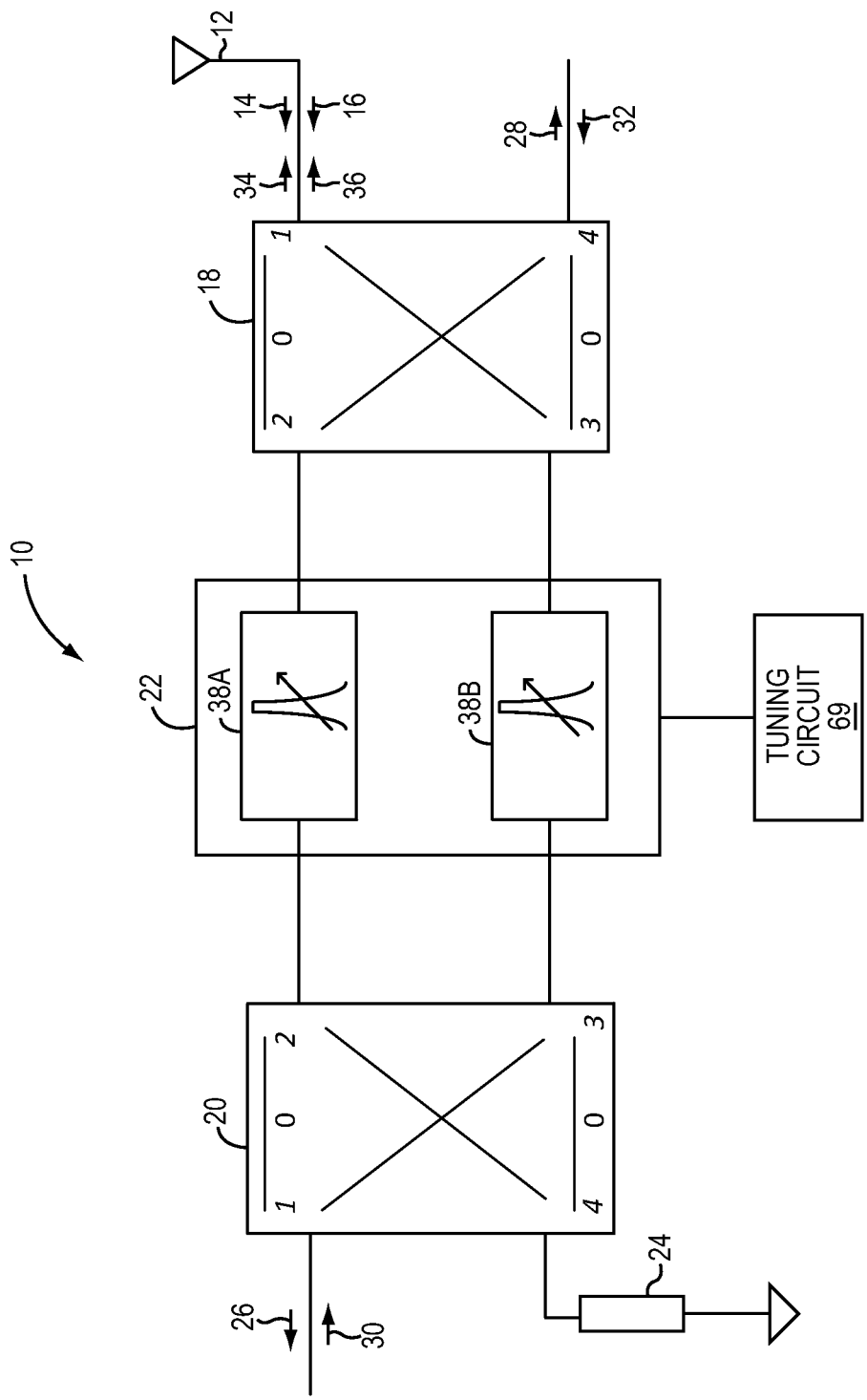
FIG. 1 illustrates one embodiment of a tunable radio frequency (RF) diplexer, wherein a phase inversion component is provided by an RF filter between a first hybrid coupler and a second hybrid coupler.

FIG. 1 illustrates an embodiment of a tunable radio frequency (RF) diplexer 10. An antenna 12 is operably associated with the tunable RF diplexer 10 and is capable of emitting or radiating RF signals in different RF frequency bands. In order to prevent out-of-band noise and spurious emissions from distorting RF signals in the different RF frequency band, the tunable RF diplexer 10 provides isolation between RF signals as well as out-of-band filtering. Accordingly, the tunable RF diplexer 10 allows for an RF receive input signal 14 and an RF receive input signal 16 to be received simultaneously by the antenna 12. The RF receive input signal 14 and the RF receive input signal 16 may be provided in different frequency bands.

The tunable RF diplexer 10 is operable to separate (i.e., split) the RF receive input signal 14 and the RF receive input signal 16 and route them appropriately. In this embodiment, the tunable RF diplexer 10 includes a first hybrid coupler 18, a second hybrid coupler 20, an RF filter circuit 22, and an impedance termination 24. The first hybrid coupler 18 receives the RF receive input signal 14 and the RF receive input signal 16 from the antenna 12. An RF receive output signal 26 is provided by the second hybrid coupler 20 and output to downstream circuitry, such as baseband circuitry. The RF receive output signal 26 is essentially the RF receive input signal 14 after the tunable RF diplexer 10 has filtered and routed the RF receive input signal 14. An RF receive output signal 26 is provided by the second hybrid coupler 20 and output to downstream circuitry, such as baseband circuitry. The RF receive output signal 26 is essentially the RF receive input signal 14 after the tunable RF diplexer 10 has filtered and routed the RF receive input signal 14. An RF receive output signal 28 is also provided by the second hybrid coupler 20 and output to downstream circuitry, such as baseband circuitry. The RF receive output signal 28 is essentially the RF receive input signal 16 after the tunable RF diplexer 10 has filtered and routed the RF receive input signal 16.

The tunable RF diplexer 10 also allows for an RF transmission input signal 30 and an RF transmission input signal 32 to be combined for transmission by the antenna 12 simultaneously. The second hybrid coupler 20 is configured to receive the RF transmission input signal 30. In response, the first hybrid coupler 18 outputs an RF transmission output signal 34 towards the antenna 12. The RF transmission output signal 34 is simply the RF transmission input signal 30 after filtering and routing by the tunable RF diplexer 10. Additionally, the first hybrid coupler 18 is configured to receive the RF transmission input signal 32. In response, the first hybrid coupler 18 outputs an RF transmission output signal 36 towards the antenna 12. The RF transmission output signal 36 is simply the RF transmission input signal 32 after filtering and routing by the tunable RF diplexer 10. The RF transmission input signal 30 and the RF transmission input signal 32 may each be received from upstream circuitry, such as a power amplifier.

As explained in further detail below, the first hybrid coupler 18, the RF filter circuit 22, and the second hybrid coupler 20 provide the appropriate isolation between the RF receive input signals 14, 16 and the RF frequency bands. The first hybrid coupler 18, the RF filter circuit 22, and the second hybrid coupler 20 provide the appropriate isolation between the RF transmission input signals 30, 32 and the RF frequency bands. The RF filter circuit 22 includes a first RF filter 38A across its top ports and an second RF filter 38B across its bottom ports. Thus, the RF filter circuit 22 is a four-port network. However, the first RF filter 38A and the second RF filter 38B are independent of one another and each of the RF filters 38A, 38B operates as a two-port network. Also, the first RF filter 38A and the second RF filter 38B may be identical, and thus may each have the same individual frequency response. In this embodiment, the first RF filter 38A is a RF bandpass filter that defines a transfer response with a passband. The passband is symmetrical in that it is the same in both directions of propagation across the first RF filter 38A to and from the first hybrid coupler 18 and the second hybrid coupler 20. The second RF filter 38B is another RF bandpass filter that defines a transfer response with a passband. The passband is also symmetrical in that it is the same in both directions of propagation across the second RF filter 38B to and from the first hybrid coupler 18 and the second hybrid coupler 20. In this case, the passband of the first RF filter 38A and the passband of the second RF filter 38B are identical. As explained in further detail below, the second RF filter 38B includes the phase inversion component.

Figure 2A:
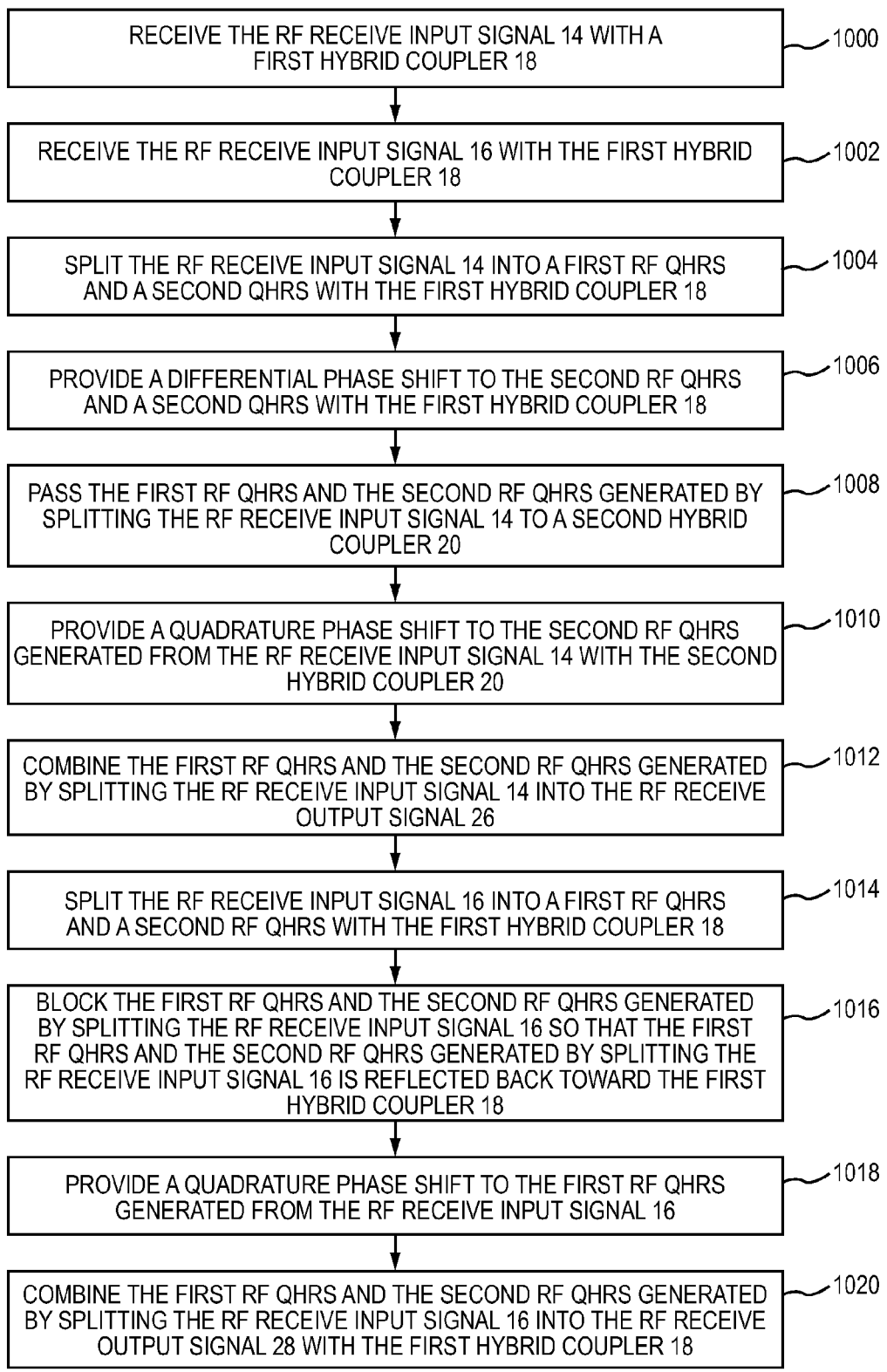
FIG. 2A illustrates exemplary procedures that may be implemented by the tunable RF diplexer shown in FIG. 1 so that the tunable RF diplexer can provide RF receive diplexing to two different RF receive signals.
Figure 2B:
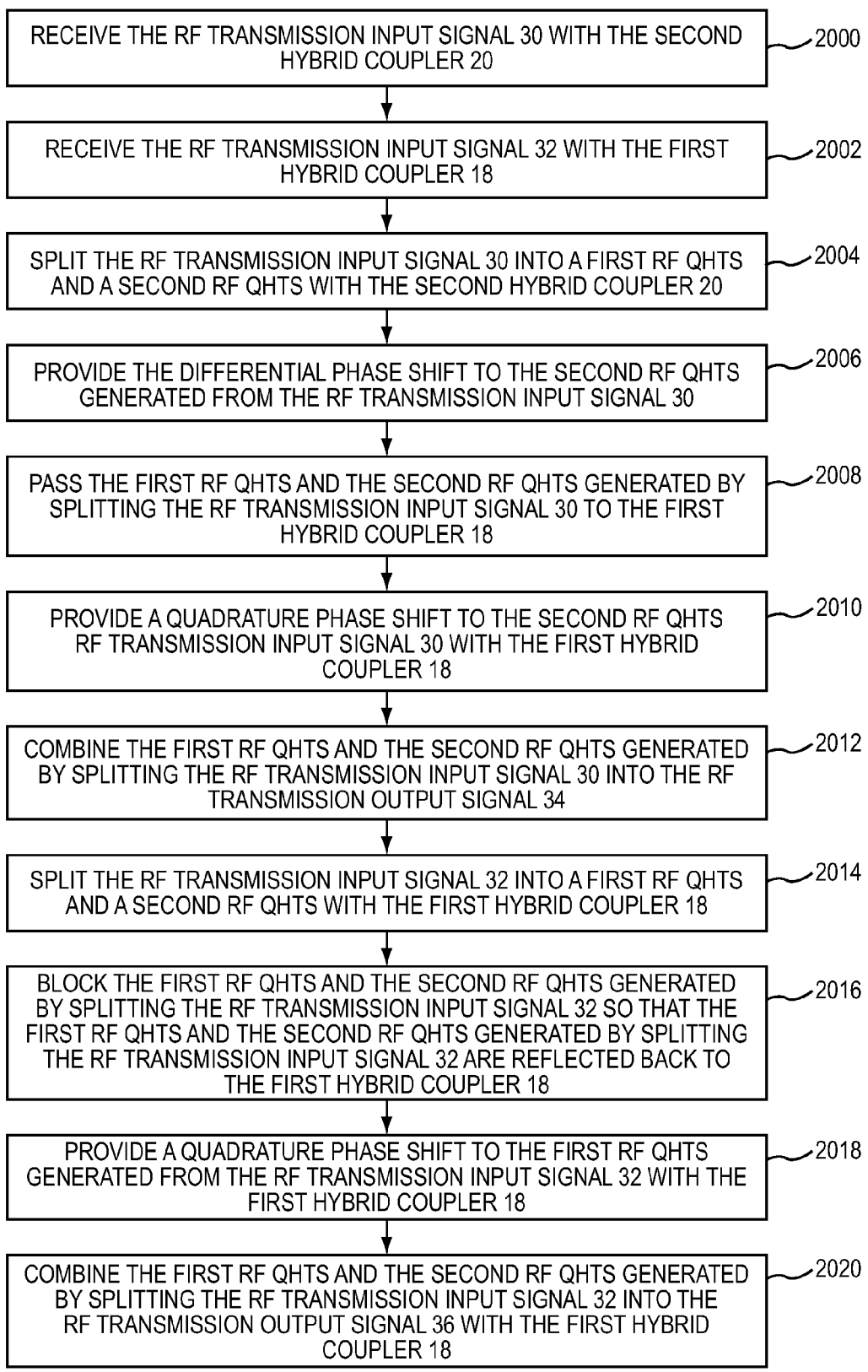
FIG. 2B illustrates exemplary procedures that may be implemented by the tunable RF diplexer shown in FIG. 1 so that the tunable RF diplexer can provide RF transmission diplexing to two different RF transmission signals.

Referring now to FIGS. 2A and 2B, FIG. 2A illustrates exemplary procedures that may be implemented to provide RF diplexing with respect to receiving the RF receive input signal 14 and the RF receive input signal 16 at the antenna 12. FIG. 2B illustrates exemplary procedures that may be implemented to provide RF diplexing with respect to transmitting the RF transmission output signal 34 and the RF transmission output signal 36 from the antenna. As explained in further detail below, the procedures described in FIG. 2 are implemented by the tunable RF diplexer 10 shown in FIG. 1. Different embodiments of these exemplary procedures may be implemented depending on a particular component structure of a tunable RF diplexer 10. Furthermore, the order in which the procedures are presented is not intended to imply a required sequence for the procedures. Rather, the procedures may be implemented in a different sequence and/or some or all of the procedures may be implemented simultaneously.

As shown in FIG. 2A, the tunable RF diplexer 10 (shown in FIG. 1) receives the RF receive input signal 14 (procedure 1000). The RF receive input signal 14 was initially intercepted by the antenna 12 (shown in FIG. 1). Additionally, the tunable RF diplexer 10 receives the RF receive input signal 16 with the first hybrid coupler 18 (procedure 1002). The RF receive input signal 16 was also initially intercepted by the antenna 12. In one embodiment, the tunable RF diplexer 10 is configured to provide diplexing when the RF receive input signal 14 is provided within an industrial, scientific, and medical (ISM) frequency band having a frequency range between 2.4 GHz and 2.5 GHz and a center frequency of around 2.450 GHz. Thus, the RF receive output signal 26 is also found in the same ISM frequency band. The RF receive input signal 16 can be provided within any one of multiple Medium Band (MB) and High Band (HB) frequency bands. For example, the RF receive input signal 16 can be provided in B1-B7 frequency bands which extend between 1.810 GHz to 2.690 GHz. The RF receive output signal 28 is thus provided in the same MB/HB frequency band.

With respect to FIG. 2B, the tunable RF diplexer 10 receives the RF transmission input signal 30 with the second hybrid coupler 20 (procedure 2000). The RF transmission input signal 30 was initially received from upstream circuitry (e.g., a power amplifier) by the second hybrid coupler 20. Additionally, the tunable RF diplexer 10 receives the RF transmission input signal 32 (procedure 2002). The RF transmission input signal 32 was initially received from upstream circuitry (e.g., a power amplifier) by the second hybrid coupler 20. In one embodiment, the tunable RF diplexer 10 is configured to provide diplexing when the RF transmission input signal 30 is provided within the same ISM frequency band as the RF receive input signal 14. Thus, the RF transmission output signal 34 is also provided in the same ISM frequency band. The RF transmission input signal 32 can be provided within any one of multiple MB and HB frequency bands. For example, the RF transmission input signal 32 can be provided in B1-B7 frequency bands which extend between 1.810 GHz to 2.690 GHz. The RF transmission output signal 36 is thus provided in the same corresponding frequency band as the RF transmission input signal 32.

Accordingly, the tunable RF diplexer 10 provides diplexing so that RF signals in different ISM and MB/HB frequency bands can share the antenna 12. In addition, the tunable RF diplexer 10 is configured to allow for carrier aggregation and combine the RF transmission output signals 34, 36 in the separate ISM and Cellular MB/HB frequency bands to emit the RF transmission output signals 34, 36 are simultaneously emitted by the antenna 12. Again, to operate optimally, the tunable RF diplexer 10 is required to provide isolation across broadband frequency ranges from 1810 MHz to 2690 MHz. The use of tunable of ISM/MB-HB cellular diplexer provides other benefits, for example, when operating into cellular mode only, the ISM bandpass filter is retuned out of the ISM band frequency into either a lower frequency or higher frequency to reduce the IL of the operating cellular frequency as shown in FIG. 23.

Figure 2C:
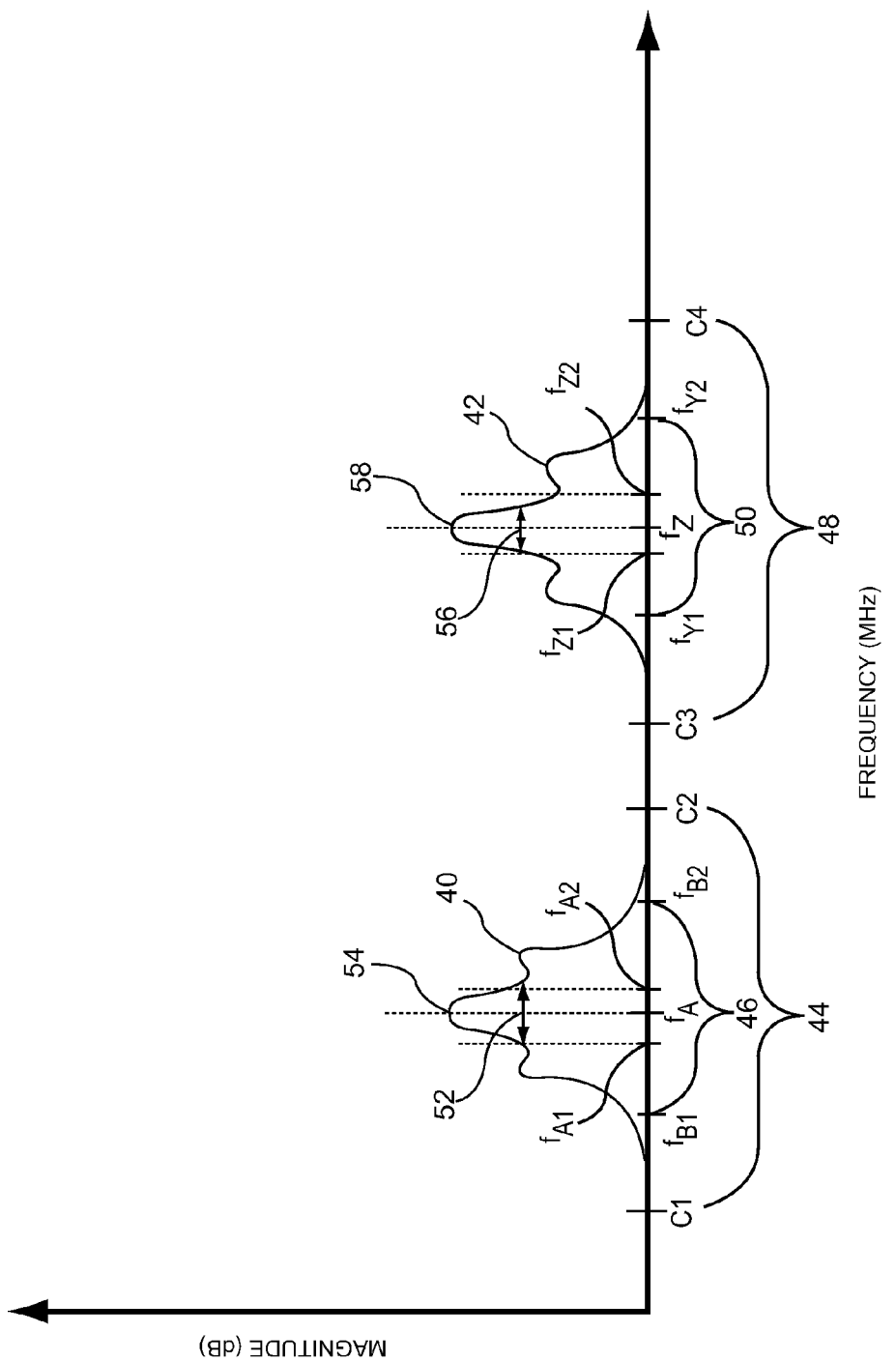
FIG. 2C illustrates two different RF input signals in two different RF communication bands.

FIG. 2C illustrates a graph of one embodiment of an RF input signal 40 and an RF input signal 42 in the frequency domain. With respect to the procedures described in FIG. 2A, the RF input signal 40 is the RF receive input signal 14, and the RF input signal 42 is the RF receive input signal 16. However, with respect to the procedures described in FIG. 2B, the RF input signal 40 is the RF transmission input signal 30, and the RF input signal 42 is the RF transmission input signal 32. The RF input signal 40 operates in an RF communication band 44, which is one embodiment of the ISM frequency band. In this embodiment, the RF communication band 44 is the set of frequencies between a cutoff frequency C1 and a cutoff frequency C2. Note that the RF communication band 44 may include additional RF subbands, such as the RF subband 46. The RF subband 46 may be a transmission subband, a receive subband, and/or the like. The RF subband 46 is defined as the set of frequencies between a cutoff frequency $f_{B1}$ and a cutoff frequency $f_{B2}$. With respect to the RF input signal 42, the RF input signal 42 operates in an RF communication band 48, which is one embodiment of the MB/HB frequency bands. In this embodiment, the RF communication band 48 is the set of frequencies between a cutoff frequency C3 and a cutoff frequency C4. Note that the RF communication band 48 may include additional RF subbands, such as the RF subband 50. The RF subband 50 may be a transmission subband, a receive subband, and/or the like. The RF subband 50 is defined as the set of frequencies between a cutoff frequency $f_{Y1}$ and a cutoff frequency $f_{Y2}$.

In this example, a signal bandwidth 52 of the RF input signal 40 is the set of frequencies that corresponds to the portion of the RF input signal 40 within 3 dB of a maximum magnitude 54. The RF input signal 40 shown in FIG. 2C operates at a frequency $f_A$. This frequency $f_A$ corresponds to the maximum magnitude 54 of the RF input signal 40. For example, the frequency $f_A$ may be a carrier frequency of the RF input signal 40. The signal bandwidth 52 reaches a cutoff frequency $f_{A1}$, since the frequency $f_{A1}$ corresponds to a value of the RF input signal 40 that is 3 dB from the maximum magnitude 54. The signal bandwidth 52 reaches a cutoff frequency $f_{A2}$, because the cutoff frequency $f_{A2}$ corresponds to a value of the RF input signal 40 that is 3 dB from the maximum magnitude 54.

Also, in this example, a signal bandwidth 56 of the RF input signal 42 is the set of frequencies that corresponds to the portion of the RF input signal 42 within 3 dB of a maximum magnitude 58. The RF input signal 42 shown in FIG. 2A operates at a frequency $f_Z$. This frequency $f_Z$ corresponds to the maximum magnitude 58 of the RF input signal 42. For example, the frequency $f_Z$ may be a carrier frequency of the RF input signal 42. The signal bandwidth 56 reaches a cutoff frequency $f_{Z1}$, since the frequency $f_{Z1}$ corresponds to a value of the RF input signal 42 that is 3 dB from the maximum magnitude 58. The signal bandwidth 56 reaches a cutoff frequency $f_{Z2}$, because the cutoff frequency $f_{Z2}$ corresponds to a value of the RF input signal 42 that is 3 dB from the maximum magnitude 58.

Portions of the RF input signal 40 and the RF input signal 42 outside of their respective signal bandwidths 52, 56 may be considered spurious emissions. In other words, the portions of the RF input signal 40 and the RF input signal 42 may be reduced or eliminated without affecting the corresponding information or data in the RF input signal 40 and the RF input signal 42. Spurious emissions include parasitic emissions, intermodulation, interference, harmonic emissions, and frequency conversion products. The signal bandwidth 52 and the signal bandwidth 56 are defined as 3 dB bandwidths for pragmatic purposes. Generally speaking, at least for the types of signals being shown in FIG. 2C, the signal bandwidths 52, 56 are measured by finding 3 dB magnitudes from the maximum magnitudes 54, 58, as explained above. However, more accurately, a necessary signal bandwidth is an exact amount of signal bandwidth required to carry the information or data of a signal. Anything outside of this necessary bandwidth would be considered spurious emissions. Thus, the signal bandwidth 52 and the signal bandwidth 56 may or may not include a small portion of the spurious emissions. The necessary signal bandwidths may be slightly smaller or slightly greater than the signal bandwidths 52 and 56.

Finally, it should be noted that the RF input signal 40 and the RF input signal 42 may each be narrow-band signals. Accordingly, the RF input signal 40 and the RF input signal 42 may represent time division multiplexing (TDM) signals, frequency division multiplexing (FDM) signals, space division multiplexing (SDM) signals, and/or the like. Accordingly, these narrow-band signals may be said to operate at a particular frequency, which for the RF input signal 40 is the frequency $f_A$ and for the RF input signal 42 is the frequency $f_Z$. The RF subband 46 is thus an RF channel within the RF communication band 44, while the RF subband 50 is an RF channel within the RF communication band 48.

However, this disclosure is not limited to narrow-band signals and the examples given in FIG. 2C and throughout this disclosure are not intended to be limited in this manner. Rather, embodiments of the tunable RF diplexer 10 and the method shown in FIGS. 2A and 2B may be provided for wide-band signals, and also for both wide-band and narrow-band signals. With wide-band signals, such as orthogonal frequency division multiple access (OFDMA) signals or Code Division Multiple Access (CDMA) signals, information or data is coded and spread across a larger portion of the spectrum. Thus, there would be no signal with a single carrier frequency that has all of the information or data, but rather there may be various carriers carrying different coded portions of the information. As such, the RF communication band 44 and/or the RF communication band 48 may include various RF channels. Similarly, the RF communication band 48 may include various RF channels. With CDMA signals and other wide-band spectrum signals, it is more practical to define the bandwidths by simply using the necessary bandwidth, as is known in the art.

Figure 2D:
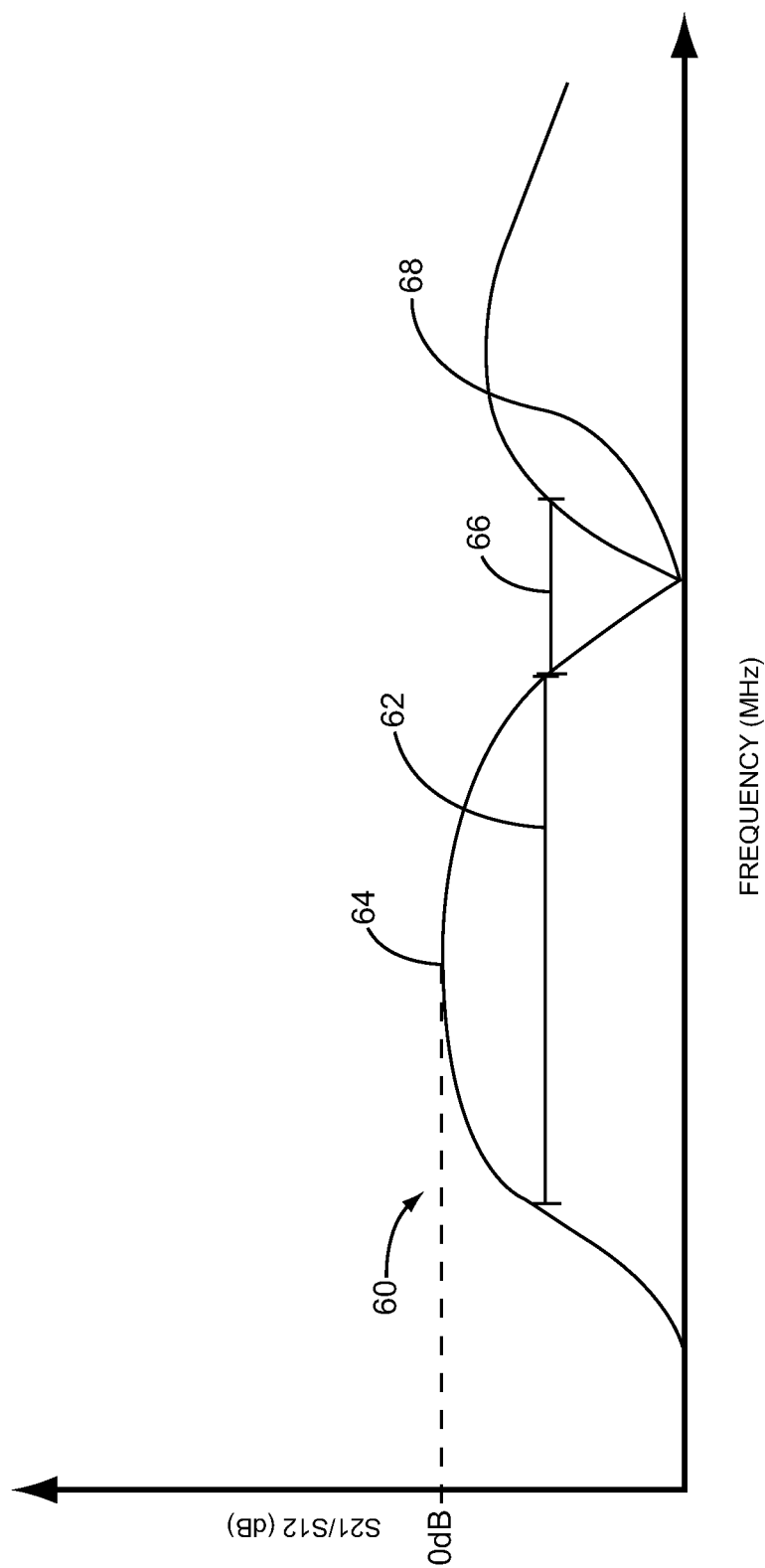
FIG. 2D illustrates a frequency response of the RF filter circuit shown in FIG. 1, where the frequency response defines a passband and a stopband.

FIG. 2D illustrates one embodiment of a frequency response 60 provided by the RF filter circuit 22. In FIG. 2D, the frequency response 60 represents S21 and S12 parameters of each of the RF filters 38A, 38B (shown in FIG. 1) individually, as a function of frequency. Thus, the two-port S21 and S12 parameter of the first RF filter 38A is represented by the frequency response 60 in FIG. 2D. Since the second RF filter 38B is identical to the first RF filter 38A, the two-port S21 and S12 parameter of the second RF filter 38B is also represented by the frequency response 60 in FIG. 2D. The two-port S21 and S12 parameter represents the forward and reverse transmission of the RF filters 38A, 38B, as a function of frequency. A passband 62 corresponds to S21/S12 values in the frequency response 60 that are within 3 dB of a maxima 64. A stopband 66 is determined relative to a minima 68. The maxima 64 and the minima 68 are set by the poles and zeros of the frequency response 60. The stopband 66 is a set of frequencies that correspond to S21/S12 values within 3 dB of the minima 68. In this embodiment, the frequency response 60 defines the stopband 66 as a notch. As explained in further detail below, the RF filter circuit 22 is tunable so as to shift the passband 62 and the stopband 66. Thus, by tuning the RF filter circuit 22, the frequency response 60 may be transposed, so that the passband 62 and the stopband 66 are provided at the desired frequency bands.

Figure 2E:
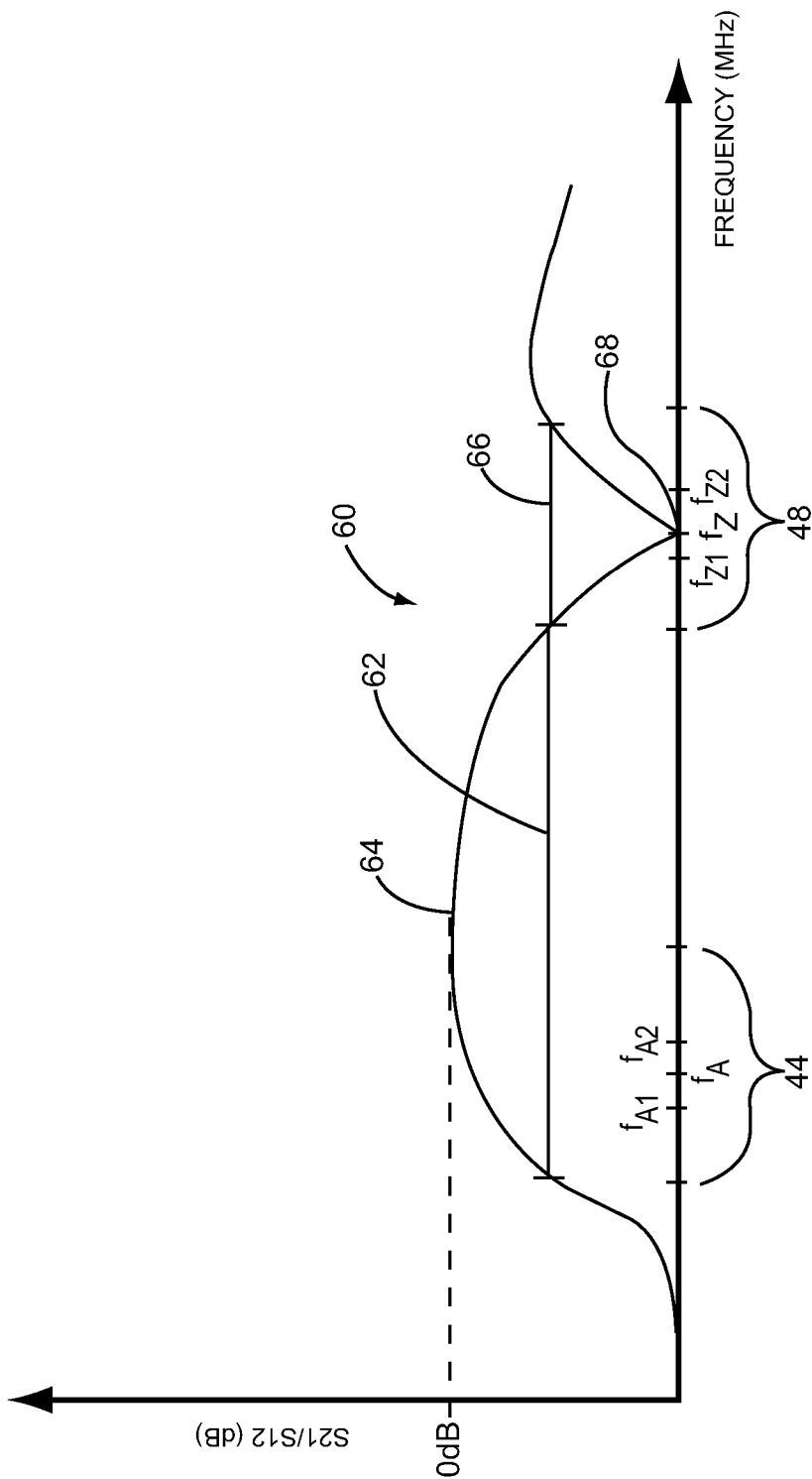
FIG. 2E illustrates the frequency response of the RF filter circuit shown in FIG. 1, where the passband has been shifted into one of RF communication bands shown in FIG. 2C, and the stopband has been shifted into the other RF communication band shown in FIG. 2C.

Referring now to FIGS. 2A, 2B, and 2E, FIG. 2E illustrates the frequency response 60 of the RF filter circuit 22 once the passband 62 is shifted to include the RF communication band 44, and once the stopband 66 is shifted to include the RF communication band 48. The tuning circuit 69 (shown in FIG. 1) tunes the passband 62 so that the passband 62 includes the RF communication band 44. The tuning circuit 69 may also tune the stopband 66 so that the stopband 66 includes the RF communication band 48. In this manner, signals that operate in the RF communication band 44 are passed by the RF filter circuit 22, while signals that operate in the RF communication band 48 are blocked by the RF filter circuit 22.

Referring now to FIGS. 2A, 2B, and 2F, FIG. 2F also illustrates the frequency response 60 of the RF filter circuit 22 once the passband 62 is shifted to include the RF communication band 44, and once the stopband 66 is shifted to include the RF communication band 48. However, in FIG. 2F, the frequency response 60 represents S11 and S22 parameters of each of the RF filters 38A, 38B (shown in FIG. 1) individually, as a function of frequency. Thus, the two-port S11 and S22 parameter of the first RF filter 38A is represented by the frequency response 60 in FIG. 2F. Since the second RF filter 38B is identical to the first RF filter 38A, the two-port S11 and S22 parameter of the second RF filter 38B is also represented by the frequency response 60 in FIG. 2F. The two-port S11 and S22 parameter represents the forward and reverse return loss of the RF filters 38A, 38B, as a function of frequency. Note that in this embodiment, the S11/S22 values of the stopband 66 are at or near zero (0) dB in the RF communication band 48. By placing the stopband 66 at or near zero (0) dB, reflections in the stopband 66 are maximized, while the insertion losses within the RF communication band 48 are minimized. Filtering thus removes noise outside of the RF communication band 48 while minimizing losses of reflected signals.

Figure 2G:
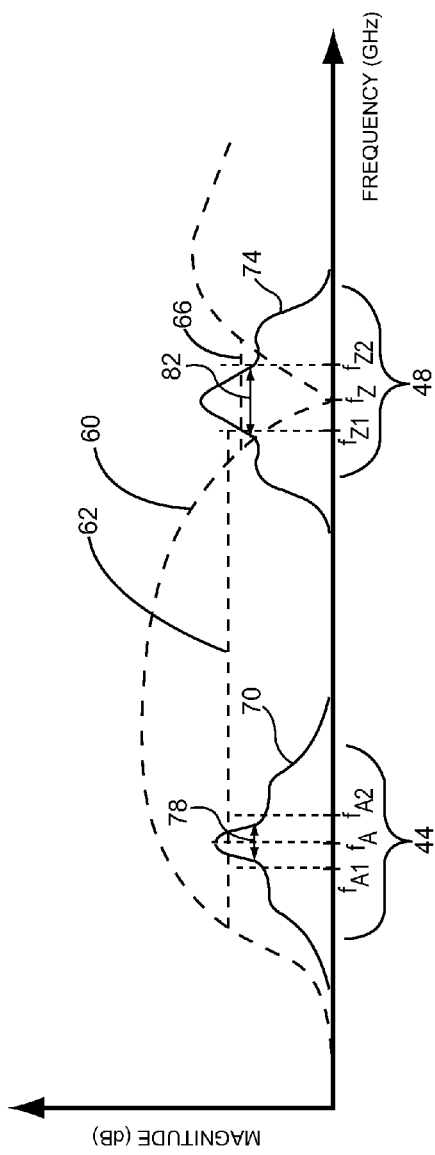
FIG. 2G and FIG. 2H illustrate quadrature hybrid signals generated by splitting the two different RF input signal shown in FIG. 2C.
Figure 2H:
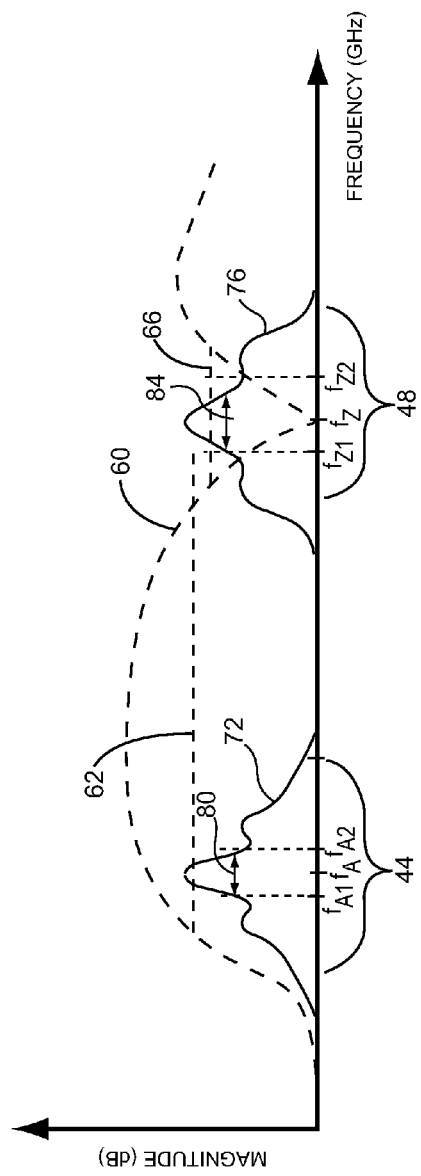

Referring now to FIGS. 2G and 2H, the tunable RF diplexer 10 is configured to split the RF input signal 40 into a first RF quadrature hybrid signal (QHS) 70 and a second RF QHS 72. As such, the first RF QHS 70 is 90 degrees or π/2 radians out of phase with the second RF QHS 72. Also, the tunable RF diplexer 10 is configured to split the RF input signal 42 into a first RF QHS 74 and a second RF QHS 76. FIGS. 2G and 2H illustrate the first RF QHS 70 (shown in FIG. 2G) and the second RF QHS 72 (shown in FIG. 2H) generated by splitting the RF input signal 40. The first RF QHS 70 and the second RF QHS 72 have substantially identical magnitude characteristics as the RF input signal 40. However, both the first RF QHS 70 and the second RF QHS 72 have a power spectral density that is at a power ratio of the power spectral density of the RF input signal 40. In this example, the power ratio is 3 dB, and thus the first RF QHS 70 and the second RF QHS 72 have approximately one half of the power of the RF input signal 40. The first RF QHS 70 and the second RF QHS 72 are quadrature hybrids, since there is approximately a 90-degree or π/2 radians phase difference between the signals.

Of course, non-ideal characteristics of the tunable RF diplexer 10, such as parasitic impedances, may result in the first RF QHS 70 and the second RF QHS 72 being slightly unbalanced with respect to one another, or having slightly less than half the power of the RF input signal 40. Also, non-ideal characteristics can result in the phase difference between the first RF QHS 70 and the second RF QHS 72 fluctuating somewhat from a 90-degree or π/2 radians phase difference. These types of errors are acceptable so long as the first RF QHS 70 and the second RF QHS 72 can be generated to comply with spectrum requirements for the RF communication standard with respect to the RF input signal 40. As explained in further detail below, the tunable RF diplexer 10 is configured to provide a differential phase shift to the second RF QHS 72 after the RF input signal 40 has been split. The differential phase shift is approximately 180 degrees or π radians. In this embodiment, the second RF filter 38B (shown in FIG. 1) is configured to provide the differential phase shift and includes the phase inversion component that provides the differential phase shift. With regard to the ISM frequency band and MB/HB frequency band embodiment, IM3 cancellation is provided by the architecture of the back-to-back hybrid couplers, 20.

With respect to the procedures in FIG. 2A, the RF input signal 40 is the RF receive input signal 14, shown in FIG. 1. Accordingly, the first hybrid coupler 18 is configured to split the RF receive input signal 14 into a first RF quadrature hybrid receive signal (QHRS) (which in the procedures of FIG. 2A is the first RF QHS 70 shown in FIG. 2G) and a second RF QHRS (which in the procedures of FIG. 2A is the second RF QHS 72 shown in FIG. 2H) (procedure 1004). As such, the first RF QHRS is 90 degrees or π/2 radians out of phase with the second RF QHRS when the first hybrid coupler 18 splits the RF receive input signal 14. The RF filter circuit 22 then filters the first RF QHRS and the second RF QHRS. More specifically, the second RF filter 38B provides the differential phase shift to the second RF QHRS (procedure 1006), and the RF filter circuit 22 passes the first RF QHRS and the second RF QHRS to the second hybrid coupler 20 (procedure 1008). As explained in further detail below, the differential phase shift may be provided by other phase inversion components, such as phase shifter, transformers, and the like. The second hybrid coupler 20 provides a quadrature phase shift (approximately 90-degree or π/2 radians phase shift) to the second RF QHRS (procedure 1010). In this manner, the second hybrid coupler 20 combines the first RF QHRS and the second RF QHRS into the RF receive output signal 26 (procedure 1012). These procedures are further explained in Figures below.

With respect to the procedures in FIG. 2B, the RF input signal 40 is the RF transmission input signal 30, shown in FIG. 1. Accordingly, the second hybrid coupler 20 is configured to split the RF transmission input signal 30 into a first RF quadrature hybrid transmission signal (QHTS) (which in the procedures of FIG. 2B is the first RF QHS 70 shown in FIG. 2G) and a second RF QHTS (which in the procedures of FIG. 2B is the second RF QHS 72 shown in FIG. 2H) (procedure 2004). As such, the first RF QHTS is 90 degrees or π/2 radians out of phase with the second RF QHTS. The RF filter circuit 22 then filters the first RF QHTS and the second RF QHTS. More specifically, the second RF filter 38B provides the differential phase shift to the second RF QHTS (procedure 2006), and the RF filter circuit 22 passes the first RF QHTS and the second RF QHTS to the first hybrid coupler 18 (procedure 2008). The first hybrid coupler 18 provides a quadrature phase shift (approximately 90-degree or π/2 radian phase shift) to the second RF QHTS (procedure 2010). In this manner, the first hybrid coupler 18 also combines the first RF QHTS and the second RF QHTS into the RF transmission output signal 34 (procedure 2012).

Referring again to FIGS. 2G and 2H, the tunable RF diplexer 10 is also configured to split the RF input signal 42 into the first RF QHS 74 and the second RF QHS 76, as mentioned above. As such, the first RF QHS 74 is 90 degrees or π/2 radians out of phase with the second RF QHS 76. FIGS. 2G and 2H illustrate the first RF QHS 74 (shown in FIG. 2G) and the second RF QHS 76 (shown in FIG. 2H) generated by splitting the RF input signal 42. The first RF QHS 74 and the second RF QHS 76 have substantially identical magnitude characteristics as the RF input signal 42. However, both the first RF QHS 74 and the second RF QHS 76 have a power spectral density that is at a power ratio of the power spectral density of the RF input signal 42. In this example, the power ratio is 3 dB, and thus the first RF QHS 74 and the second RF QHS 76 have approximately one half of the power of the RF input signal 42. The first RF QHS 74 and the second RF QHS 76 are quadrature hybrids, since there is approximately a 90-degree or π/2 radians phase difference between the signals.

Of course, non-ideal characteristics of the tunable RF diplexer 10, such as parasitic impedances, may result in the first RF QHS 74 and the second RF QHS 76 being slightly unbalanced with respect to one another, or having slightly less than half the power of the RF input signal 42. Also, non-ideal characteristics can result in the phase difference between the first RF QHS 74 and the second RF QHS 76 fluctuating somewhat from a 90-degree or π/2 radians phase difference. These types of errors are acceptable so long as the first RF QHS 74 and the second RF QHS 76 can be generated to comply with spectrum requirements for the RF communication standard with respect to the RF input signal 42. As explained in further detail below, the tunable RF diplexer 10 is configured to provide a differential phase shift to either the first RF QHS 74 or the second RF QHS 76 after the RF input signal 42 has been split. The differential phase shift is approximately 180 degrees or π radians. As mentioned above, in this embodiment, the second RF filter 38B (shown in FIG. 1) is configured to provide the differential phase shift.

With respect to the procedures in FIG. 2A, the RF input signal 42 is the RF receive input signal 16, shown in FIG. 1. Accordingly, the first hybrid coupler 18 is configured to split the RF receive input signal 16 into a first RF QHRS (which in the procedures of FIG. 2A is the first RF QHS 74 shown in FIG. 2G) and a second RF QHRS (which in the procedures of FIG. 2A is the second RF QHS 76 shown in FIG. 2H) (procedure 1014). As such, the first RF QHRS is 90 degrees or $\pi/2$ radians out of phase with the second RF QHRS. The RF filter circuit 22 then filters the first RF QHRS and the second RF QHRS. More specifically, the RF filter circuit 22 blocks the first RF QHRS and the second RF QHRS so that the first RF QHRS and the second RF QHRS is reflected back toward the first hybrid coupler 18 (procedure 1016). The first hybrid coupler 18 then provides a quadrature phase shift (approximately 90-degree or $\pi/2$ radians phase shift) to the first RF QHRS (procedure 1018). In this manner, the first hybrid coupler 18 combines the first RF QHRS and the second RF QHRS generated by splitting the RF input signal 42 into the RF receive output signal 28 (procedure 1020). These procedures are further explained in Figures below. Furthermore, note that the procedures 1000, 1004-1012 may all occur simultaneously with procedures 1002, 1014-1020.

With respect to the procedures in FIG. 2B, the RF input signal 42 is the RF transmission input signal 32, shown in FIG. 1. Accordingly, the first hybrid coupler 18 is configured to split the RF transmission input signal 32 into a first RF QHTS (which in the procedures of FIG. 2B is the first RF QHS 74 shown in FIG. 2G) and a second RF QHTS (which in the procedures of FIG. 2B is the second RF QHS 76 shown in FIG. 2H) (procedure 2014). As such, the first RF QHTS is 90 degrees or $\pi/2$ radians out of phase with the second RF QHTS. The RF filter circuit 22 then filters the first RF QHTS and the second RF QHTS generated by splitting the RF transmission input signal 32. More specifically, the RF filter circuit 22 blocks the first RF QHTS and the second RF QHTS generated by splitting the RF transmission input signal 32 so that the first RF QHTS and the second RF QHTS generated by splitting the RF transmission input signal 32 are reflected back to the first hybrid coupler 18 (procedure 2016). The first hybrid coupler 18 then provides a quadrature phase shift (approximately 90-degree or $\pi/2$ radians phase shift) to the first RF QHTS (procedure 2018). In this manner, the first hybrid coupler 18 combines the first RF QHTS and the second RF QHTS generated by splitting the RF transmission input signal 32 into the RF transmission output signal 36 (procedure 2020). These procedures are further explained in Figures below. Furthermore, note that the procedures 2000, 2004-2012 may all occur simultaneously with procedures 2002, 2014-2020.

Referring again to FIGS. 2G and 2H, since the RF input signal 40 is split into the first RF QHS 70 and the second RF QHS 72, both the first RF QHS 70 and the second RF QHS 72 operate in the RF communication band 44. When the hybrid couplers 18, 20 output the first RF QHS 70 and the second RF QHS 72, the RF filter circuit 22 filters the first RF QHS 70 and the second RF QHS 72 to pass the first RF QHS 70 and the second RF QHS 72 within the passband 62. As shown in FIGS. 2G and 2H, the frequency response 60 of the RF filter circuit 22 has been transposed so that the passband 62 and the stopband 66 are shifted into the RF communication band 44. More particularly, the passband 62 is shifted so that the RF communication band 44 is in the passband 62.

The stopband 66 has been shifted so that the RF communication band 48 is in the stopband 66. Since the first RF QHS 70 and the second RF QHS 72 are within the passband 62, the RF filter circuit 22 is configured to pass the first RF QHS 70 and the second RF QHS 72. However, the RF filter circuit 22 filters the first RF QHS 74 and the second RF QHS 76 to reflect the first RF QHS 74 and the second RF QHS 76 within the stopband 66. The first RF QHS 74 and the second RF QHS 76 operate within the RF communication band 48. Since the stopband 66 is in the RF communication band 48, the RF filter circuit 22 has been tuned to block the first RF QHS 74 and the second RF QHS 76.

As shown in FIGS. 2G and 2H, the first RF QHS 70 has a signal bandwidth 78, and the second RF QHS 72 has a signal bandwidth 80. Although the first RF QHS 70 and the second RF QHS 72 have approximately half the spectral power density (excluding losses) of the RF input signal 40 shown in FIG. 2C, the signal bandwidth 78 of the first RF QHS 70 and the signal bandwidth 80 of the second RF QHS 72 have approximately the same size and are located at approximately the same frequencies. In FIGS. 2E and 2F, the signal bandwidth 78 of the first RF QHS 70 and the signal bandwidth 80 of the second RF QHS 72 are between the frequencies $f_{A1}$ and $f_{A2}$. However, non-ideal circuit behavior may result in either slight misalignments and/or slight size differences in the signal bandwidth 78 and the signal bandwidth 80. The amount of error that is permissible may depend on the particular application and spectrum requirements. The tuning circuit 69 is configured to tune the frequency response 60 of the RF filter circuit 22 so that the signal bandwidth 78 of the first RF QHS 70 and the signal bandwidth 80 of the second RF QHS 72 are each within the passband 62. Thus, the RF filter circuit 22 filters the first RF QHS 70 and the second RF QHS 72 to pass the first RF QHS 70 and the second RF QHS 72 within the passband 62 to the second hybrid coupler 20.

As shown in FIGS. 2G and 2H, the first RF QHS 74 has a signal bandwidth 82, while the second RF QHS 76 has a signal bandwidth 84. Although the first RF QHS 74 and the second RF QHS 76 have approximately half the power spectral density of the RF input signal 42 (excluding losses) shown in FIG. 2C. The signal bandwidth 82 of the first RF QHS 74 and the signal bandwidth 84 of the second RF QHS 76 are configured to be approximately the same as the signal bandwidth 82 of the RF input signal 42. In the embodiments illustrated in FIGS. 2G and 2H, the signal bandwidth 82 and the signal bandwidth 84 are both between the frequencies $f_{Z1}$ and $f_{Z2}$. However, non-ideal circuit behavior may result in slight misalignments or size differences in the signal bandwidth 82 and the signal bandwidth 84. The amount of error that is permissible may depend on the particular application and spectrum requirements. The tuning circuit 69 is configured to tune the frequency response 60 of the RF filter circuit 22 so that the signal bandwidth 82 of the first RF QHS 74 and the signal bandwidth 84 of the second RF QHS 76 are each within the stopband 66. In this manner, the RF filter circuit 22 blocks the first RF QHS 74 and the second RF QHS 76 such that the first RF QHS 74 and the second RF QHS 76 are reflected back to the second hybrid coupler 20.

Figure 3A:
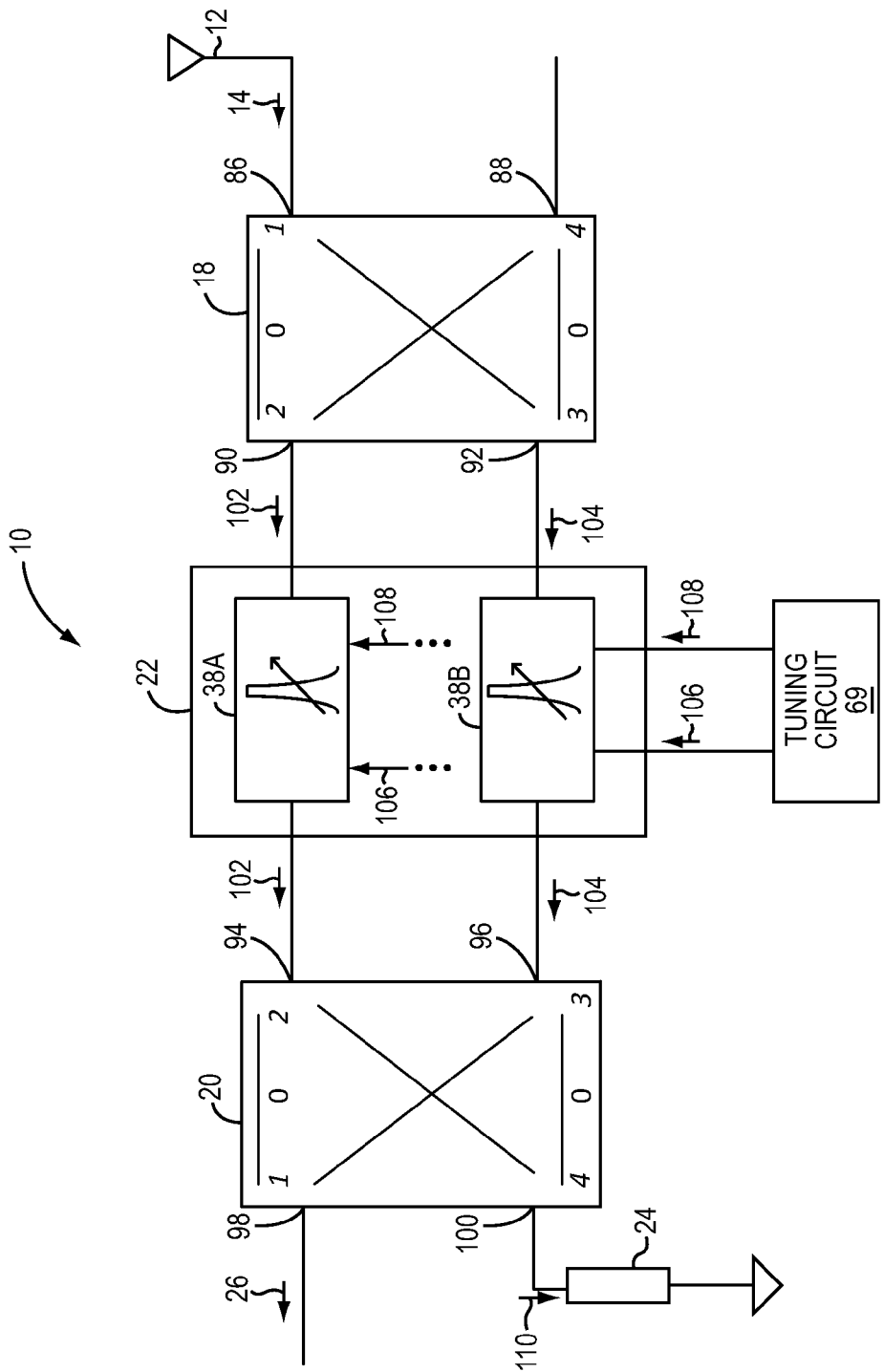
FIG. 3A illustrates a receive signal flow for one of the RF receive signals described in FIG. 2A.

FIG. 3A illustrates the tunable RF diplexer 10 along with a receive signal flow of the tunable RF diplexer 10 with respect to the procedures 1000, 1004-1012 for the RF receive input signal 14 and the RF receive output signal 26. As shown in FIG. 3A, the first hybrid coupler 18 has a first port 86, a second port 88, a third port 90, and a fourth port 92, while the second hybrid coupler 20 has a fifth port 94, a sixth port 96, a seventh port 98, and an eighth port 100.

The antenna 12 intercepts the RF receive input signal 14 as electromagnetic waves in free space. These electromagnetic waves result in excitations within the antenna 12, thereby converting the electromagnetic waves into the RF receive input signal 14. The first hybrid coupler 18 is operable to receive the RF receive input signal 14. In this particular embodiment, the first hybrid coupler 18 is coupled to receive the RF receive input signal 14 at the first port 86 from the antenna 12. The first hybrid coupler 18 is operable to split the RF receive input signal 14 into a first RF QHRS 102 and the second RF QHRS 104. In this manner, the first RF QHRS 102 and the second RF QHRS 104 have approximately the same power ratio with respect to the RF receive input signal 14, but have a quadrature phase difference of approximately 90 degrees or $\pi/2$ radians with respect to one another.

With regard to the first hybrid coupler 18 shown in FIG. 3A, the first port 86 is phase-aligned with the third port 90, while the first port 86 has a quadrature phase shift with respect to the fourth port 92. Thus, the first RF QHRS 102 at the third port 90 is approximately phase-aligned with the RF receive input signal 14 at the first port 86, but there is a quadrature phase difference between the RF receive input signal 14 at the first port 86 and the second RF QHRS 104 at the fourth port 92.

Note that in alternative embodiments, this may or may not be the case. For example, there may be a phase shift between the first port 86 and the third port 90 (such as +45 degrees or $+\pi/4$ radians). The phase shift between the first port 86 and the fourth port 92 may then be equal to this phase shift plus or minus 90 degrees (such as +135 degrees or $+3\pi/4$ radians, $-45$ degrees or $-\pi/4$ radians). Accordingly, so long as the phase difference between the first RF QHRS 102 and the second RF QHRS 104 is about 90 degrees or $\pi/2$ radians, phase alignment between the third port 90 and the first port 86, and between the fourth port 92 and the first port 86, can vary. The first RF QHRS 102 is output at the third port 90 toward the first RF filter 38A of the RF filter circuit 22. The first RF filter 38A is connected between the third port 90 and the fifth port 94. Additionally, the second RF QHRS 104 is output at the fourth port 92 toward the second RF filter 38B of the RF filter circuit 22. The second RF filter 38B is connected between the fourth port 92 and the sixth port 96.

The tunable RF diplexer 10 includes a phase inversion component that is connected between the first hybrid coupler 18 and the second hybrid coupler 20. The phase inversion component is configured to provide a differential phase shift to the second RF QHRS 104. In this embodiment, the phase inversion component is the second RF filter 38B in the RF filter circuit 22. As such, the second RF filter 38B shown in FIG. 3A is configured to provide the differential phase shift (i.e. approximately 180 degree/$\pi$ radian phase shift) to the second RF QHRS 104. However, as explained in further detail below, the phase inversion component may be provided by any phase inversion component capable of providing a differential phase shift, such as a phase shifter, a transformer, and/or the like. The benefit of introducing the differential phase shift is that it provides increased isolation between diplexed RF communication bands over a greater frequency range. For example, if the RF receive input signal 14 and the RF receive output signal 26 are provided in the ISM frequency band, and the RF receive input signal 16 (shown in FIG. 1) and the RF receive output signal 28 (shown in FIG. 1) are provided an MB/HB frequency band, the cancellation of the RF receive input signal 16 (shown in FIG. 1) and the RF receive output signal 28 (shown in FIG. 1) is provided through the differential phase shift, rather than simply on a precise power split. This differential phase shift is much easier to maintain over a broad frequency range.

Referring again to FIG. 3A, the tuning circuit 69 is configured to tune the frequency response of the RF filter circuit 22 so that the passband 62 of the first RF filter 38A and the passband 62 of the second RF filter 38B includes the RF communication band of the RF receive input signal 14 and the RF receive output signal 26. In this manner, the RF filter circuit 22 is operable to pass the first RF QHRS 102 and the second RF QHRS 104 to the second hybrid coupler 20. The manner of tuning the frequency response may depend on the topology of the RF filter circuit 22. For example, the first RF filter 38A and the second RF filter 38B shown in FIG. 3A may both be variable passive filters. Accordingly, one or more reactive impedance components (inductive, capacitive, or both) in each of the first and second RF filters 38A, 38B may have a variable reactive impedance level. By varying these variable reactive impedance levels, the poles and zeros of the individual frequency responses provided by each of the first and second RF filters 38A, 38B are adjusted. This thereby shifts the passband 62 in the frequency domain. As explained in further detail below, the first and second RF filters 38A, 38B may include weakly coupled resonators to provide filtering and the differential phase shift.

In this embodiment, the tuning circuit 69 illustrated in FIG. 3A generates a passband tuning control output 106 and a stopband tuning control output 108. The variable reactive impedance components in both the first RF filter 38A and the second RF filter 38B are set in accordance with one or more signal levels of the passband tuning control output 106. In this manner, the stopband 66 is shifted to include the RF transmission band in accordance with one or more signal levels of the stopband tuning control output 108. Similarly, reactive impedance levels of variable reactive components in the first RF filter 38A and the second RF filter 38B are set in accordance with one or more signal levels of the passband tuning control output 106. The RF filter circuit 22 may also include active RF filters, Surface Acoustic Wave (SAW) filters, or any other type of RF filter or combination of RF filters that is suitable to provide a desired frequency response. As such, the tuning circuit 69 may employ various types of tuning topologies, depending on the particular filtering topology being employed by the RF filter circuit 22.

By placing the passband 62 of the first RF filter 38A and the second RF filter 38B in the RF communication band, the RF filter circuit 22 passes the first RF QHRS 102 and the second RF QHRS 104 to the second hybrid coupler 20. Due to the differential phase shift provided by the second RF filter 38B, the second RF QHRS 104 has an approximately 270 degree or $3/2\pi$ radian phase difference with respect to the first RF QHRS 102 once the first RF QHRS 102 and the second RF QHRS 104 are output from the RF filter circuit 22.

Referring again to FIG. 3A, the second hybrid coupler 20 receives the first RF QHRS 102 from the first RF filter 38A at the fifth port 94. The second RF QHRS 104 is received by the second hybrid coupler 20 from the second RF filter 38B at the sixth port 96. As discussed above, the phase difference between the first RF QHRS 102 and the second RF QHRS 104 have about 270 degrees or $3\pi/2$ radians. Thus, for example, if the first RF QHRS 102 has a phase of zero degrees, the second RF QHRS 104 would have a phase of approximately 270 degrees (or $3\pi/2$ radians). From the fifth port 94 to the seventh port 98, the second hybrid coupler 20 provides no phase shift. Alternatively, the second hybrid coupler 20 may be configured to provide a phase shift from the fifth port 94 to the seventh port 98 of Δ (i.e., such as +45 degrees or π/4 radians).

The second hybrid coupler 20 is configured to output the RF receive output signal 26 from the seventh port 98 in response to the first RF QHRS 102 being received from the RF filter circuit 22 at the fifth port 94 and the second RF QHRS 104 being received from the RF filter circuit 22 at the sixth port 96. In this particular embodiment, the second hybrid coupler 20 is configured to pass the second RF QHRS 104 from the sixth port 96 to the seventh port 98 by providing another quadrature phase shift. Thus, as seen at the seventh port 98, the second RF QHRS 104 has a phase of 360 degree or 2π radian phase. The second hybrid coupler 20 provides no phase shift to the first RF QHRS 102 from the sixth port 96 to the seventh port 98. The first RF QHRS 102 is thus passed with a phase of 0 degrees to the seventh port 98. Thus, the interference between the first RF QHRS 102 and the second RF QHRS 104 at the seventh port 98 is constructive. Accordingly, the second hybrid coupler 20 is configured to combine the first RF QHRS 102 and the second RF QHRS 104 into the RF receive output signal 26. The RF receive output signal 26 is then transmitted to external circuitry in an RF front end, such as an RF receive chain.

The second hybrid coupler 20 shown in FIG. 3A is configured to provide a quadrature phase shift from the fifth port 94 to the eighth port 100. In this example, the phase shift is 90 degrees (or π/2 radians), and thus the second RF QHRS 104 has a phase, as seen from the eighth port 100, of 90 degrees (note that the first RF QHRS 102 was received at the fifth port 94 with a phase of 0 degrees in this example). The second RF QHRS 104 is received with a phase of 270 degrees at the sixth port 96 and the second hybrid coupler 20 provides no phase shift between the sixth port 96 and the eighth port 100. Thus, the phase difference between the first RF QHRS 102 and the second RF QHRS 104 as seen from the eighth port 100 is about 180 degrees. Accordingly, the quadrature phase shift at the eighth port 100 from the fifth port 94 results in destructive interference between the first RF QHRS 102 and the second RF QHRS 104 at the eighth port 100. As a result, the first RF QHRS 102 and the second RF QHRS 104 are substantially cancelled at the eighth port 100. In this manner, the eighth port 100 is substantially isolated from receive signal flow.

An impedance termination 24 is coupled to the eighth port 100 of the second hybrid coupler 20. The impedance termination 24 may be a 50 Ohm load. Due to the phase-shifting provided by the first hybrid coupler 18, the first RF filter 38A and the second hybrid coupler 20, spurious emissions from the second port 88 of the first hybrid coupler 18 would see a very high (theoretically infinite) impedance at the seventh port 98 of the second hybrid coupler 20 but only the impedance termination 24 at the eighth port 100. Thus, the spurious emissions are aggregated to be an aggregated noise signal 110 at the eighth port 100. This aggregated noise signal 110 is dissipated by the impedance termination 24. Additionally, the eighth port 100 is isolated from the seventh port 98. As such, the seventh port 98 is substantially unresponsive to signals incident at the eighth port 100, and the seventh port 98 is substantially unresponsive to signals incident at the eighth port 100. An impedance of the impedance termination 24 can be varied by the tuning circuit 69 in order to maintain the impedance termination 24 at a characteristic 50 Ohms.

Figure 3B:
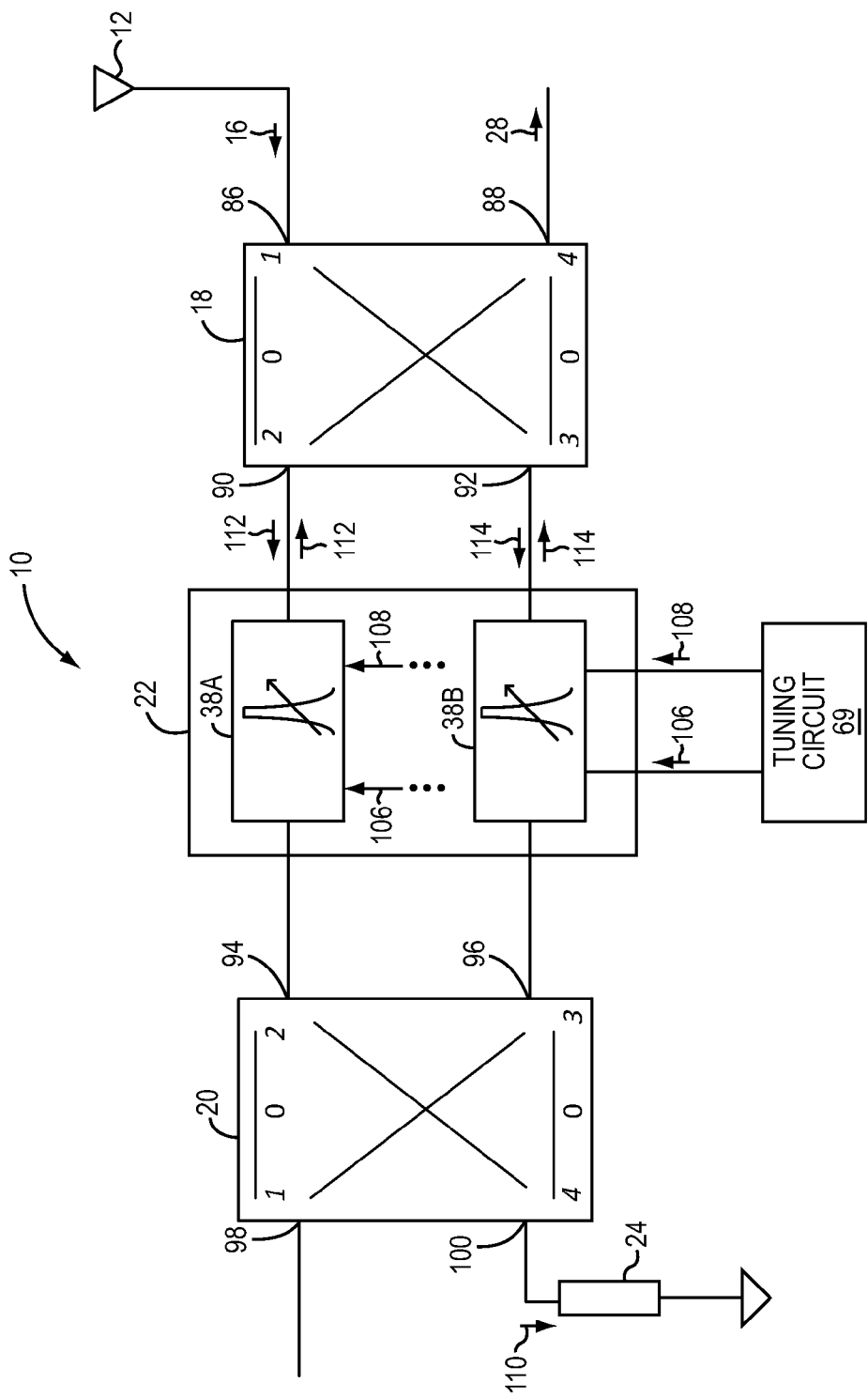
FIG. 3B illustrates a receive signal flow for the other RF receive signal described in FIG. 2A.

FIG. 3B illustrates the tunable RF diplexer 10 along with the receive signal flow of the tunable RF diplexer 10 with respect to the procedures 1002, 1014-1020 shown in FIG. 2A for the RF receive input signal 16 and the RF receive output signal 28. The procedures 1000, 1004-1012 and the procedures for the RF receive input signal 14 and the RF receive output signal 26 shown in FIG. 2A and illustrated in FIG. 3A can performed simultaneously with the procedures 1002, 1014-1020 shown FIG. 2A and illustrated in FIG. 3B. Thus, FIG. 3A and FIG. 3B together illustrate receive flow diplexing for the tunable RF diplexer 10. As shown in FIG. 3B, the antenna 12 intercepts the RF receive input signal 16 as electromagnetic waves in free space. These electromagnetic waves result in excitations within the antenna 12, thereby converting the electromagnetic waves into the RF receive input signal 16. The first hybrid coupler 18 is configured to receive the RF receive input signal 16 at the first port 86. The RF receive input signal 16 operates in the same RF communication band as the RF transmission input signal 32 (shown in FIG. 1). The first hybrid coupler 18 is operable to split the RF receive input signal 16 into the first RF QHRS 112 and the second RF QHRS 114. Since the first RF QHRS 112 and the second RF QHRS 114 are quadrature hybrids, the first RF QHRS 112 and the second RF QHRS 114 are approximately equal in power but have a quadrature phase difference of 90 degrees or π/2 radians. The first hybrid coupler 18 outputs the first RF QHRS 112 from the third port 90 and outputs the second RF QHRS 114 from the fourth port 92 in response to receiving the RF receive input signal 16 at the first port 86.

In the embodiment illustrated in FIG. 3B, the first RF QHRS 112 is phase-aligned with the RF receive input signal 16, while the second RF QHRS 114 has a phase difference of about 90 degrees with respect to the RF receive input signal 16. It should be noted that this may or may not be the case. For example, in alternative embodiments, a phase shift of Δ may be provided between the first port 86 and the third port 90, and thus, a phase shift of Δ+90 degrees (or π/2 radians) would be provided between the first port 86 and the fourth port 92.

The RF filter circuit 22 is operable to reflect the first RF QHRS 112 and the second RF QHRS 114. As discussed above, the frequency response of the RF filter circuit 22 defines the stopband 66 and the RF filter circuit 22 is tunable so as to shift the stopband 66. For example, the stopband 66 may be a notch that is shiftable. The tuning circuit 69 is configured to tune the frequency response of the RF filter circuit 22 so that the signal bandwidth of the first RF QHRS 112 and the signal bandwidth of the second RF QHRS 114 are each within the stopband. More specifically, the tuning circuit 69 is configured to shift the stopband 66 of the first RF filter 38A and the stopband 66 of the second RF filter 38B into the frequency band of the RF receive input signal 16. For instance, the tuning circuit 69 may be configured to place the notch within the frequency band of the RF receive input signal 16 so that the notch is centered at the RF receive signal frequency. In this embodiment, the tuning circuit 69 generates the stopband tuning control output 108. Variable reactive impedance components in both the first RF filter 38A and the second RF filter 38B are responsive to the signal level of the stopband tuning control output 108 so as to adjust the variable impedance levels based on the signal level of the stopband tuning control output 108. As a result, the notch defined by the individual frequency response of the first RF filter 38A is shifted to include the signal bandwidth of the second RF QHRS 114. Also, the notch defined by the individual frequency response of the second RF filter 38B is shifted to include the signal bandwidth of the first RF QHRS 112. In other words, the notches defined by the individual frequency responses of the first RF filter 38A and the second RF filter 38B are placed in the frequency band of the RF receive input signal 16.

Since the tuning circuit 69 has tuned the frequency response of the RF filter circuit 22 so that the stopband 66 includes the frequency band of the RF receive input signal 16, the RF filter circuit 22 blocks the first RF QHRS 112 and the second RF QHRS 114. Accordingly, the seventh port 98 is substantially isolated from the receive signal flow of the RF receive input signal 16. The RF filter circuit 22 then reflects the first RF QHRS 112 and the second RF QHRS 114 back to the first hybrid coupler 18. In the embodiment illustrated in FIG. 3B, the first RF filter 38A reflects the first RF QHRS 112 back to the first hybrid coupler 18 at the third port 90. The second RF filter 38B reflects the second RF QHRS 114 back to the first hybrid coupler 18 at the fourth port 92.

The first hybrid coupler 18 is configured to combine the first RF QHRS 112 and the second RF QHRS 114 into the RF receive output signal 28 at the second port 88. To combine the first RF QHRS 112 and the second RF QHRS 114 into the RF receive output signal 28, the first hybrid coupler 18 is configured to pass the second RF QHRS 112 from the fourth port 92 to the second port 88. Additionally, the second hybrid coupler is configured to pass the first RF QHRS 112 from the third port 90 to the second port 88. However, the first hybrid coupler 18 provides a quadrature phase shift to the first RF QHRS 112 at the second port 88. Thus, the first RF QHRS 112 is provided substantially as a duplicate of the second RF QHRS 114 at the second port 88. For example, the phase of the first RF QHRS 112 at the third port 90 is approximately zero degrees. If the phase of the second RF QHRS 114 is 90 degrees at the fourth port 92, the second RF QHRS 114 has a phase of 90 degrees at the second port 88 since the first hybrid coupler 18 provides no phase shift from the fourth port 92 to the second port 88. However, due to the quadrature phase shift between the third port 90 and the second port 88, the first RF QHRS 112 has a phase of about 90 degrees at the second port 88. Accordingly, the first RF QHRS 112 and the second RF QHRS 114 constructively interfere at the second port 88 to output the RF receive output signal 28 from the second port 88.

Also, note that the first hybrid coupler 18 is configured such that the quadrature phase shift at the first port 86 results in destructive interference between the first RF QHRS 112 and the second RF QHRS 114. Referring again to the previous example, upon reflection of the first RF QHRS 112 and the second RF QHRS 114 by the RF filter circuit 22, the first RF QHRS 112 appears to have a phase of zero degrees at the first port 86, but the second RF QHRS 114 appears to have a phase of 180 degrees at the first port 86 due to the quadrature phase shift provided by the first hybrid coupler 18 from the fourth port 92 to the first port 86. As a result, the first RF QHRS 112 and the second RF QHRS 114 are substantially cancelled at the first port 86. Consequently, most, if not all, of the power of the first RF QHRS 112 and the second RF QHRS 114 is transferred to the second port 88 and provided in the RF receive output signal 28. The first hybrid coupler 18 is thus configured to output the RF receive output signal 28 from the second port 88 in response to the first RF QHRS 112 being reflected back by the RF filter circuit 22 to the third port 90 and the second RF QHRS 114 being reflected back by the RF filter circuit 22 to the fourth port 92. The configuration of the first hybrid coupler 18 and the RF filter circuit 22 thus provides substantial isolation between the second port 88 and the first port 86.

It should be noted that due to the differential phase shift provided by the second RF filter 38B, isolation is provided between the second port 88 for one of the RF communication bands and the seventh port 98 for the other one of the diplexed RF frequency bands. For the following explanation, it is assumed that the first port 86, the third port 90, the fourth port 92, and the second port 88 are port 1, port 2, port 3, and port 4 respectively of the first hybrid coupler 18. Also, it is assumed that the seventh port 98, the fifth port 94, the sixth port 96, and the eighth port 100 are port 1, port 2, port 3, and port 4 of the second hybrid coupler 20. Subscripts on the S parameters indicate that the S parameter is either for the first hybrid coupler 18 or the second hybrid coupler 20. Now, given that the differential phase shift is provided between the fourth port 92 of the first hybrid coupler 18 and the sixth port 96 of the second hybrid coupler 20, the tunable RF diplexer 10 provides isolation between the second port 88 and the seventh port 98 by assuring that matching of $S(2,4)_{18}*S(1,2)_{20}=S(3,4)_{18}*S(1,3)_{20}$. As a result of the differential phase shift provided by the second RF filter 38B, the isolation relies on the same sum term of the receive signal flow, which remains approximately true over broad frequency range and thus provides better broadband isolation.

Figure 3C:
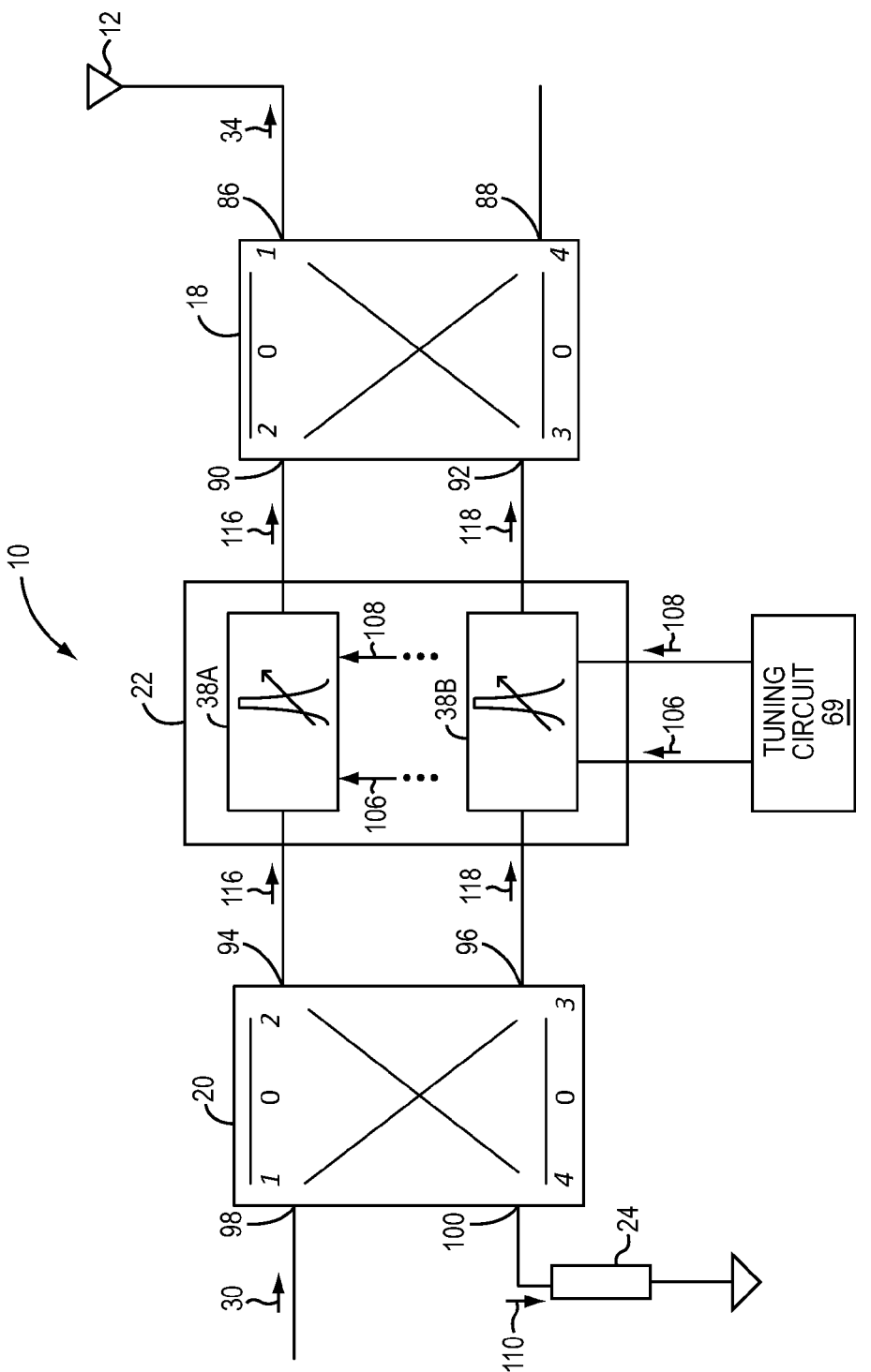
FIG. 3C illustrates a transmission signal flow for one of the RF transmission signals described in FIG. 2B.

FIG. 3C illustrates the tunable RF diplexer 10 along with a transmission signal flow of the tunable RF diplexer 10 with respect to the procedures 2000, 2004-2012 (shown in FIG. 2B) for the RF transmission input signal 30 and the RF transmission output signal 34. The second hybrid coupler 20 is configured to receive the RF transmission input signal 30 at the seventh port 98. The eighth port 100 of the second hybrid coupler 20 is isolated from the seventh port 98. This means that the seventh port 98 is substantially unresponsive to signals incident at the eighth port 100, and the eighth port 100 is substantially unresponsive to signals incident at the seventh port 98. As a result, the eighth port 100 is substantially unresponsive to the RF transmission input signal 30 incident at the seventh port 98.

The second hybrid coupler 20 is operable to split the RF transmission input signal 30 into a first RF QHTS 116 and a second RF QHTS 118. In this manner, the first RF QHTS 116 and the second RF QHTS 118 have approximately the same power ratio with respect to the RF transmission input signal 30, but have a quadrature phase difference of approximately 90 degrees or $\pi/2$ radians. The first RF QHTS 116 is output from the fifth port 94, and the second RF QHTS 118 is output from the sixth port 96. In the embodiment shown in FIG. 3C, the seventh port 98 is phase-aligned with the fifth port 94, while the seventh port 98 has a quadrature phase shift with respect to the sixth port 96. Thus, the first RF QHTS 116 is approximately phase-aligned with the RF transmission input signal 30, but there is a quadrature phase difference between the RF transmission input signal 30 and the second RF QHTS 118.

Note that in alternative embodiments, this may or may not be the case. For example, there may be a phase shift between the seventh port 98 and the fifth port 94. The phase shift between the seventh port 98 and the sixth port 96 may then be equal to this phase shift plus the quadrature phase shift of approximately 90 degrees or $\pi/2$ radians. Accordingly, so long as the phase difference between the first RF QHTS 116 and the second RF QHTS 118 is about 90 degrees or $\pi/2$ radians, phase alignment between the fifth port 94 and the seventh port 98, and between the sixth port 96 and the seventh port 98, can vary.

The first RF QHTS 116 is output at the fifth port 94 to the first RF filter 38A of the RF filter circuit 22. Additionally, the second RF QHTS 118 is output at the sixth port 96 to the second RF filter 38B of the RF filter circuit 22. The first RF filter 38A is coupled to the fifth port 94 so as to receive the first RF QHTS 116 from the second hybrid coupler 20. The second RF filter 38B is coupled to the sixth port 96 so as to receive the second RF QHTS 118 from the second hybrid coupler 20. In this embodiment, the second RF filter 38B is configured to provide a differential phase shift to the second RF QHTS 118. Accordingly, when the first RF QHTS 116 and the second RF QHTS 118 are output from the RF filter circuit 22, the phase difference between the first RF QHTS 116 and the second RF QHTS 118 is approximately 270 degrees or 3/2π radians.

Referring again to FIG. 3C, the tuning circuit 69 is configured to tune the frequency response of the RF filter circuit 22 so that the passband 62 includes the RF communication band of the RF transmission input signal 30. The tuning circuit 69 thus shifts the passband 62 of the first RF filter 38A and the second RF filter 38B to include the RF communication band of the RF transmission input signal 30. In this manner, the RF filter circuit 22 is operable to pass the first RF QHTS 116 and the second RF QHTS 118 to the first hybrid coupler 18. More specifically, by placing the passband 62 in the RF transmission band, the RF filter circuit 22 passes the first RF QHTS 116 and the second RF QHTS 118 to the first hybrid coupler 18. In this particular embodiment, the first RF filter 38A passes the first RF QHTS 116 to the first hybrid coupler 18, while the second RF filter 38B passes the second RF QHTS 118 to the first hybrid coupler 18. Spurious emissions of the first RF QHTS 116 and the second RF QHTS 118 are reflected back to the second hybrid coupler 20. The impedance termination 24 is coupled to the eighth port 100 of the second hybrid coupler 20. The impedance termination 24 may be a 50 Ohm load. Due to the phase-shifting provided by the second hybrid coupler 20, the spurious emissions in the RF receive band see a very high (theoretically infinite) impedance level at the seventh port 98, but only the impedance termination 24 at the eighth port 100. Thus, the spurious emissions are aggregated to be the aggregated noise signal 110 at the eighth port 100. This aggregated noise signal 110 is dissipated by the impedance termination 24.

Referring again to FIG. 3C, the first hybrid coupler 18 receives the first RF QHTS 116 from the first RF filter 38A at the third port 90. The second RF QHTS 118 is received by the first hybrid coupler 18 from the second RF filter 38B at the fourth port 92. As discussed above, the first RF QHTS 116 and the second RF QHTS 118 have a phase difference of about 270 degrees or 3π/2 radians when received by the first hybrid coupler 18. Thus, for example, if the first RF QHTS 116 has a phase of zero degrees, the second RF QHTS 118 would have a phase of approximately 270 degrees (or 3π/2 radians). From the fourth port 92 to the second port 88, the first hybrid coupler 18 provides no phase shift. Alternatively, the first hybrid coupler 18 may be configured to provide a phase shift from the third port 90 to the first port 86 of Δ.

The first hybrid coupler 18 shown in FIG. 3C is configured to provide a quadrature phase shift from the third port 90 to the second port 88. In this example, the phase shift is 90 degrees (or π/2 radians), and thus the second RF QHTS 118 has a phase, as seen from the second port 88, of 270 degrees (note that the second RF QHTS 118 was received with a phase of 270 degrees in this example, and thus is seen with a phase of 270 degrees). Alternatively, the phase shift from the fourth port 92 to the second port 88 may be Δ+90 degrees (or π/2 radians). In any case, the phase difference between the first RF QHTS 116 and the second RF QHTS 118 as seen from the second port 88 is about 180 degrees (note that the first RF QHTS 116 was received with a phase of 0 degrees and thus is seen with a phase of 90 degrees at the second port 88 with quadrature phase shift of 90 degrees between the third port 90 and the second port 88). Accordingly, the quadrature phase shift at the second port 88 from the third port 90 and the differential phase shift of the second RF filter 38B results in destructive interference between the first RF QHTS 116 and the second RF QHTS 118 at the second port 88. As a result, the first RF QHTS 116 and the second RF QHTS 118 are substantially cancelled at the second port 88. In this manner, the second port 88 is substantially isolated from transmission signal flow for the RF transmission input signal 30 and the RF transmission output signal 34.

The first hybrid coupler 18 is configured to output the RF transmission output signal 34 from the first port 86 in response to the first RF QHTS 116 being received from the RF filter circuit 22 at the third port 90 and the second RF QHTS 118 being received from the RF filter circuit 22 at the fourth port 92. In this particular embodiment, the first hybrid coupler 18 is configured to pass the second RF QHTS 118 from the fourth port 92 to the first port 86. The first hybrid coupler 18 provides a quadrature phase shift to the second RF QHTS 118 from the fourth port 92 to the first port 86. The second RF QHTS 118 is thus passed with a phase of 360 degrees to the first port 86 since the second RF QHTS 118 was received at the fourth port 92 with a phase of approximately 270 degrees. Alternatively, the first hybrid coupler 18 may provide a phase shift of Δ to the second RF QHTS 118 when passed from the fourth port 92 to the first port 86. The first hybrid coupler 18 is configured to pass the first RF QHTS 116 from the third port 90 to the first port 86. The first hybrid coupler 18 provides no phase shift to the first RF QHTS 116 at the first port 86. Thus, the first RF QHTS 116 has a phase of approximately zero at the first port 86. Alternatively, if a phase shift of Δ+90 degrees (or π/2 radians) 90 degrees (or π/2 radians) were provided to the second RF QHTS 118 from the fourth port 92 to the first port 86, the quadrature phase shift would be Δ.

Accordingly, the first RF QHTS 116 is provided substantially as a duplicate of the second RF QHTS 118 at the first port 86. As a result, the first RF QHTS 116 and the second RF QHTS 118 constructively interfere at the first port 86 to output the RF transmission output signal 34 from the first port 86. Note that since the first RF QHTS 116 and the second RF QHTS 118 substantially cancel at the second port 88 due to destructive interference, very little or no power is transferred from the first RF QHTS 116 and the second RF QHTS 118 to the second port 88. Instead most, if not all, of the power in the first RF QHTS 116 and the second RF QHTS 118 is transferred to the first port 86 and provided in the RF transmission output signal 34.

Figure 3D:
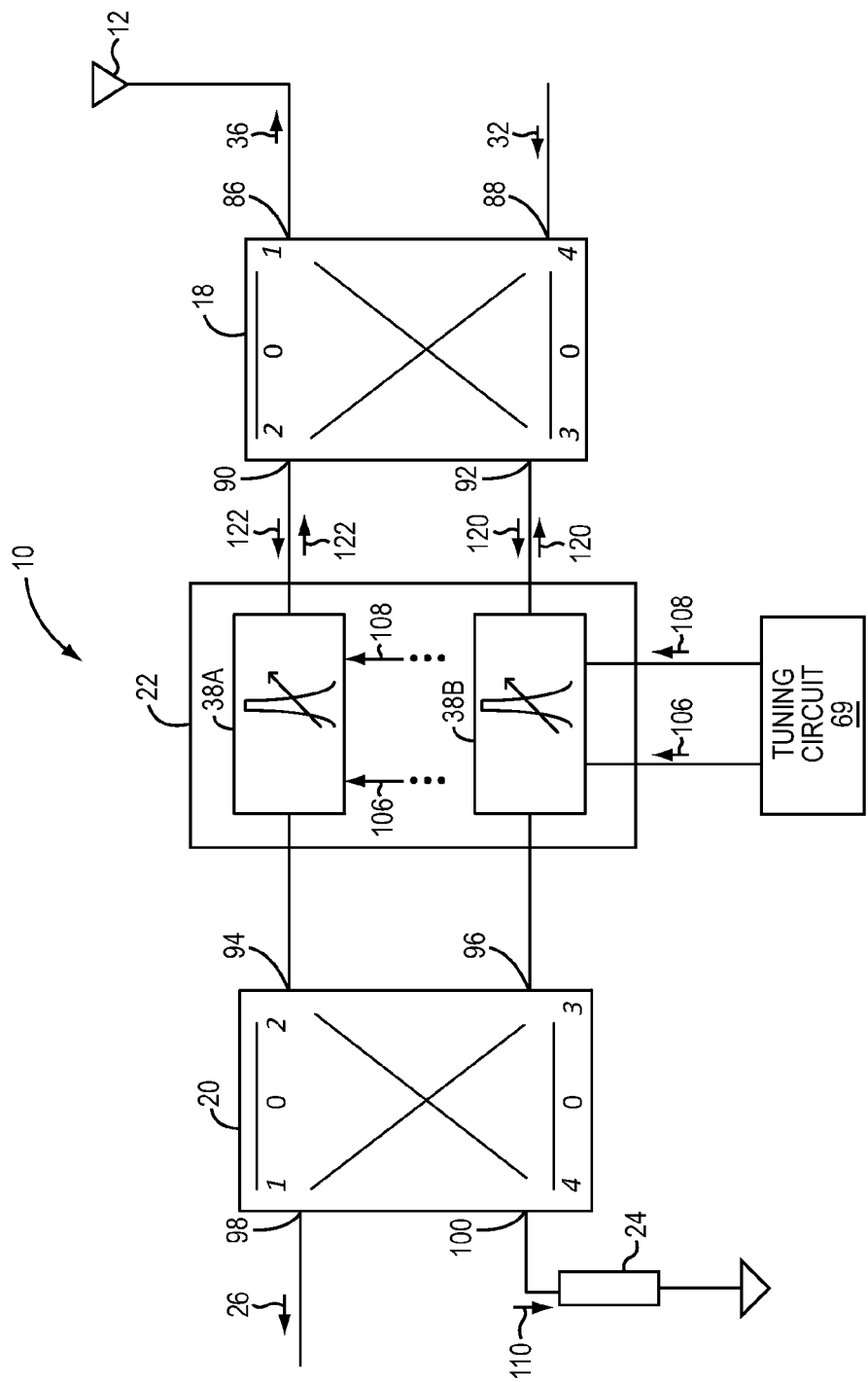
FIG. 3D illustrates a transmission signal flow for the other RF transmission signal described in FIG. 2B

FIG. 3D illustrates the tunable RF diplexer 10 along with the transmission signal flow of the tunable RF diplexer 10 with respect to the procedures 2002, 2014-2020 shown in FIG. 2B for the RF transmission input signal 32 and the RF transmission output signal 36. The procedures 2000, 2004-2012 and the procedures for the RF transmission input signal 30 and the RF transmission output signal 34 shown in FIG. 2B and illustrated in FIG. 3A can performed simultaneously with the procedures 2002, 2014-2020 shown in FIG. 2B and illustrated in FIG. 3D. Thus, FIG. 3C and FIG. 3D together illustrates transmission flow diplexing for the tunable RF diplexer 10. As shown in FIG. 3B, the first hybrid coupler 18 is operable to receive the RF transmission input signal 32 at the second port 88. The RF transmission input signal 32 operates within the same RF communication band as the RF receive band of the RF receive input signal 16 (see FIG. 3B). The first hybrid coupler 18 is operable to split the RF transmission input signal 32 into the first RF QHTS 120 and the second RF QHTS 122. Since the first RF QHTS 120 and the second RF QHTS 122 are quadrature hybrids, the first RF QHTS 120 and the second RF QHTS 122 are approximately equal in power, but have a quadrature phase difference of 90 degrees or $\pi/2$ radians. The first hybrid coupler 18 is operable to output the first RF QHTS 120 from the fourth port 92 and to output the second RF QHTS 122 from the third port 90 in response to receiving the RF transmission input signal 32 at the second port 88.

In the embodiment illustrated in FIG. 3D, the first RF QHTS 120 is phase-aligned with the RF transmission input signal 32, while the second RF QHTS 122 has a phase difference of about 90 degrees with respect to the RF transmission input signal 32. It should be noted that this may or may not be the case. For example, in alternative embodiments, a phase shift of $\Delta$ (i.e., +45 degrees or $\pi/4$ radians) may be provided between the second port 88 and the fourth port 92, and thus, a phase shift of $\Delta \pm 90$ degrees (or $\pi/2$ radians) would be provided between the second port 88 and the third port 90.

The RF filter circuit 22 is operable to reflect the first RF QHTS 120 and the second RF QHTS 122. As discussed above, the frequency response of the RF filter circuit 22 defines the stopband 66, and the RF filter circuit 22 is tunable so as to shift the stopband. For example, the stopband 66 may be a notch that is shiftable. The tuning circuit 69 is configured to tune the frequency response of the first RF filter 38A and the second RF filter 38B of RF filter circuit 22 so that the signal bandwidth of the first RF QHTS 120 and the signal bandwidth of the second RF QHTS 122 are each within the stopband. For instance, the tuning circuit 69 may be configured to place the notch within the RF communication band of the RF transmission input signal 32 so that the notch is centered at the RF transmission signal frequency of the RF transmission input signal 32. In this embodiment, the tuning circuit 69 generates the stopband tuning control output 108.

Since the tuning circuit 69 has tuned the frequency response of the RF filter circuit 22 so that the stopband 66 includes the RF transmission signal band, the RF filter circuit 22 blocks the first RF QHTS 120 and the second RF QHTS 122. Accordingly, the second hybrid coupler 20 is substantially isolated from the transmission signal flow of the RF transmission input signal 32 and the RF transmission output signal 34. The second RF filter 38B then reflects the first RF QHTS 120, and the first RF filter 38A reflects the second RF QHTS 122 back to the first hybrid coupler 18. In the embodiment illustrated in FIG. 3D, the second RF filter 38B reflects the first RF QHTS 120 back to the first hybrid coupler 18 at the fourth port 92. The first RF filter 38A reflects the second RF QHTS 122 back to the first hybrid coupler 18 at the third port 90.

The first hybrid coupler 18 is configured to combine the first RF QHTS 120 and the second RF QHTS 122 into the RF transmission output signal 36 at the first port 86. To combine the first RF QHTS 120 and the second RF QHTS 122 into the RF transmission output signal 36, the first hybrid coupler 18 is configured to pass the first RF QHTS 120 from the fourth port 92 to the first port 86. Additionally, the first hybrid coupler 18 is configured to pass the second RF QHTS 122 from the third port 90 to the first port 86. However, the first hybrid coupler 18 provides a quadrature phase shift to the first RF QHTS 120 from the fourth port 92 to the first port 86. Thus, the first RF QHTS 120 is provided substantially as a duplicate of the second RF QHTS 122 at the first port 86. For example, if the phase of the second RF QHTS 122 is 90 degrees at the third port 90, the first RF QHTS 120 has a phase of 90 degrees at the first port 86, since the phase of the first RF QHTS 120 was zero degrees at the fourth port 92. More specifically, due to the quadrature phase shift between the fourth port 92 and the first port 86, the first RF QHTS 120 has a phase of about 90 degrees at the first port 86 just like the second RF QHTS 122. Accordingly, the first RF QHTS 120 and the second RF QHTS 122 constructively interfere at the first port 86 to output the RF transmission output signal 36 from the first port 86.

Also, note that the first hybrid coupler 18 is configured such that the quadrature phase shift at the second port 88 results in destructive interference between the first RF QHTS 120 and the second RF QHTS 122. Referring again to the previous example provided, at the second port 88, the first RF QHTS 120 appears to have a phase of zero degrees, but the second RF QHTS 122 appears to have a phase of 180 degrees. As a result, the first RF QHTS 120 and the second RF QHTS 122 are substantially cancelled at the second port 88. Consequently, most, if not all, of the power of the first RF QHTS 120 and the second RF QHTS 122 is transferred to the first port 86 and provided in the RF transmission output signal 36. The first hybrid coupler 18 is thus configured to output the RF transmission output signal 36 from the first port 86 in response to the first RF QHTS 120 being reflected back by the RF filter circuit 22 to the fourth port 92 and the second RF QHTS 122 being reflected back by the RF filter circuit 22 to the third port 90.

It should be noted that due to the differential phase shift provided by the second RF filter 38B, isolation is provided between the second port 88 for one of the RF communication bands and the seventh port 98 for the other one of the diplexed RF frequency bands. Given that the differential phase shift is provided between the fourth port 92 of the first hybrid coupler 18 and the sixth port 96 of the second hybrid coupler 20, the tunable RF diplexer 10 provides isolation between the second port 88 and the seventh port 98 by assuring that matching of $S(2,4)_{18}*S(1,2)_{20}=S(3,4)_{18}*S(1,3)_{20}$. As a result of the differential phase shift provided by the second RF filter 38B, the isolation relies on the same sum term of the transmission signal flow which remains approximately true over broad frequency range and thus provides better broadband isolation for transmission diplexing. In addition to the improved isolation for receive and transmission diplexing, providing the differential phase shift improves the performances of the tunable RF diplexer 10 by tuning the impedance termination 24 to match a load of the antenna 12.

Figure 4:
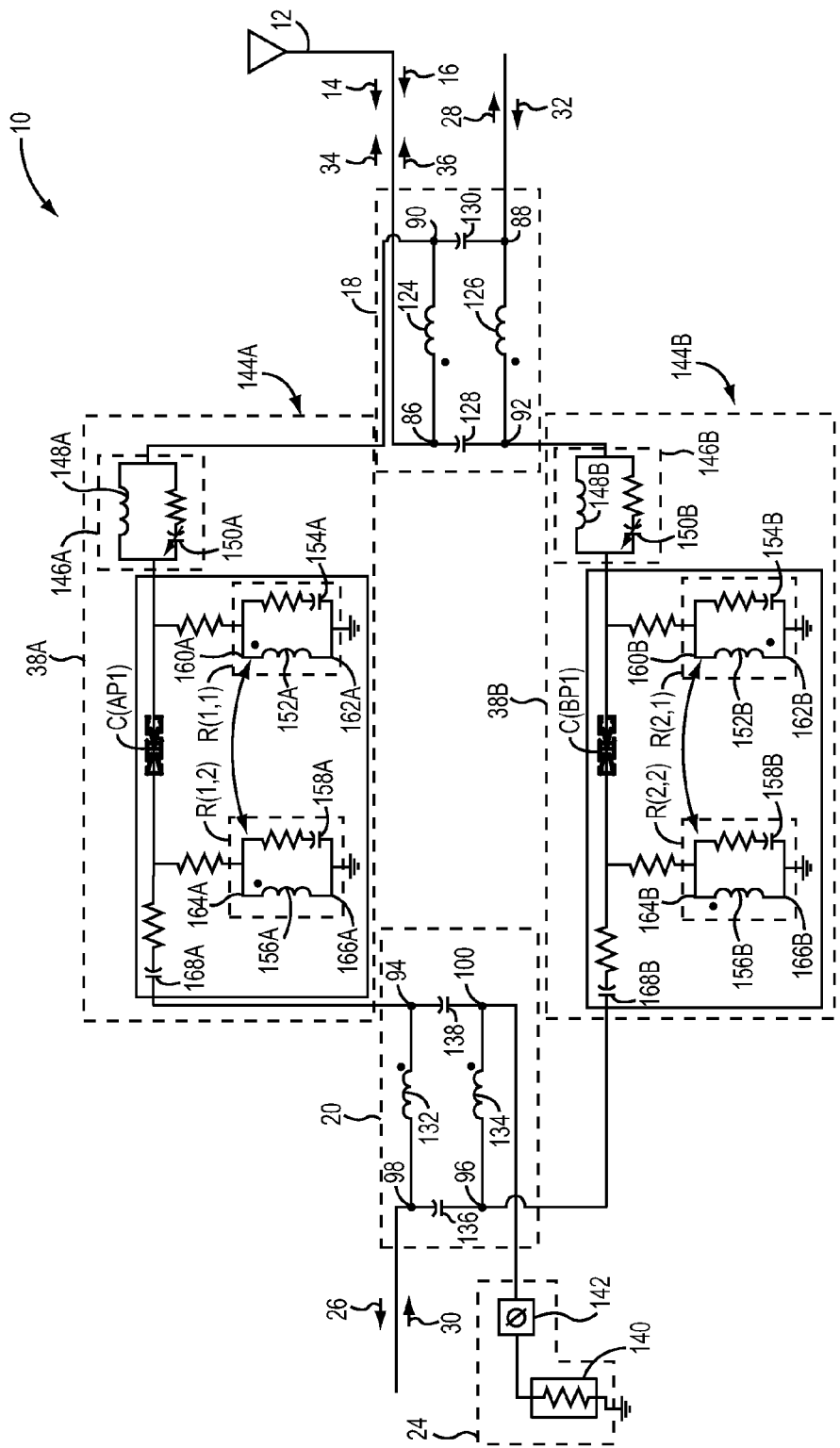
FIG. 4 illustrates an example of the tunable RF diplexer shown in FIG. 1, wherein the phase inversion component is provided by weakly coupled resonators within an RF filter path.

FIG. 4 illustrates a circuit diagram of one embodiment of the tunable RF diplexer 10 shown in FIG. 1 and FIGS. 3A-3D. In this embodiment, the first hybrid coupler 18 and the second hybrid coupler 20 are both lumped-element circuits formed as an LCCL network. With regards to the first hybrid coupler 18, the first port 86, the second port 88, the third port 90, and the fourth port 92 are each provided as nodes. An inductor 124 is connected between the first port 86 and the third port 90 while an inductor 126 is coupled between the second port 88 and the fourth port 92. The inductor 124 and the inductor 126 are mutually magnetically coupled to one another. A capacitor 128 is connected between the first port 86 and the fourth port 92 while a capacitor 130 is connected between the third port 90 and the second port 88. In this manner, the appropriate quadrature phase shifts are provided, as described above with respect to FIGS. 3A-3D. With regards to the second hybrid coupler 20, the fifth port 94, the sixth port 96, the seventh port 98, and the eighth port 100 are also each provided as nodes. An inductor 132 is connected between the fifth port 94 and the seventh port 98, while an inductor 134 is coupled between the sixth port 96 and the eighth port 100. The inductor 132 and the inductor 134 are mutually magnetically coupled to one another. A capacitor 136 is connected between the seventh port 98 and the sixth port 96 while a capacitor 138 is connected between the fifth port 94 and the eighth port 100. In this manner, the appropriate quadrature phase shifts are provided, as described above with respect to FIGS. 3A-3D. An embodiment of the impedance termination 24 is also shown. In this example, the impedance termination 24 is provided as a resistor 140 and a phase shifter 142. By adjusting a phase of the phase shifter 142, the impedance load of the impedance termination 24 can be kept at the appropriate characteristic impedance.

An embodiment of the first RF filter 38A and the second RF filter 38B are also shown in FIG. 4. The first RF filter 38A includes a parallel resonator 146A coupled in series with the third port 90. Additionally, the second RF filter 38B includes a parallel resonator 146B coupled in series with the fourth port 92. As such, the stopband 66 of both the first RF filter 38A and the second RF filter 38B are each provided as a notch. The parallel resonator 146A and the parallel resonator 146B are thus each an RF notch filter. To provide the passband 62, both the first RF filter 38A and the second RF filter 38B use weakly coupled resonators. With regard to the first RF filter 38A, the first RF filter 38A forms a tunable RF filter path 144A shown in FIG. 4 connected between the third port 90 of the first hybrid coupler 18 and the fifth port 94 of the second hybrid coupler 20. In order to provide the stopband 66 of the first RF filter 38A, the first RF filter 38A includes the parallel resonator 146A coupled in series with the third port 90 of the first hybrid coupler 18. The parallel resonator 146A includes an inductor 148A and a variable capacitive structure 150A. As such, the stopband 66 of the first RF filter 38A is provided as a notch. The variable capacitive structure 150A has a variable capacitance that is adjusted by the stopband tuning control output 108. In this manner, the stopband 66 of the first RF filter 38A can be shifted into the RF communication band of the RF receive input signal 16, the RF receive output signal 28, the RF transmission input signal 32, and the RF transmission output signal 36.

With regards to providing the passband 62 of the first RF filter 38A, the tunable RF filter path 144A includes an embodiment of a resonator R(1,1) and an embodiment of a resonator R(1,2). The resonator R(1,1) and the resonator R(1,2) are weakly coupled to one another. More specifically, the resonator R(1,1) includes an inductor 152A and a capacitive structure 154A. The resonator R(1,2) includes an inductor 156A and a capacitive structure 158A.

The resonator R(1,1) and the resonator R(1,2) are a pair of weakly coupled resonators. The resonator R(1,1) and the resonator R(1,2) are weakly coupled by providing the inductor 152A and the inductor 156A such that the inductor 152A and the inductor 156A have a weak mutual coupling. Although the resonator R(1,1) and the resonator R(1,2) are weakly coupled, the inductor 156A has a maximum lateral width and a displacement from the inductor 152A that is less than or equal to half the maximum lateral width of the inductor 156A. As such, the inductor 152A and the inductor 156A are relatively close to one another. The displacement between the inductor 152A and the inductor 156A may be measured from a geometric centroid of the inductor 152A to a geometric centroid of the inductor 156A. The maximum lateral width may be a maximum dimension of the inductor 156A along a plane defined by its largest winding. The weak coupling between the inductor 152A and the inductor 156A is obtained through topological techniques. For example, the inductor 152A and the inductor 156A may be fully or partially aligned, where winding(s) of the inductor 152A and winding(s) of the inductor 156A are configured to provide weak coupling through cancellation. Alternatively or additionally, a plane defining an orientation of the winding(s) of the inductor 152A and a plane defining an orientation of the winding(s) of the inductor 156A may be fully or partially orthogonal to one another. Some of the magnetic couplings between the resonators R can be unidirectional (passive or active). This can significantly improve isolation (e.g., isolation in diplexers). In other embodiments, topological techniques are not used to provide weak mutual coupling between the inductor 152A and the inductor 156A. Rather, the inductor 152A and the inductor 156A are weakly mutually coupled by being sufficiently far apart.

To maximize the quality (Q) factor of the tunable RF filter paths 144A through 68, most of the total mutual coupling should be realized magnetically, and only fine-tuning is provided electrically. While the magnetic coupling can be adjusted only statically, with a new layout design, the electric coupling can be tuned on the fly (after fabrication). The filter characteristics (e.g., bias network structure, resonator capacitance) can be adjusted based on given coupling coefficients to maximize filter performance.

To provide a tuning range to tune the passband 62 of the tunable RF filter path 144A and provide a fast roll-off from a low-frequency side to a high-frequency side of the transfer function, the tunable RF filter path 144A is configured to change a sign of a total mutual coupling coefficient between the resonator R(1,1) and the resonator R(1,2). Accordingly, the tunable RF filter path 144A includes a cross-coupling capacitive structure C(AP1). As shown in FIG. 4, the cross-coupling capacitive structure C(AP1) is electrically connected in the tunable RF filter path 144A between the resonator R(1,1) and the resonator R(1,2) so as to provide a variable coupling coefficient between the resonator R(1,1) and the resonator R(1,2). The cross-coupling capacitive structure C(AP1) is a variable cross-coupling capacitive structure configured to vary the coupling coefficient provided between the resonator R(1,1) and the resonator R(1,2). The passband tuning control output 106 is provided to the cross-coupling capacitive structure C(AP1) to adjust the variable coupling coefficient and thereby shift the passband 62 into the RF communication band of the RF receive input signal 14, the RF receive output signal 26, the RF transmission input signal 30, and the RF transmission output signal 34.

In the resonator R(1,1), the inductor 152A and the capacitive structure 154A are electrically connected in parallel. More specifically, the inductor 152A has an end 160A and an end 162A, which are disposed opposite to one another. The ends 160A, 162A are each electrically connected to the capacitive structure 154A, which is grounded. Thus, the resonator R(1,1) is a single-ended resonator. The inductor 156A is also electrically connected in parallel to the capacitive structure 158A. More specifically, the inductor 156A has an end 164A and an end 166A, which are disposed opposite to one another. The ends 164A, 166A are each electrically connected to the capacitive structure 158A, which is grounded.

As shown in FIG. 4, the inductor 152A and the inductor 156A are mutually magnetically coupled so as to have a non-inverting mutual coupling and the no phase inversion is provided by the first RF filter 38A. In this embodiment, the resonator R(1,1) and the resonator R(1,2) are single-ended resonators. The inductor 152A is magnetically coupled to the inductor 156A such that an RF signal received at the end 160A of the inductor 152A with a voltage polarity (i.e., either a positive voltage polarity or a negative voltage polarity) results in a filtered RF signal being transmitted out the end 164A of the inductor 156A with the same voltage polarity. Also, the inductor 156A is magnetically coupled to the inductor 152A such that an RF signal received at the end 164A of the inductor 156A with a voltage polarity (i.e., either a positive voltage polarity or a negative voltage polarity) results in a filtered RF signal being transmitted out the end 160A of the inductor 152A with the same voltage polarity. This is indicated in FIG. 4 by the dot convention where a dot is placed at the end 160A of the inductor 152A, and a dot is placed at the end 164A of the inductor 156A. Additionally, the inductors 152A, 156A may be magnetically coupled so as to have a low magnetic coupling coefficient through field cancellation, with the variable coupling coefficient. In this case, the inductor 152A and the inductor 156A are arranged such that the inductor 156A reduces a mutual magnetic coupling coefficient of the inductor 152A.

The resonator R(1,2) is operably associated with the resonator R(1,1) such that an energy transfer factor between the resonator R(1,1) and the resonator R(1,2) is less than 10%. Thus, the resonator R(1,1) and the resonator R(1,2) are weakly coupled. A total mutual coupling between the resonator R(1,1) and the resonator R(1,2) is provided by a sum total of the mutual magnetic factor between the resonator R(1,1) and the resonator R(1,2) and the mutual electric coupling coefficient is between the resonator R(1,1) and the resonator R(1,2). In this embodiment, the mutual magnetic coupling coefficient between the inductor 152A and the inductor 156A is a fixed mutual magnetic coupling coefficient. Although embodiments of the resonators R(1,1), R(1,2) may be provided so as to provide a variable magnetic coupling coefficient between the resonators R(1,1), R(1,2), embodiments of the resonators R(1,1), R(1,2) that provide variable magnetic couplings can be costly and difficult to realize. However, providing variable electric coupling coefficients is easier and more economical. Thus, using the cross-coupling capacitive structure C(AP1) to provide the variable electric coupling coefficient is an economical technique for providing a tunable filter characteristic between the resonators R(1,1), R(1,2). Furthermore, since the mutual magnetic coupling coefficient between the inductor 152A and the inductor 156A is fixed, the tunable RF filter path 144A has lower insertion losses. A matching capacitor 168A is connected in series with the fifth port 94 of the first hybrid coupler 18.

With regard to the second RF filter 38B, the second RF filter 38B forms a tunable RF filter path 144B shown in FIG. 4 connected between the fourth port 92 of the first hybrid coupler 18 and the sixth port 96 of the second hybrid coupler 20. In order to provide the stopband 66 of the second RF filter 38B, the second RF filter 38B includes a parallel resonator 146B coupled in series with the third port 90 of the first hybrid coupler 18. The parallel resonator 146B includes an inductor 148B and a variable capacitive structure 150B. As such the stopband 66 is provided as a notch. The variable capacitive structure 150B has a variable capacitance that is adjusted by the stopband tuning control output 108. In this manner, the stopband 66 can be shifted into the RF communication band of the RF receive input signal 16, the RF receive output signal 28, the RF transmission input signal 32, and the RF transmission output signal 36.

With regards to providing the passband 62 of the second RF filter 38B, the tunable RF filter path 144B includes an embodiment of a resonator R(2,1) and an embodiment of a resonator R(2,2). The resonator R(2,1) and the resonator R(2,2) are weakly coupled to one another. More specifically, the resonator R(2,1) includes an inductor 152B and a capacitive structure 154B. The resonator R(2,2) includes an inductor 156B and a capacitive structure 158B.

The resonator R(2,1) and the resonator R(2,2) are a pair of weakly coupled resonators. The resonator R(2,1) and the resonator R(2,2) are weakly coupled by providing the inductor 152B and the inductor 156B such that the inductor 152B and the inductor 156B have a weak mutual coupling. Although the resonator R(2,1) and the resonator R(2,2) are weakly coupled, the inductor 156B has a maximum lateral width and a displacement from the inductor 152B that is less than or equal to half the maximum lateral width of the inductor 156B. As such, the inductor 152B and the inductor 156B are relatively close to one another. The displacement between the inductor 152B and the inductor 156B may be measured from a geometric centroid of the inductor 152B to a geometric centroid of the inductor 156B. The maximum lateral width may be a maximum dimension of the inductor 156B along a plane defined by its largest winding. The weak coupling between the inductor 152B and the inductor 156B is obtained through topological techniques. For example, the inductor 152B and the inductor 156B may be fully or partially aligned, where winding(s) of the inductor 152B and winding(s) of the inductor 156B are configured to provide weak coupling through cancellation. Alternatively or additionally, a plane defining an orientation of the winding(s) of the inductor 152B and a plane defining an orientation of the winding(s) of the inductor 156B may be fully or partially orthogonal to one another. Some of the magnetic couplings between the resonators R can be unidirectional (passive or active). This can significantly improve isolation (e.g., isolation in diplexers). In other embodiments, topological techniques are not used to provide weak mutual coupling between the inductor 152B and the inductor 156B. Rather, the inductor 152B and the inductor 156B are weakly mutually coupled by being sufficiently far apart.

To maximize the quality (Q) factor of the tunable RF filter paths 144B through 68, most of the total mutual coupling should be realized magnetically, and only fine-tuning is provided electrically. This also heLFS to reduce common-mode signal transfer in the differential resonators and thus keeps the Q factor high. While the magnetic coupling can be adjusted only statically, with a new layout design, the electric coupling can be tuned on the fly (after fabrication). The filter characteristics (e.g., bias network structure, resonator capacitance) can be adjusted based on given coupling coefficients to maximize filter performance.

To provide a tuning range to tune the passband 62 of the tunable RF filter path 144B and provide a fast roll-off from a low-frequency side to a high-frequency side of the transfer function, the tunable RF filter path 144B is configured to change a sign of a total mutual coupling coefficient between the resonator R(2,1) and the resonator R(2,2). Accordingly, the tunable RF filter path 144B includes a cross-coupling capacitive structure C(BP1). As shown in FIG. 4, the cross-coupling capacitive structure C(BP1) is electrically connected in the tunable RF filter path 144B between the resonator R(2,1) and the resonator R(2,2) so as to provide a variable coupling coefficient between the resonator R(2,1)

and the resonator R(2,2). The cross-coupling capacitive structure C(BP1) is a variable cross-coupling capacitive structure configured to vary the coupling coefficient provided between the resonator R(2,1) and the resonator R(2,2). The passband tuning control output 106 is provided to the cross-coupling capacitive structure C(BP1) to adjust the variable coupling coefficient and thereby shift the passband 62 into the RF communication band of the RF receive input signal 14, the RF receive output signal 26, the RF transmission input signal 30, and the RF transmission output signal 34.

In the resonator R(2,1), the inductor 152B and the capacitive structure 154B are electrically connected in parallel. More specifically, the inductor 152B has an end 160B and an end 162B, which are disposed opposite to one another. The ends 160B, 162B are each electrically connected to the capacitive structure 154B, which is grounded. Thus, the resonator R(2,1) is a single-ended resonator. The inductor 156B is also electrically connected in parallel to the capacitive structure 158B. The inductor 156B has an end 164B and an end 166B, which are disposed opposite to one another. The ends 164B, 166B are each electrically connected to the capacitive structure 158B, which is grounded.

As shown in FIG. 4, the inductor 152B and the inductor 156B are mutually magnetically coupled so as to have a inverting mutual coupling and provide the differential phase inversion with the second RF filter 38B. The inductor 152B is magnetically coupled to the inductor 156B such that an RF signal received at the end 160B of the inductor 152B with a voltage polarity (i.e., either a positive voltage polarity or a negative voltage polarity) results in a filtered RF signal being transmitted out the end 166B of the inductor 156B with the same voltage polarity. Also, the inductor 156B is magnetically coupled to the inductor 152B such that an RF signal received at the end 164B of the inductor 156B with a voltage polarity (i.e., either a positive voltage polarity or a negative voltage polarity) results in a filtered RF signal being transmitted out the end 162B of the inductor 152B with the same voltage polarity. This is indicated in FIG. 4 by the dot convention where a dot is placed at the end 160B of the inductor 152B and a dot is placed at the end 164B of the inductor 156B. Additionally, the inductors 152B, 156B may be magnetically coupled so as to have a low magnetic coupling coefficient through field cancellation, with the variable coupling coefficient. In this case, the inductor 152B and the inductor 156B are arranged such that the inductor 156B reduces a mutual magnetic coupling coefficient of the inductor 152B.

The resonator R(2,2) is operably associated with the resonator R(2,1) such that an energy transfer factor between the resonator R(2,1) and the resonator R(2,2) is less than 10%. Thus, the resonator R(2,1) and the resonator R(2,2) are weakly coupled. A total mutual coupling between the resonator R(2,1) and the resonator R(2,2) is provided by a sum total of the mutual magnetic factor between the resonator R(2,1) and the resonator R(2,2) and the mutual electric coupling coefficients between the resonator R(2,1) and the resonator R(2,2). In this embodiment, the mutual magnetic coupling coefficient between the inductor 152B and the inductor 156B is a fixed mutual magnetic coupling coefficient. Although embodiments of the resonators R(2,1), R(2,2) may be provided so as to provide a variable magnetic coupling coefficient between the resonators R(2,1), R(2,2), embodiments of the resonators R(2,1), R(2,2) that provide variable magnetic couplings can be costly and difficult to realize. However, providing variable electric coupling coefficients is easier and more economical. Thus, using the cross-coupling capacitive structure C(BP1) to provide the variable electric coupling coefficients is an economical technique for providing a tunable filter characteristic between the resonators R(2,1), R(2,2). Furthermore, since the mutual magnetic coupling coefficient between the inductor 152B and the inductor 156B is fixed, the tunable RF filter path 144B has lower insertion losses. A matching capacitor 168B is connected in series with the sixth port 96 of the second hybrid coupler 20. In this embodiment, the resonator R(2,1) and the resonator R(2,2) are single-ended resonators.

Figure 5:
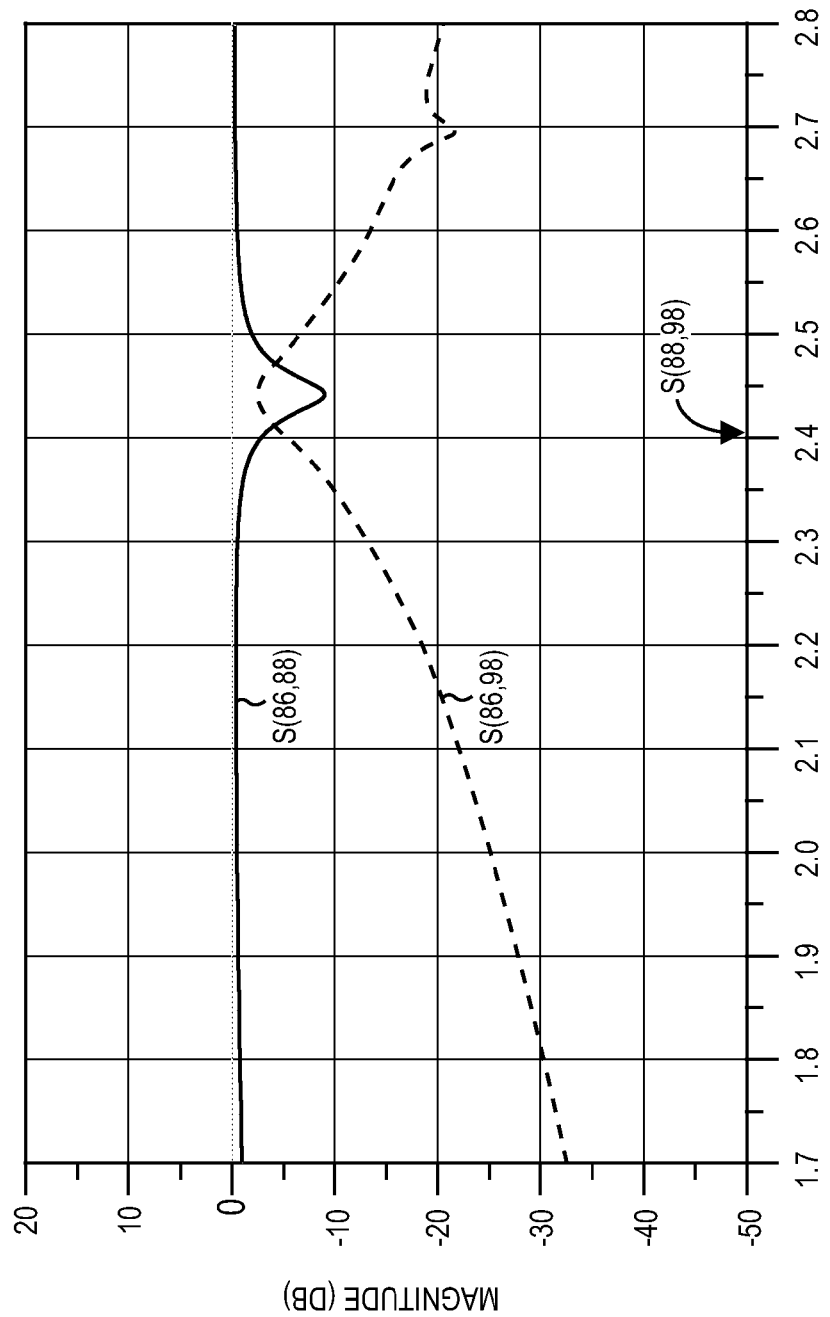
FIG. 5 is a frequency domain representation of S parameters for the tunable RF diplexer shown in FIG. 4.

FIG. 5 illustrates S parameters for the tunable RF diplexer 10 shown in FIG. 4 where the tunable RF diplexer 10 has been tuned to center the passband 62 of the first RF filter 38A and the second RF filter 38B in the ISM frequency band centered around 2.44 GHz. The stopband 66 of the first RF filter 38A and the second RF filter 38B is centered in MB/HB frequency bands from 1.7 GHz to 2.9 GHz. An S(86, 88) parameter is an S parameter of the tunable RF diplexer 10 between the first port 86 and the second port 88. The S(86,88) parameter shows that the transfer response of the tunable RF diplexer 10 remains at around 0 dB except around the ISM frequency band. Accordingly, the tunable RF diplexer 10 is configured to have small insertion losses in the MB/HB frequency bands between the first port 86 and the second port 88. An S(86, 98) parameter is an S parameter of the tunable RF diplexer 10 between the first port 86 and the seventh port 98. The S(86,98) parameter shows that the transfer response of the tunable RF diplexer 10 increases to around 0 dB in the ISM frequency band and decreases relatively quickly outside the ISM frequency band. Accordingly, the tunable RF diplexer 10 is configured to have small insertion losses in the ISM frequency bands between the first port 86 and the seventh port 98. An S(88, 98) parameter is an S parameter of the tunable RF diplexer 10 between the second port 88 and the seventh port 98. The S(88, 98) parameter is not explicitly shown because it remains below 50 dB and is −51.077 dB at the center frequency of the ISM band. The S(88,98) parameter shows that the transfer response of the tunable RF diplexer 10 provides improved isolation between the second port 88 for the MB/HB frequency bands and the seventh port 98 for the ISM frequency band due to the differential phase shift provided by the second RF filter 38B. Accordingly, the performance of the tunable RF diplexer 10 is enhanced by the differential phase shift.

Figure 6:
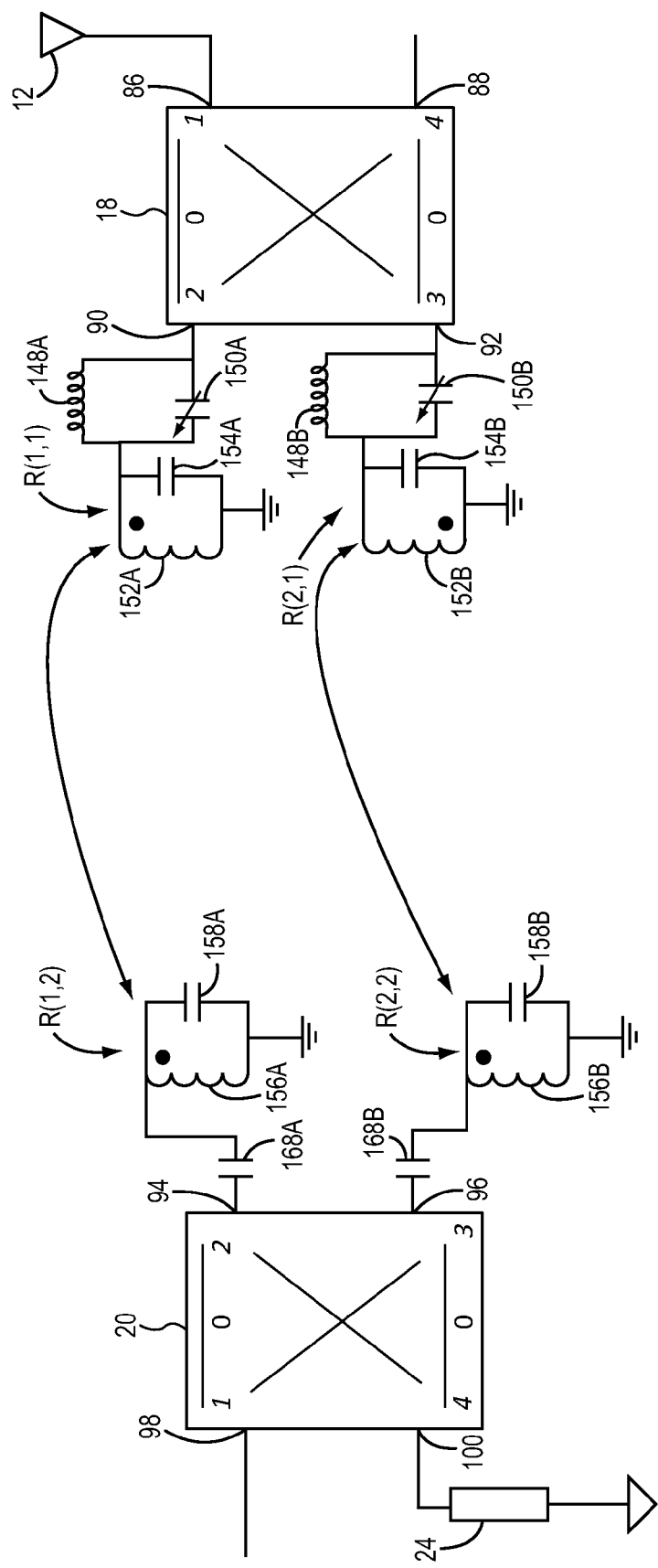
FIG. 6 illustrates another example of the tunable RF diplexer shown in FIG. 4 wherein the phase inversion component is provided by a single-ended transformer in the RF filter circuit.

FIG. 6 illustrates another embodiment of the tunable RF diplexer 10 shown in FIG. 1. The tunable RF diplexer 10 shown in FIG. 1 is similar to the embodiment shown in FIG. 4. However, in this embodiment, the inductor 152A of the resonator R(1,1) and the inductor 156A of the resonator R(1,2) form a first single-ended transformer. The resonator R(1,1) and the resonator R(1,2) are weakly coupled and are single-ended resonators, as explained above with respect to FIG. 4. Similarly, the inductor 152B of the resonator R(2,1) and the inductor 156B of the resonator R(2,2) also form a second single-ended transformer. The resonator R(2,1) and the resonator R(2,2) are weakly coupled, as explained above with respect to FIG. 4. The second single-ended transformer provided by the inductor 152B and the inductor 156B provides the differential phase shift between the fourth port 92 of the first hybrid coupler 18 and the sixth port 96 of the second hybrid coupler 20, as described above with respect to FIGS. 3A-3D. Since the first single-ended transformer and the second single ended transformer are provided in the first RF filter 38A and the second RF filter 38B, the capacitive structure C(PA1) (shown in FIG. 4) and the capacitive structure C(PB1) (shown in FIG. 4) are not provided.

Figure 7:
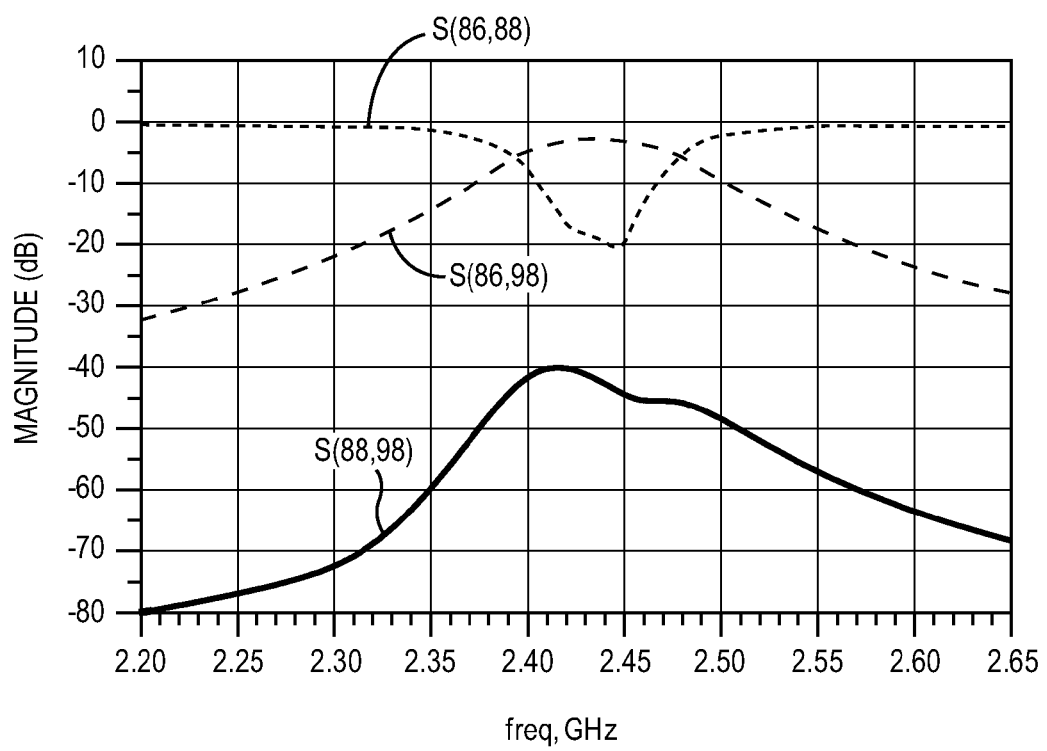
FIG. 7 illustrates a frequency domain representation of S parameters for the tunable RF diplexer shown in FIG. 6.

FIG. 7 illustrates S parameters for the tunable RF diplexer 10 shown in FIG. 6 where the tunable RF diplexer 10 has been provided to center the passband 62 of the first RF filter 38A, and the second RF filter 38B in the ISM frequency band is centered around 2.44 GHz. The stopband 66 of the first RF filter 38A and the second RF filter 38B is centered in MB/HB frequency bands from 1.7 GHz to 2.9 GHz. The S(86,88) parameter shows that the transfer response of the tunable RF diplexer 10 remains at around 0 dB except around the ISM frequency band. Accordingly, the tunable RF diplexer 10 is configured to have small insertion losses in the MB/HB frequency bands between the first port 86 and the second port 88. The S(86,98) parameter shows that the transfer response of the tunable RF diplexer 10 increases to around 0 dB in the ISM frequency band and decreases relatively quickly outside the ISM frequency band. Accordingly, the tunable RF diplexer 10 is configured to have small insertion losses in the ISM frequency bands between the first port 86 and the seventh port 98. The S(88, 98) remains below 40 dB and shows that the transfer response of the tunable RF diplexer 10 provides improved isolation between the second port 88 for the MB/HB frequency bands and the seventh port 98 for the ISM frequency band due to the differential phase shift provided by the second RF filter 38B. Accordingly, the performance of the tunable RF diplexer 10 is enhanced by the differential phase shift.

Figure 8:
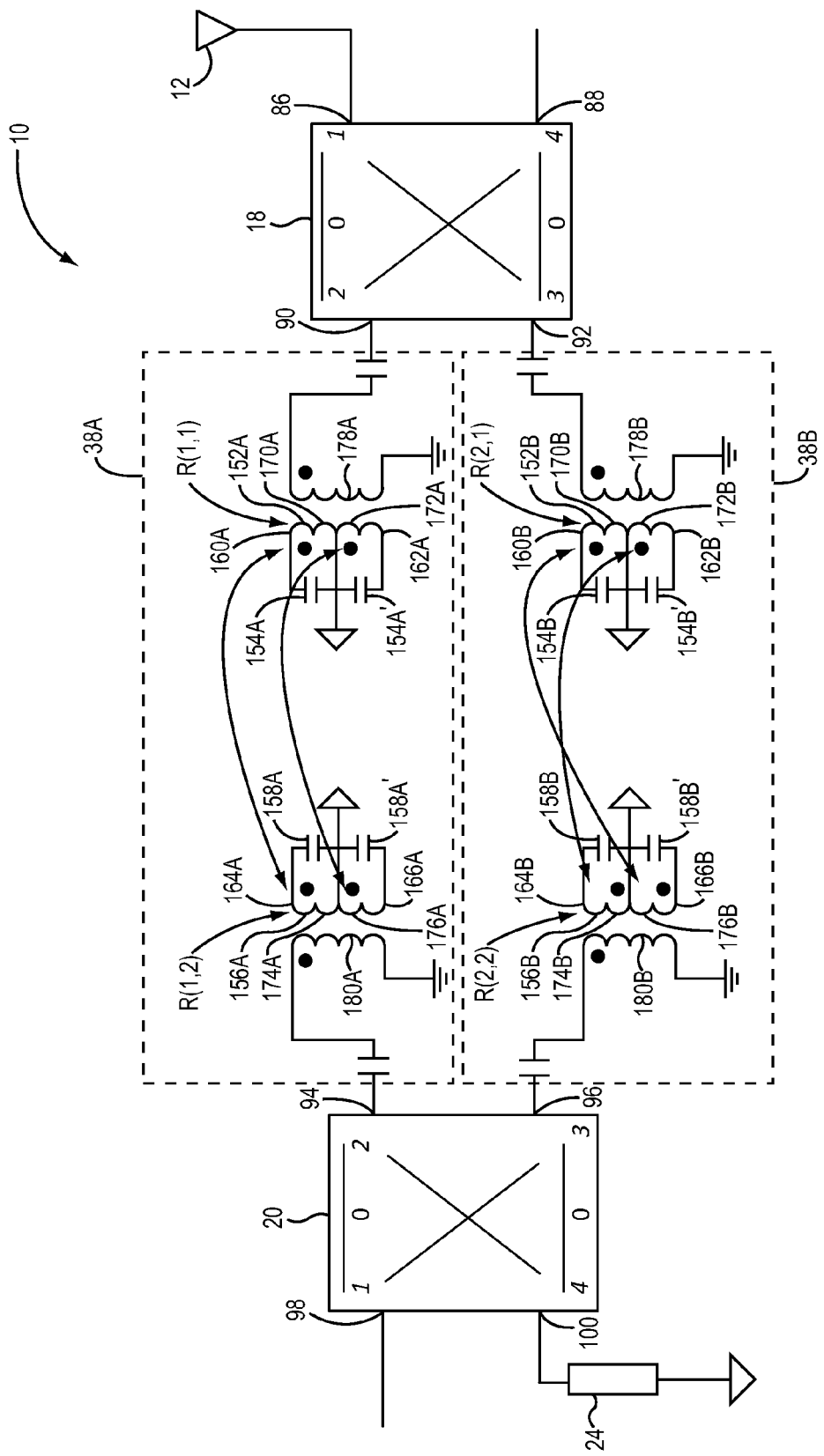
FIG. 8 illustrates yet another example of the tunable RF diplexer shown in FIG. 4 wherein the phase inversion component is provided by a differential transformer in the RF filter circuit.

FIG. 8 illustrates another embodiment of the tunable RF diplexer 10 shown in FIG. 1 and is similar to the embodiment illustrated in FIG. 4. With respect to the first RF filter 38A, the resonator R(1,1) and the resonator R(1,2) are weakly coupled resonators, as explained above. However, in this embodiment, the resonator R(1,1) is a differential resonator, and the resonator R(1,2) is a differential resonator. With regard to the resonator R(1,1) shown in FIG. 8, the inductor 152A has a grounded center tap so that the inductor 152A has an inductor portion 170A between the end 160A and the center tap, and an inductor portion 172A between the center tap and the end 162A. In this embodiment, the capacitive structure 154A is connected between the end 160A of the inductor 152A and ground. A capacitive structure 154A' is connected between the end 162A of the inductor 152A and ground. The resonator R(1,1) thus forms a differential resonator.

With regard to the resonator R(1,2) shown in FIG. 8, the inductor 156A has a grounded center tap so that the inductor 156A has an inductor portion 174A between the end 164A and the center tap, and an inductor portion 176A between the center tap and the end 166A. In this embodiment, the capacitive structure 158A is connected between the end 164A of the inductor 156A and ground. A capacitive structure 158A' is connected between the end 166A of the inductor 156A and ground. The resonator R(1,2) thus also forms a differential resonator.

The inductor 152A of the resonator R(1,1) and the inductor 156A of the resonator (1,2) form a differential transformer. The differential transformer provides no phase shift. More specifically, the inductor portion 170A of the inductor 152A is magnetically coupled to the inductor portion 174A of the inductor 156A. The inductor portion 172A of the inductor 152A is magnetically coupled to the inductor portion 176A of the inductor 156A. As such, a differential RF signal having a positive side signal received at the end 160A of the inductor 152A and a negative side being transmitted out of the end 162A of the inductor 152A results in a filtered differential RF signal having a positive side transmitted out the end 164A of the inductor 156A and a negative side transmitted into the end 166A of the inductor 156A. In this embodiment, the first RF filter 38A includes an inductor 178A that is coupled to the third port 90 of the first hybrid coupler 18. The inductor 178A is magnetically coupled to the inductor 154A of the resonator R(1,1) so that the inductor 178A and the inductor 154A form a single-ended to differential transformer. Similarly, the first RF filter 38A includes an inductor 180A coupled to the fifth port 94. The inductor 180A is magnetically coupled to the inductor 156A of the resonator R(1,2) so that the inductor 180A and the inductor 156A form another single-ended to differential transformer.

With respect to the second RF filter 38B, the resonator R(2,1) and the resonator R(2,2) are weakly coupled resonators, as explained above. However, in this embodiment, the resonator R(2,1) is a differential resonator, and the resonator R(2,2) is a differential resonator. With regard to the resonator R(2,1) shown in FIG. 8, the inductor 152B has a grounded center tap so that the inductor 152B has an inductor portion 170B between the end 160B and the center tap, and an inductor portion 172B between the center tap and the end 162B. In this embodiment, the capacitive structure 154B is connected between the end 160B of the inductor 152B and ground. A capacitive structure 154B' is connected between the end 162B of the inductor 152B and ground. The resonator R(2,1) thus forms a differential resonator.

With regard to the resonator R(2,2) shown in FIG. 8, the inductor 156B has a grounded center tap so that the inductor 156B has an inductor portion 174B between the end 164B and the center tap, and an inductor portion 176B between the center tap and the end 166B. In this embodiment, the capacitive structure 158B is connected between the end 164B of the inductor 156B and ground. A capacitive structure 158B' is connected between the end 166B of the inductor 156B and ground. The resonator R(2,2) thus also forms a differential resonator.

The inductor 152B of the resonator R(2,1) and the inductor 156B of the resonator (2,2) form a differential transformer. The differential transformer provides the differential phase shift discussed above with respect to FIGS. 3A-3D. More specifically, the inductor portion 170B of the inductor 152B is magnetically coupled to the inductor portion 176B of the inductor 156B. The inductor portion 172B of the inductor 152B is magnetically coupled to the inductor portion 174B of the inductor 156B. As such, a differential RF signal having a positive side signal received at the end 160B of the inductor 152B and a negative side being transmitted out of the end 162B of the inductor 152B results in a filtered differential RF signal having a positive side transmitted into the end 166B of the inductor 156B and a negative side transmitted out of the end 164B of the inductor 156B. Providing the differential phase shift with the differential transformer formed by the inductor 152B and the inductor 156B improves the performance of the tunable RF diplexer 10 shown in FIG. 9 since the differential transformer has less dependency on common mode inductances.

In this embodiment, the second RF filter 38B includes an inductor 178B that is coupled to the fourth port 92 of the first hybrid coupler 18. The inductor 178B is magnetically coupled to the inductor 152B of the resonator R(2,1) so that the inductor 178B and the inductor 152B form a single-ended to differential transformer. Similarly, the second RF filter 38B includes an inductor 180B coupled to the sixth port 96 of the second hybrid coupler 20. The inductor 180B is magnetically coupled to the inductor 156B of the resonator R(2,2) so that the inductor 180B and the inductor 156B form another single-ended to differential transformer.

Figure 9:
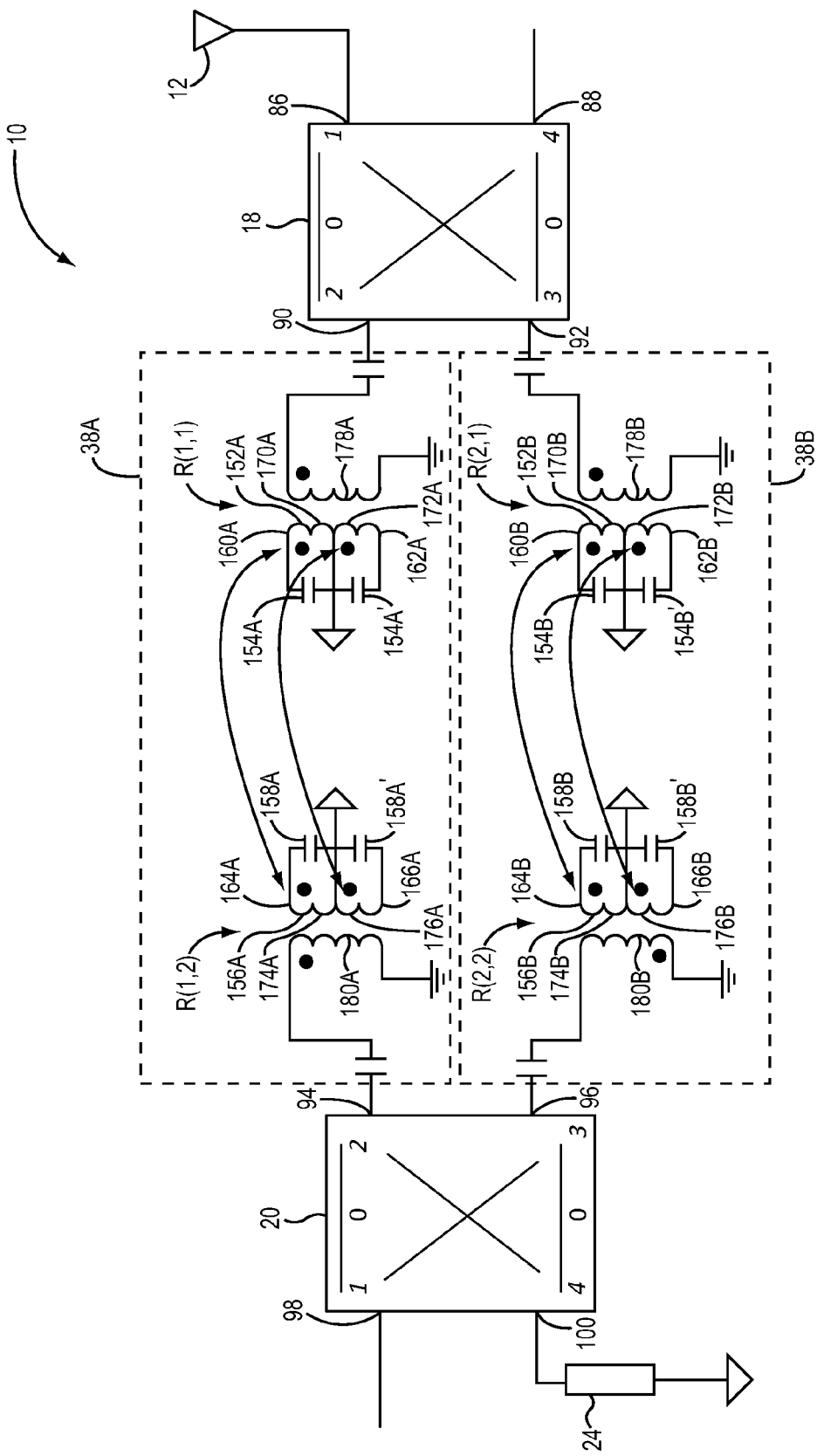
FIG. 9 illustrates yet another example of the tunable RF diplexer shown in FIG. 4 wherein the phase inversion component is provided by a single-ended to differential transformer in the RF filter circuit.

FIG. 9 illustrates another embodiment of the tunable RF diplexer 10 shown in FIG. 1, which is the same as the embodiment shown in FIG. 8 except in the manner that the second RF filter 38B provides the differential phase shift. Unlike the embodiment shown in FIG. 8, the differential transformer formed through the weak magnetic coupling of the inductor 152B of the resonator R(2,1), and the inductor 156B of the resonator R(2,2) shown in FIG. 9 provides approximately no phase shift. In this embodiment, the differential transformer is provided by the inductor 152B of the resonator R(2,1) and the inductor 156B of the resonator R(2,2). Accordingly, in this embodiment, the inductor portion 170B of the inductor 152B is magnetically coupled to the inductor portion 174B of the inductor 156B. The inductor portion 172B of the inductor 152B is magnetically coupled to the inductor portion 176B of the inductor 156B. As such, a differential RF signal having a positive side signal received at the end 160B of the inductor 152B and a negative side being transmitted out of the end 162B of the inductor 152B results in a filtered differential RF signal having a positive side transmitted out the end 164B of the inductor 156B and a negative side transmitted into the end 166B of the inductor 156B.

Instead, the differential phase shift is provided by the single to differential transformer formed by the inductor 156B of the resonator R(2,2) and the inductor 180B. More specifically, the inductor 156B and the inductor 180B are magnetically coupled such that the single to differential transformer provides the differential phase shift, as shown in FIG. 9. In alternative embodiments, the single to differential transformer formed by the inductor 178B and the inductor 152B of the resonator R(1,1) provide the differential shift. More specifically, in these alternative embodiments, the inductor 178B and the inductor 152B of the resonator R(1,1) are magnetically coupled such that the single to differential transformer provides the differential phase shift.

Figure 10:
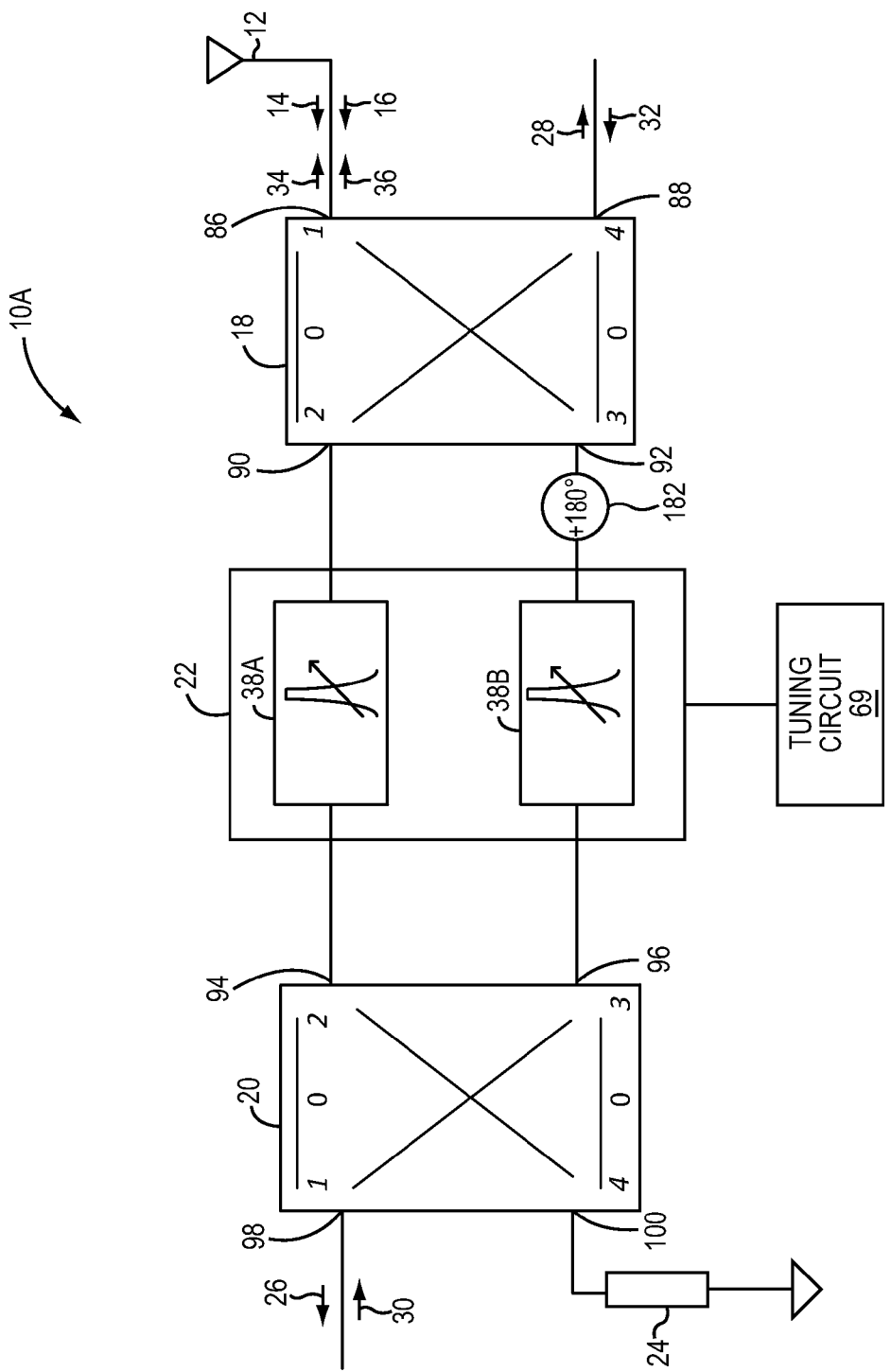
FIG. 10 illustrates another embodiment of a tunable RF diplexer, wherein the phase inversion component is provided by a phase shifter configured to provide a positive differential phase shift.

FIG. 10 illustrates another embodiment of a tunable RF diplexer 10A. The tunable RF diplexer 10A provides diplexing to the RF input receive signal 14, the RF receive input signal 16, the RF receive output signal 26, the RF receive output signal 28, the RF transmission input signal 30, the RF transmission input signal 32, the RF transmission output signal 34, and the RF transmission output signal 36 in the same manner described above with respect to FIGS. 1, 2A-2B, and 3A-3D, except that in this embodiment the second RF filter 38B does not provide the differential phase shift. Instead, the phase inversion component is provided by a phase shifter 182. Thus, while the second RF filter 38B in FIG. 10 provides no phase shift, the phase shifter 182 shown in FIG. 10 provides a differential phase shift. The phase shifter 182 is thus the phase inversion component. In this embodiment, the phase shifter 182 is configured to provide a positive differential phase shift of approximately +180 degrees or π radians.

As shown in FIG. 10, the phase shifter 182 is connected between the fourth port 92 of the first hybrid coupler 18 and the second RF filter 38B of the RF filter circuit 22. Using the phase shifter 182 to provide the differential phase shift (e.g., the positive differential phase shift) is advantageous since the phase shifter 182 can be included to provide the differential phase shift over a wide frequency range. Thus, the tunable RF diplexer 10A in FIG. 10 is operable to provide broadband isolation from the seventh port 98 to the second port 88.

Figure 11:
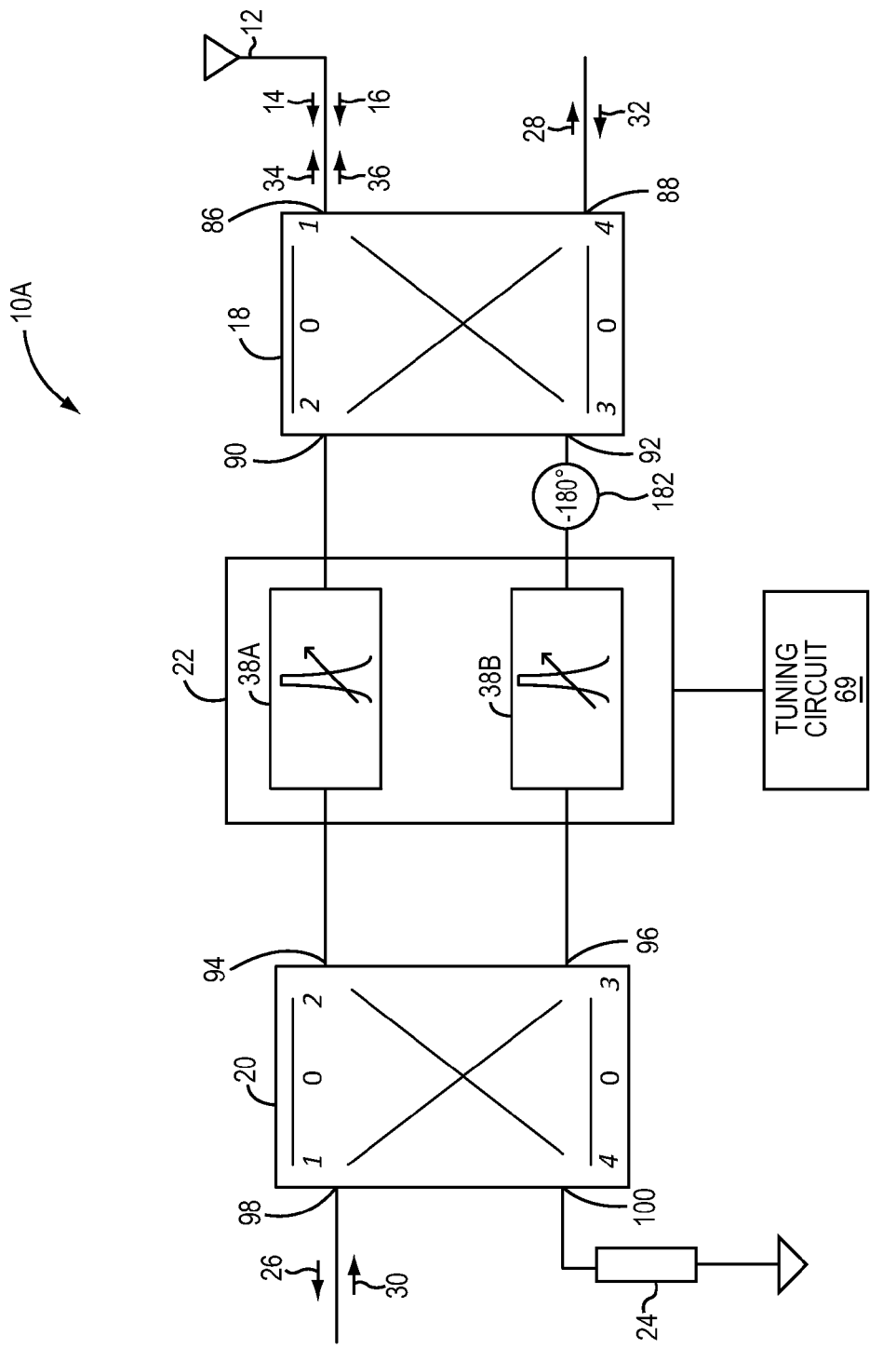
FIG. 11 illustrates yet another embodiment of a tunable RF diplexer, wherein the phase inversion component is provided by a phase shifter configured to provide a negative differential phase shift.

FIG. 11 illustrates another embodiment of the tunable RF diplexer 10A. The tunable RF diplexer 10A shown in FIG. 11 is the same as the embodiment shown in FIG. 11, except in this embodiment, the phase shifter provides a negative differential phase shift of approximately 180 degrees or 1π radians. The phase shifter 182 is thus the differential phase shifting component. The tunable RF diplexer 10A in FIG. 11 is also operable to provide broadband isolation from the seventh port 98 to the second port 88.

Figure 12:
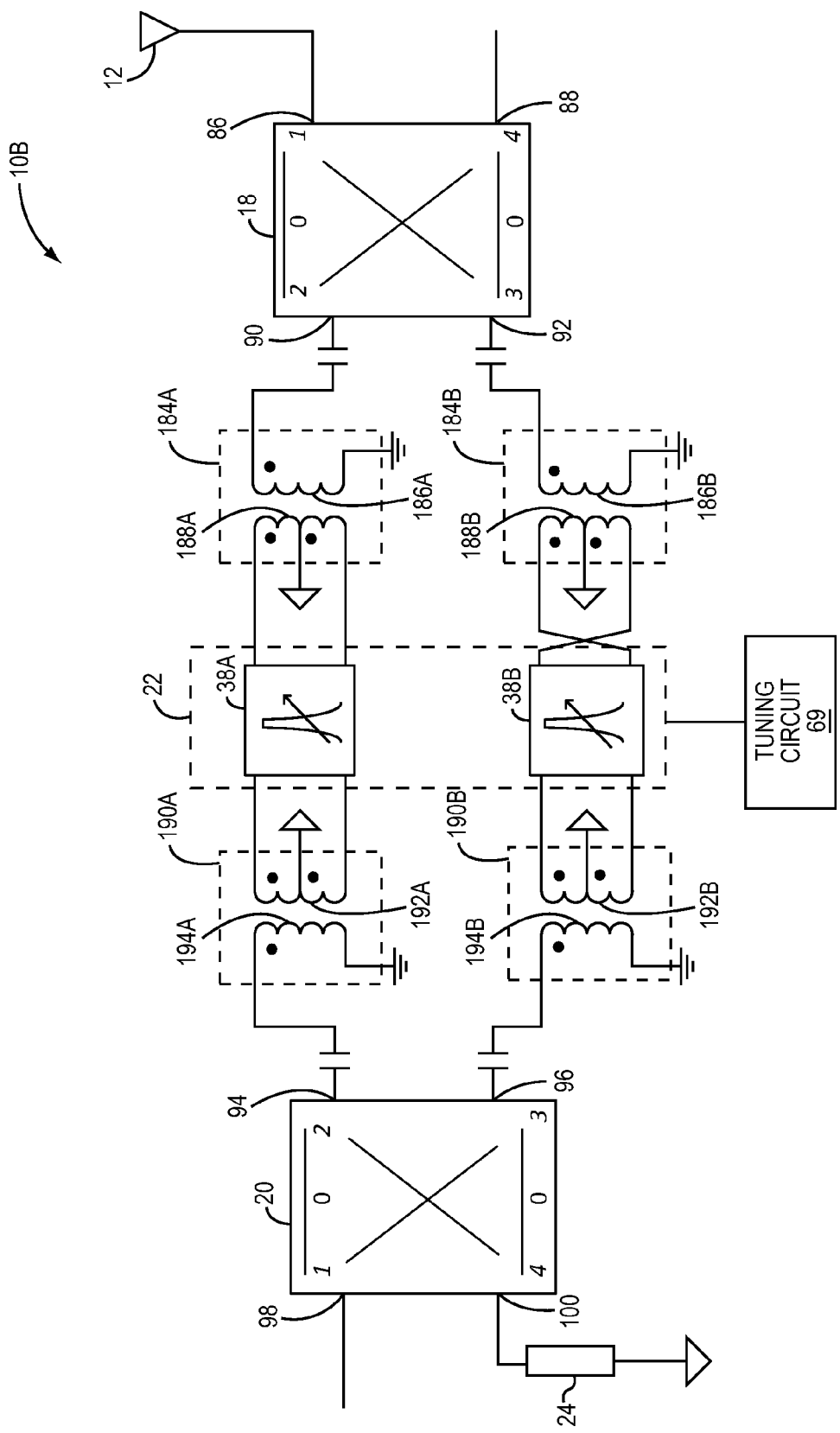
FIG. 12 illustrates still another embodiment of the tunable RF diplexer where the phase inversion component is provided by a single-ended to differential transformer connected to the RF filter circuit.

FIG. 12 illustrates another embodiment of a tunable RF diplexer 10B. The tunable RF diplexer 10B provides diplexing to the RF input receive signal 14, the RF receive input signal 16, the RF receive output signal 26, the RF receive output signal 28, the RF transmission input signal 30, the RF transmission input signal 32, the RF transmission output signal 34, and the RF transmission output signal 34 in the same manner described above with respect to FIGS. 1, 2A-2B, and 3A-3D, except that in this embodiment the second RF filter 38B also does not provide the differential phase shift. Instead, the phase inversion component is provided as a single to differential transformer connected to the second RF filter 38B, as explained in further detail below.

In this embodiment, a single to differential transformer 184A is connected between the third port 90 and the first RF filter 38A. The single to differential transformer 184A includes an inductor 186A connected to the third port 90. An inductor 188A is magnetically coupled to the inductor 186A has a grounded center tapped. The single to differential transformer 184A shown in FIG. 12 does not provide a differential phase shift. In this embodiment, the inductor 186A is connected to the first RF filter 38A. Another single to differential transformer 190A is connected between the first RF filter 38A and the fifth port 94 of the second hybrid coupler 20. The single to differential transformer 190A includes an inductor 192A connected to the first RF filter 38A. An inductor 194A is magnetically coupled to the inductor 192A and has a grounded center tap. The inductor 194A is connected to the fifth port 94 of the second hybrid coupler 20. The single to differential transformer 190A shown in FIG. 12 does not provide a phase shift.

Also in this embodiment, a single to differential transformer 184B is connected between the fourth port 92 of the first hybrid coupler 18 and the second RF filter 38B. The single to differential transformer 184B includes an inductor 186B connected to the fourth port 92. An inductor 188B is magnetically coupled to the inductor 186B has a grounded center tapped. The single to differential transformer 184B shown in FIG. 12 provides a differential phase shift and is thus the phase inversion component. In this embodiment, the inductor 186B is connected to the second RF filter 38B such that there is an inversion of the differential polarity provided to the second RF filter 38B. As such, the single to differential transformer 184B provides the differential phase shift and is the phase inversion component. Another single to differential transformer 190B is connected between the second RF filter 38B and the sixth port 96. The single to differential transformer 190B includes an inductor 192B connected to the second RF filter 38B. An inductor 194B is magnetically coupled to the inductor 192B and has a grounded center tap. The inductor 194B is connected to the sixth port 96 of the second hybrid coupler 20. The single to differential transformer 190B shown in FIG. 12 does not provide a phase shift. In alternative embodiment, the single to differential transformer 190B is provided as the phase inversion component to provide the differential phase shift. For example, the inductor 192B may be connected to the second RF filter 38B such that there is an inversion of the differential polarity provided from the second RF filter 38B.

Figure 13:
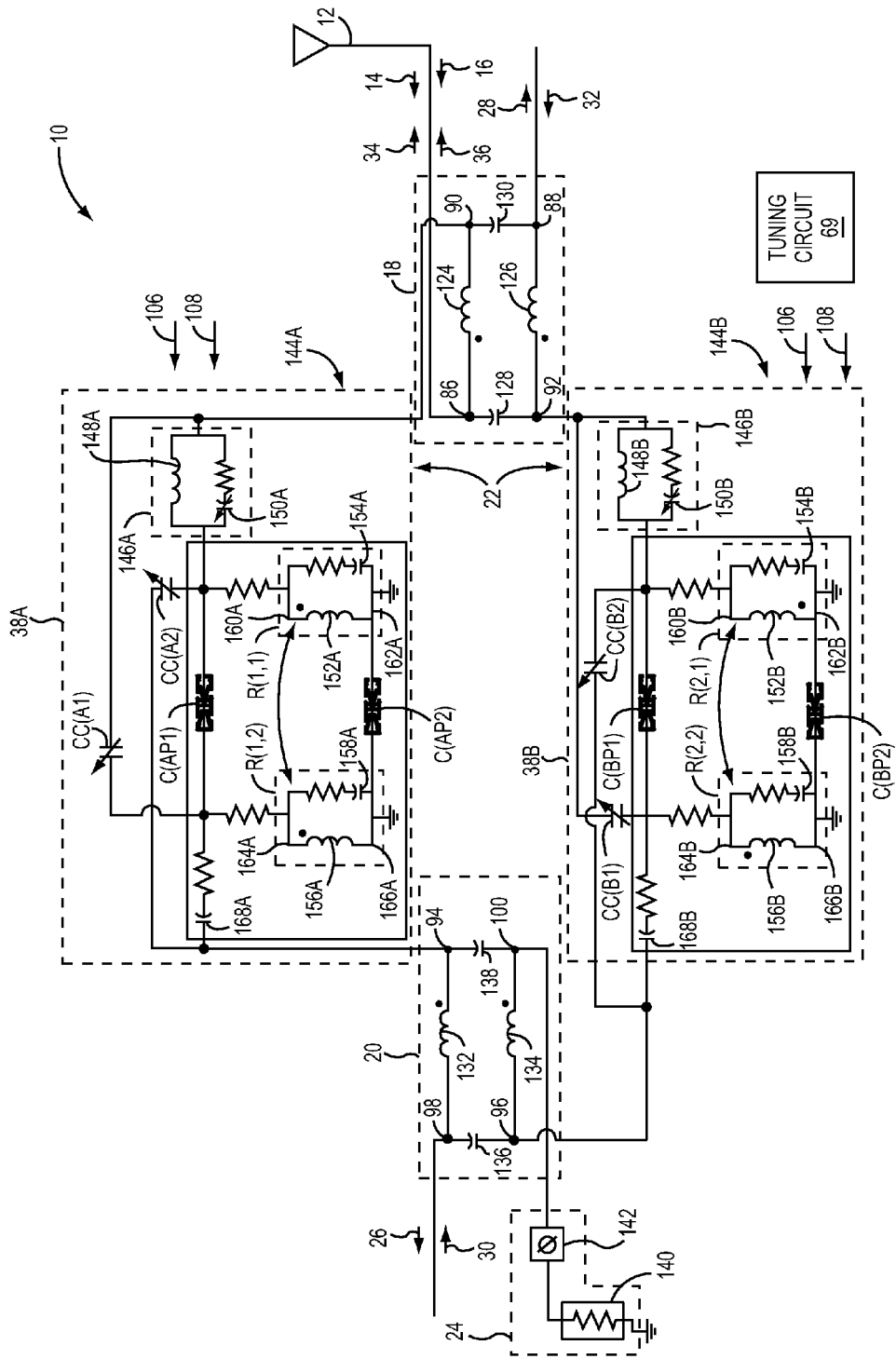
FIG. 13 illustrates yet another exemplary embodiment of the tunable RF diplexer that is similar to the embodiment in FIG. 4 and where the RF filter circuit is tunable to provide a notch both at a high-frequency side and a low-frequency side of a passband.

FIG. 13 illustrates a circuit diagram of another embodiment of the tunable RF diplexer 10 shown in FIG. 1 and FIGS. 3A-3D, wherein the tunable RF diplexer 10 shown in FIG. 13 is the same as the embodiment shown in FIG. 4, except in this embodiment, the tunable RF diplexer 10 further includes a cross-coupling capacitive structure C(AP2), a cross-coupling capacitive structure C(BP2), a cross-coupling capacitive structure CC(A1), a cross-coupling capacitive structure CC(A2), a cross-coupling capacitive structure CC(B1), and a cross-coupling capacitive structure CC(B2). As explained in further detail below, by providing the cross-coupling capacitive structure CC(A2), the cross-coupling capacitive structure CC(B1), and the cross-coupling capacitive structure CC(B2), the RF filter circuit 22 is tunable to provide the stopband 66, which in this embodiment is a notch, on both a high-frequency side of the passband 62 and a low-frequency side of the passband 62. This can resolve problems that may result when the RF communication band 44 for operation at the second port 88 gets too close to the RF communication band 48 of operation at the seventh port 98.

For example, when the RF communication band 44 is a B7 transmission frequency band centered around 2.504 GHz and the RF communication band 48 is the ISM frequency band centered around 2.44 GHz, it becomes more difficult for the tunable RF circuit 22 to pass and reflect appropriately as described in FIGS. 3A-3D. This can result in the tunable RF circuit 22 experiencing high insertion losses. Additionally, this can also result in degradation of isolation in the tunable RF diplexer 10. To help correct this and provide better performance, the tuning circuit 69 is configured to tune the RF filter circuit 22 to switch the stopband 66 (e.g., in this case, the notch) (shown in FIG. 2D) from the high-frequency side of the passband 62 (shown in FIG. 2D) to the low-frequency side of the passband 62 as a result of the RF communication band 48 (shown in FIG. 2D) for operation at the second port 88 being changed from HB frequency bands to MB frequency bands that are close to the ISM frequency band, such as the B7 transmission frequency band. This allows for the tunable RF diplexer 10 shown in FIG. 13 to have less insertion loss and better isolation when the RF communication band 48 is in the B7 transmission frequency band. The tuning circuit 69 is configured also to tune the RF filter circuit 22 to switch the stopband 66 (e.g., in this case, the notch) from the low-frequency side of the passband 62 to the high-frequency side of the passband 62 as a result of the RF communication band 48 for operation at the second port 88 being changed from MB frequency bands that are close to the ISM frequency band to HB frequency bands. The tuning circuit 69 is operable to switch the stopband 66 (e.g., in this case, the notch) from to and from the low-frequency side and the high-frequency side of the passband 62 by adjusting variable capacitances in the cross-coupling capacitive structure CC(A2), the cross-coupling capacitive structure CC(B1), and the cross-coupling capacitive structure CC(B2), as explained in further detail below.

With respect to the RF filter 38A shown in FIG. 13, the tunable RF filter path 144A further includes the cross-coupling capacitive structure C(AP2). As shown in FIG. 13, the cross-coupling capacitive structure C(AP2) is electrically connected in the tunable RF filter path 144A between the resonator R(1,1) and the resonator R(1,2) so as to provide a variable coupling coefficient between the resonator R(1,1) and the resonator R(1,2). The cross-coupling capacitive structure C(AP2) is a variable cross-coupling capacitive structure configured to vary the coupling coefficient provided between the resonator R(1,1) and the resonator R(1,2). The passband tuning control output 106 is provided to the cross-coupling capacitive structure C(AP2) to adjust the variable coupling coefficient and thereby shift the passband 62 into the RF communication band of the RF receive input signal 14, the RF receive output signal 26, the RF transmission input signal 30, and the RF transmission output signal 34. As described above, the resonator R(1,1) and the resonator R(1,2) are connected to provide the passband 62 of the tunable RF filter path 144A, and thus a bandpass filter is formed with the resonator R(1,1) and the resonator R(1,2). The stopband 66 of the RF filter 38A in this case is a notch provided by the parallel resonator 146A connected in series at the third port 90. Accordingly, the parallel resonator 146A is a notch filter.

The RF filter 38A is tunable to provide the stopband 66 (e.g., in this case, the notch) of the RF filter 38A on both a high-frequency side of the passband 62 and a low-frequency side of the passband 62. As in FIG. 4, the RF filter 38A in FIG. 13 is provided by the tunable RF filter path 144A. In order for the RF filter 38A to be tunable to provide the stopband 66 (e.g., in this case, the notch) of the RF filter 38A on both the high-frequency side of the passband 62 and the low-frequency side of the passband 62, the RF filter 38A includes the cross-coupling capacitive structure CC(A1) and the cross-coupling capacitive structure CC(A2). The cross-coupling capacitive structure CC(A1) has a variable capacitance, and the cross-coupling capacitive structure CC(A2) also has a variable capacitance. The stopband tuning control output 108 is provided to the cross-coupling capacitive structure CC(A1) and the cross-coupling capacitive structure CC(A2) to adjust their variable capacitances and so that the stopband 66 (e.g., in this case, the notch) is transposed to and from the low-frequency side and the high frequency side of the passband 62 provided by the RF filter 38A. In essence, the cross-coupling capacitive structure CC(A1) and the cross-coupling capacitive structure CC(A2) are connected to introduce factors into an equation describing the relationship between the resonators R(1,1), R(1,2) and the variable coupling coefficients provided by the capacitive structures C(AP1), C(AP2) that allow for the stopband 66 (e.g., in this case, the notch) to be switched to and from the high-frequency side and the low-frequency side of the passband 62 of the tunable RF filter path 144A.

Accordingly, the cross-coupling capacitive structure CC(A1) and the cross-coupling capacitive structure CC(A2) are coupled such that the tunable RF filter path 144A is tunable to provide the stopband 66 (e.g., in this case, the notch) of the RF filter 38A on both the high-frequency side of the first passband and the low-frequency side of the first passband by varying the first variable capacitance and the second variable capacitance. In this embodiment, the cross-coupling capacitive structure CC(A1) is electrically connected from the third port 90 to the resonator R(2,2). The resonator R(2,2) in the tunable RF filter path 144A is connected closest to the fifth port 94 of the second hybrid coupler 20. Furthermore, the cross-coupling capacitive structure CC(A2) is electrically connected from the fifth port 94 to the resonator R(1,1). The resonator R(1,1) in the tunable RF filter path 144A is connected closest to the third port 90 of the first hybrid coupler 18.

With respect to the RF filter 38B shown in FIG. 13, the tunable RF filter path 144B further includes a cross-coupling capacitive structure C(BP2). As shown in FIG. 13, the cross-coupling capacitive structure C(BP2) is electrically connected in the tunable RF filter path 144B between the resonator R(2,1) and the resonator R(2,2) so as to provide a variable coupling coefficient between the resonator R(2,1) and the resonator R(2,2). The cross-coupling capacitive structure C(BP2) is a variable cross-coupling capacitive structure configured to vary the coupling coefficient provided between the resonator R(2,1) and the resonator R(2,2). The passband tuning control output 106 is provided to the cross-coupling capacitive structure C(BP2) to adjust the variable coupling coefficient and thereby shift the passband 62 into the RF communication band of the RF receive input signal 14, the RF receive output signal 26, the RF transmission input signal 30, and the RF transmission output signal 34. As described above, the resonator R(2,1) and the resonator R(2,2) are connected to provide the passband 62 of the tunable RF filter path 144B, and thus a bandpass filter is formed with the resonator R(2,1) and the resonator R(2,2). The stopband 66 of the RF filter 38B in this case is a notch provided by the parallel resonator 146B connected in series at the fourth port 92. Accordingly, the parallel resonator 146B is a notch filter.

The RF filter 38B is tunable to provide the stopband 66 (e.g., in this case, the notch) of the RF filter 38B on both a high-frequency side of the passband 62 and a low-frequency side of the passband 62. As in FIG. 4, the RF filter 38B in FIG. 13 is provided by the tunable RF filter path 144B. In order for the RF filter 38B to be tunable to provide the stopband 66 (e.g., in this case, the notch) of the RF filter 38B on both the high-frequency side of the passband 62 and the low-frequency side of the passband 62, the RF filter 38B includes the cross-coupling capacitive structure CC(B1) and the cross-coupling capacitive structure CC(B2). The cross-coupling capacitive structure CC(B1) has a variable capacitance, and the cross-coupling capacitive structure CC(B2) also has a variable capacitance. The stopband tuning control output 108 is provided to the cross-coupling capacitive structure CC(B1) and the cross-coupling capacitive structure CC(B2) to adjust their variable capacitances and so that the stopband 66 (e.g., in this case, the notch) is transposed to and from the low-frequency side and the high frequency side of the passband 62 provided by the RF filter 38B. In essence, the cross-coupling capacitive structure CC(B1) and the cross-coupling capacitive structure CC(B2) are connected to introduce factors into an equation describing the relationship between the resonators R(2,1), R(2,2) and the variable coupling coefficients provided by the capacitive structures C(BP1), C(BP2) that allow for the stopband 66 (e.g., in this case, the notch) to be switched to and from the high-frequency side and the low-frequency side of the passband 62 of the tunable RF filter path 144B.

Accordingly, the cross-coupling capacitive structure CC(B1) and the cross-coupling capacitive structure CC(B2) are coupled such that the tunable RF filter path 144B is tunable to provide the stopband 66 (e.g., in this case, the notch) of the RF filter 38B on both the high-frequency side of the first passband and the low-frequency side of the first passband by varying the first variable capacitance and the second variable capacitance. In this embodiment, the cross-coupling capacitive structure CC(B1) is electrically connected from the fourth port 92 to the resonator R(2,2). The resonator R(2,2) in the tunable RF filter path 144B is connected closest to the sixth port 96 of the second hybrid coupler 20. Furthermore, the cross-coupling capacitive structure CC(B2) is electrically connected from the sixth port 96 to the resonator R(2,1). The resonator R(2,1) in the tunable RF filter path 144B is connected closest to the fourth port 92 of the first hybrid coupler 18.

Figure 14:
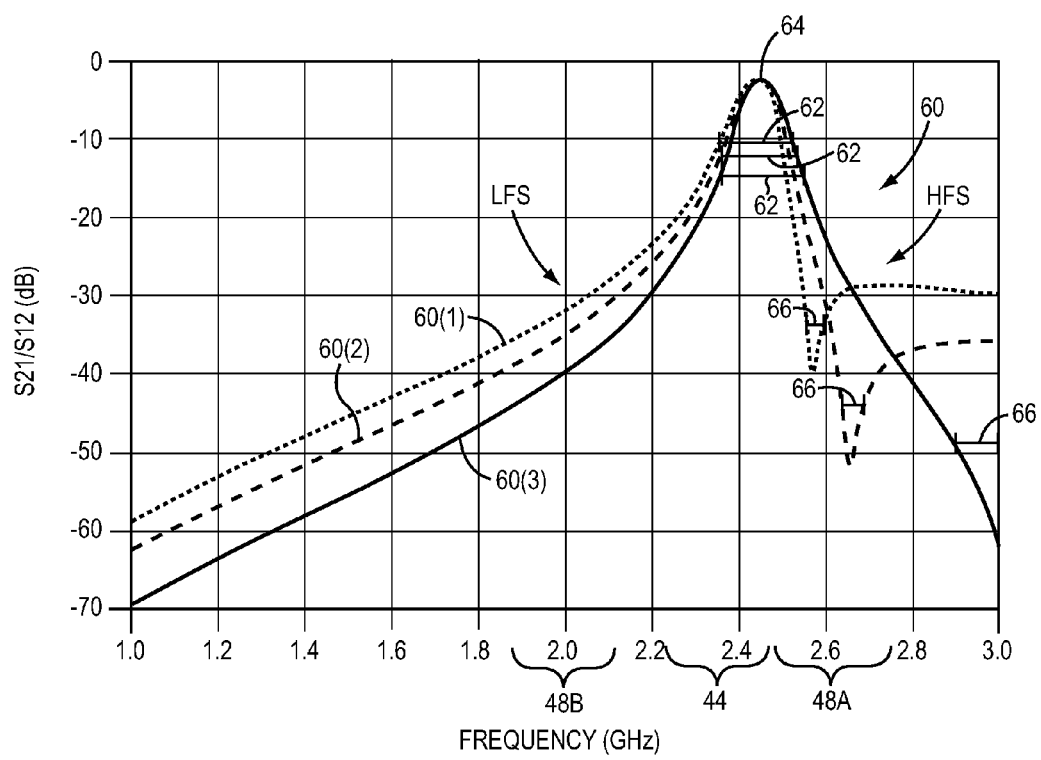
FIG. 14 illustrates a frequency response of the RF filter circuit shown in FIG. 13.

FIG. 14 illustrates different exemplary frequency response curves 60(1), 60(2), 60(3) for the frequency response 60 provided by the RF filter circuit 22 shown in FIG. 13. In FIG. 14, the frequency response 60 (and the frequency response curves 60(1), 60(2), 60(3)) represent S21 and S12 parameters of each of the RF filters 38A, 38B (shown in FIG. 13) individually as a function of frequency. Thus, the two-port S21 and S12 parameter of the first RF filter 38A is represented by the frequency response 60 (and the frequency response curves 60(1), 60(2), 60(3)) in FIG. 14. Since the second RF filter 38B is identical to the first RF filter 38A, the two-port S21 and S12 parameter of the second RF filter 38B is also represented by the frequency response 60 (and the frequency response curves 60(1), 60(2), 60(3)) in FIG. 14. The two-port S21 and S12 parameter represents the forward and reverse transmission of the RF filters 38A, 38B, as a function of frequency.

In FIG. 14, the frequency response curve 60(1) is the frequency response 60 of the RF filter circuit 22 when the variable capacitances of each of the cross-coupling capacitive structures CC(A1), CC(A2), CC(B1), CC(B2) are set to 50 fF. The frequency response curve 60(2) is the frequency response 60 of the RF filter circuit 22 when the variable capacitances of each of the cross-coupling capacitive structures CC(A1), CC(A2), CC(B1), CC(B2) are set to 30 fF. Finally, the frequency response curve 60(3) is the frequency response 60 of the RF filter circuit 22 when the variable capacitances of each of the cross-coupling capacitive structures CC(A1), CC(A2), CC(B1), CC(B2) are set to 10 fF. In this example of the frequency response curves 60(1), 60(2), 60(3), the notch 66 is provided on a high-frequency side HFS of the passband 62 because the notch 66 is provided as the passband 62 rolls off on the side provided at higher frequencies. With regard to the frequency response 60, the high-frequency side HFS may be considered the side at higher frequencies than the maxima 64 of the passband 62. A low-frequency side LFS of the passband 62 is the side of the passband 62 that rolls off at lower frequencies. With regard to the frequency response 60, the low-frequency side LFS may be considered the side at lower frequencies than the maxima 64 of the passband 62.

Note from the frequency response curves 60(1), 60(2), 60(3), the notch 66 is transposed closer to the low-frequency side LPF as the variable capacitances of the cross-coupling capacitive structures CC(A1), CC(A2), CC(B1), CC(B2) increases. The notch 66 also becomes shallower as the variable capacitances of the cross-coupling capacitive structures CC(A1), CC(A2), CC(B1), CC(B2) increases. The variable capacitances of the cross-coupling capacitive structures CC(A1), CC(A2), CC(B1), CC(B2) can be continued to be increased until the notch 66 is provided on the low-frequency side LFS of the passband 62.

For example, the tuning circuit 69 may be configured to place the notch 66 of each of the RF filters 38A, 38B on the high-frequency side HPF when an RF communication band 48A (e.g., an embodiment of the RF communication band 48 shown in FIG. 2D) is selected as a HB frequency band in order to reduce insertion loss and improve isolation. The RF communication band 48A is at a higher frequency range than the RF communication band 44, which in this example is the ISM frequency band. However, when an RF frequency band 48B (e.g., an embodiment of the RF communication band 48 shown in FIG. 2D) is selected is selected as a MB frequency band, the tuning circuit 69 may be configured to place the notch 66 on the low-frequency side LFS of the passband 62 in order to reduce insertion loss and improve isolation and improve isolation. As explained with respect to FIG. 13, the tuning circuit 69 sets the variable capacitances of the cross-coupling capacitive structures CC(A1), CC(A2), CC(B1), CC(B2) so that the notch 66 is on the high-frequency side HFS and the low-frequency side LFS of the passband 62 of each of the RF filters 38A, 38B.

Figure 15:
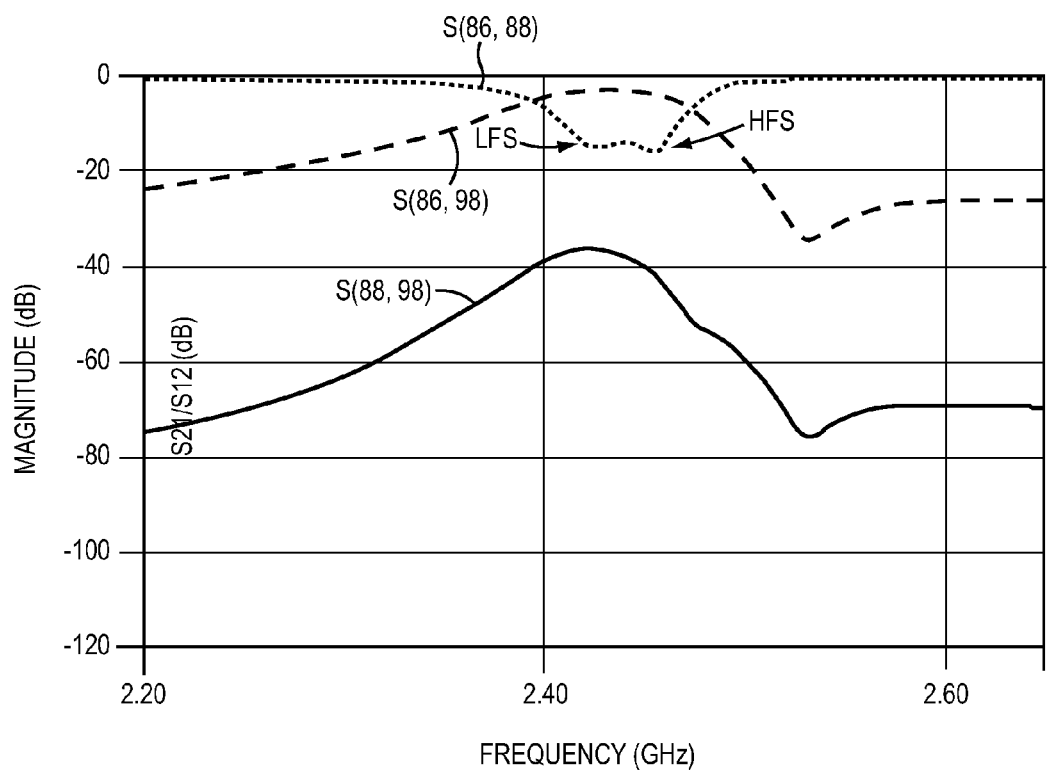
FIG. 15 illustrates a frequency domain representation of S parameters for the tunable RF diplexer shown in FIG. 13.

FIG. 15 illustrates S parameters for the tunable RF diplexer 10 shown in FIG. 13 where the tunable RF diplexer 10 has been provided to center the passband 62 of the first RF filter 38A, and the second RF filter 38B in the ISM frequency band is centered around a center frequency of 2.44 GHz. The notch 66 (shown in FIG. 14) of the first RF filter 38A and the second RF filter 38B can be centered in MB/HB frequency bands with center frequencies from 1.7 GHz to 2.9 GHz. In particular, the B7 transmission frequency band is centered at a center frequency of 2.504 GHz. The S(86,88) parameter shows that the transfer response of the tunable RF diplexer 10 remains at around 0 dB except around the ISM frequency band. Accordingly, the tunable RF diplexer 10 is configured to have small insertion losses in the MB/HB frequency bands between the first port 86 and the second port 88. The S(86,98) parameter shows that the transfer response of the tunable RF diplexer 10 increases to around 0 dB in the ISM frequency band and decreases relatively quickly outside the ISM frequency band. Accordingly, the tunable RF diplexer 10 is configured to have small insertion losses in the ISM frequency bands between the first port 86 and the seventh port 98. The insertion losses at the center frequency of the B7 transmission frequency band are reduced and the greater isolation is provided at higher HB frequency bands due to the extra filtering provided on the high-frequency side HPF. Note if an MB frequency band is selected that is on the low-frequency side LFS (i.e. below the center frequency of 2.4 GHz of the ISM frequency band), the tuning circuit 69 is configured to adjust the variable capacitances of the cross-coupling capacitive structures CC(A1), CC(A2), CC(B1), CC(B2) so that the notch 66 (shown in FIG. 14) is placed on the low-frequency side LFS of the passband 62. Otherwise if an MB/HB frequency band is selected that is on the high-frequency side HPF, the tuning circuit 69 is configured to adjust the variable capacitances of the cross-coupling capacitive structures CC(A1), CC(A2), CC(B1), CC(B2) so that the notch 66 (shown in FIG. 14) is placed on the high-frequency side HFS. In this manner, less insertion loss and greater isolation is provided regardless of whether the MB/HB frequency band is on the high-frequency side HFS or the low-frequency side LFS.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) diplexer comprising:
a first hybrid coupler;
a second hybrid coupler; and
a RF filter circuit connected between the first hybrid coupler and the second hybrid coupler, wherein the RF filter circuit defines a passband and a notch, the RF filter circuit is tunable to provide the notch on both a high-frequency side of the passband and a low-frequency side of the passband; and the RF filter circuit comprises a first inductor and a second inductor coupled between the first hybrid coupler and the second hybrid coupler, such that the first inductor and the second inductor have inverting mutually magnetic coupling
and are configured to provide approximately a differential phase shift.

2. The RF diplexer of claim 1 wherein:
the RF filter circuit comprises a first RF filter and a second RF filter;
the first RF filter is connected between the first hybrid coupler and the second hybrid coupler; and
the second RF filter comprises is connected between the first hybrid coupler and the second hybrid coupler.

3. The RF diplexer of claim 2 wherein the first RF filter defines a tunable RF filter path, the tunable RF filter path comprises:
at least a pair of weakly coupled resonators that are weakly coupled by having an energy transfer factor of less than 10%;
a first cross-coupling capacitive structure having a first variable capacitance and connected from the first hybrid coupler to one of the pair of weakly coupled resonators; and
a second cross-coupling capacitive structure having a second variable capacitance and connected from the second hybrid coupler to an other one of the pair of weakly coupled resonators.

4. The RF diplexer of claim 3 wherein the tunable RF filter path further comprises a notch filter.

5. The RF diplexer of claim 2 wherein the second RF filter defines a tunable RF filter path, the tunable RF filter path comprises:
at least a pair of weakly coupled resonators that are weakly coupled by having an energy transfer factor of less than 10%;
a first cross-coupling capacitive structure having a first variable capacitance and connected from the first hybrid coupler to one of the pair of weakly coupled resonators; and
a second cross-coupling capacitive structure having a second variable capacitance and connected from the second hybrid coupler to an other one of the pair of weakly coupled resonators.

6. The RF diplexer of claim 5 wherein the tunable RF filter path further comprises a notch filter.

7. The RF diplexer of claim 2 wherein:
the first RF filter defines a first tunable RF filter path, the first tunable RF filter path comprises:
at least a first pair of weakly coupled resonators that are weakly coupled by having an energy transfer factor of less than 10%;
a first cross-coupling capacitive structure having a first variable capacitance and connected from the first hybrid coupler to one of the first pair of weakly coupled resonators;
a second cross-coupling capacitive structure having a second variable capacitance and connected from the second hybrid coupler to an other one of the first pair of weakly coupled resonators;
the second RF filter defines a second tunable RF filter path, the second tunable RF filter path comprises:
at least a second pair of weakly coupled resonators that are weakly coupled by having an energy transfer factor of less than 10%;
a third cross-coupling capacitive structure having a third variable capacitance and connected from the first hybrid coupler to one of the second pair of weakly coupled resonators; and
a fourth cross-coupling capacitive structure having a fourth variable capacitance and connected from the second hybrid coupler to an other one of the second pair of weakly coupled resonators.

8. The RF diplexer of claim 7 wherein the first cross-coupling capacitive structure, the second cross-coupling capacitive structure, the third cross-coupling capacitive structure, and the fourth cross-coupling capacitive structure are coupled such that the RF filter circuit is tunable to provide the notch on both the high-frequency side of the passband and the low-frequency side of the passband by adjusting the first variable capacitance, the second variable capacitance, the third variable capacitance and the fourth variable capacitance.

9. The RF diplexer of claim 8 wherein the first tunable RF filter path further comprises a first notch filter and the second tunable RF filter path further comprises a second notch filter.

10. The RF diplexer of claim 8 wherein:
the first hybrid coupler comprises:
   a first port configured to be coupled to an antenna;
   a second port configured to be coupled to external circuitry;
   a third port coupled to the first RF filter, wherein the first cross-coupling capacitive structure is connected from the third port to the one of the first pair of weakly coupled resonators;
   a fourth port coupled to the second RF filter, the third cross-coupling capacitive structure is connected from the fourth port to the one of the second pair of weakly coupled resonators;
the second hybrid coupler comprises:
   a fifth port coupled to the first RF filter, wherein the second cross-coupling capacitive structure is connected from the fifth port to the other one of the first pair of weakly coupled resonators;
   a sixth port coupled to the second RF filter, wherein the fourth cross-coupling capacitive structure is connected from the sixth port to the other one of the second pair of weakly coupled resonators;
   a seventh port coupled to other external circuitry; and
   an eighth port configured to be coupled to an impedance termination.

11. A radio frequency (RF) diplexer comprising:
a first hybrid coupler;
a second hybrid coupler;
a first tunable RF filter path comprising a first inductor, a second inductor, and at least a first pair of weakly coupled resonators that are weakly coupled by having an energy transfer factor of less than 10%, where the first tunable RF filter path is connected between the first hybrid coupler and the second hybrid coupler and the first tunable RF filter path defines a first passband and a first notch, the first tunable RF filter path is tunable to provide the first notch on both a high-frequency side of the first passband and a low-frequency side of the first passband;
and the first inductor and the second inductor are coupled between the first hybrid coupler and the second hybrid coupler, such that the first inductor and the second inductor have inverting mutually magnetic coupling
   and are configured to provide approximately a differential phase shift.

12. The RF diplexer of claim 11 further comprising a second tunable RF filter path comprising at least a second pair of weakly coupled resonators that are weakly coupled by having an energy transfer factor of less than 10%, where the second tunable RF filter path is connected between the first hybrid coupler and the second hybrid coupler and the second tunable RF filter path defines a second passband and a second notch, the second tunable RF filter path is tunable to provide the second notch on both a high-frequency side of the second passband and a low-frequency side of the second passband.

13. The RF diplexer of claim 12 wherein the first tunable RF filter path further comprises:
the first hybrid coupler comprises:
   a first port configured to be coupled to an antenna;
   a second port configured to be coupled to external circuitry;
   a third port coupled to the first tunable RF filter path;
   a fourth port coupled to the second tunable RF filter path;
the second hybrid coupler comprises:
   a fifth port coupled to the first tunable RF filter path;
   a sixth port coupled to the second tunable RF filter path,
   a seventh port coupled to other external circuitry; and
   an eighth port configured to be coupled to an impedance termination.

14. The RF diplexer of claim 13 wherein:
the first tunable RF filter path further comprises:
   a first cross-coupling capacitive structure having a first variable capacitance and connected from the third port to one of the first pair of weakly coupled resonators;
   a second cross-coupling capacitive structure having a second variable capacitance and connected from the fifth port to an other one of the first pair of weakly coupled resonators;
the second tunable RF filter path further comprises:
   a third cross-coupling capacitive structure having a third variable capacitance and connected from the fourth port to one of the second pair of weakly coupled resonators; and
   a fourth cross-coupling capacitive structure having a fourth variable capacitance and connected from the sixth port to an other one of the second pair of weakly coupled resonators.

15. The RF diplexer of claim 14 wherein:
the first tunable RF filter path further comprises:
   a first bandpass filter formed with the first pair of weakly coupled resonators and configured to provide the first passband;
   a first notch filter connected in series at the third port and configured to provide the first notch;
the second tunable RF filter path further comprises:
   a second bandpass filter formed with the second pair of weakly coupled resonators and configured to provide the second passband; and
   a second notch filter connected in series at the fourth port and configured to provide the second notch.

16. The RF diplexer of claim 15 wherein:
the first cross-coupling capacitive structure and the second cross-coupling capacitive structure are coupled such that the first tunable RF filter path is tunable to provide the first notch on both the high-frequency side of the first passband and the low-frequency side of the first passband by varying the first variable capacitance and the second variable capacitance;
the third cross-coupling capacitive structure and the fourth cross-coupling capacitive structure are coupled such that the second tunable RF filter path is tunable to provide the second notch on both the high-frequency side of the second passband and the low-frequency side of the second passband by varying the third variable capacitance and the fourth variable capacitance.

17. The RF diplexer of claim 11 wherein the first tunable RF filter path further comprises:

a first cross-coupling capacitive structure having a first variable capacitance and connected from the first hybrid coupler to one of the first pair of weakly coupled resonators; and a second cross-coupling capacitive structure having a second variable capacitance and connected from the second hybrid coupler to an other one of the first pair of weakly coupled resonators.

18. The RF diplexer of claim 17 wherein the first cross-coupling capacitive structure and the second cross-coupling capacitive structure are coupled such that the first tunable RF filter path is tunable to provide the first notch on both the high-frequency side of the first passband and the low-frequency side of the first passband by varying the first variable capacitance and the second variable capacitance.

* * * * *